(12) United States Patent
Misaka

(10) Patent No.: US 7,045,255 B2
(45) Date of Patent: *May 16, 2006

(54) PHOTOMASK AND METHOD FOR PRODUCING THE SAME

(75) Inventor: Akio Misaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 263 days.

This patent is subject to a terminal disclaimer.

(21) Appl. No.: 10/424,920

(22) Filed: Apr. 29, 2003

(65) Prior Publication Data

US 2003/0203291 A1   Oct. 30, 2003

(30) Foreign Application Priority Data

Apr. 30, 2002   (JP)   ............................. 2002-128029

(51) Int. Cl.
  *G03F 9/00*   (2006.01)
  *G03C 5/00*   (2006.01)
(52) U.S. Cl. .......................... 430/5; 430/322; 430/323; 430/324; 430/396
(58) Field of Classification Search ................... 430/5, 430/396, 322, 323, 324
  See application file for complete search history.

(56) References Cited

U.S. PATENT DOCUMENTS 5,766,805 A * 6/1998 Lee et al. ....................... 430/5
5,906,910 A * 5/1999 Nguyen et al. ............. 430/311

FOREIGN PATENT DOCUMENTS

| JP | 08-227142 | 9/1996 |
|----|-----------|--------|
| JP | 9-90601 | 4/1997 |
| JP | 10-048806 | 2/1998 |
| JP | 2000-019710 A | 1/2000 |

* cited by examiner

*Primary Examiner*—Christopher G. Young
(74) *Attorney, Agent, or Firm*—McDermott Will & Emery LLP

(57) ABSTRACT

A photomask has a semi-light-shielding portion having a light-shielding property and a light-transmitting portion surrounded by the semi-light-shielding portion, and a peripheral portion positioned in the periphery of the light-transmitting portion. The semi-light-shielding portion and the light-transmitting portion transmit exposure light in the same phase, whereas the peripheral portion transmits exposure light in a phase opposite to that of the light-transmitting portion.

35 Claims, 27 Drawing Sheets

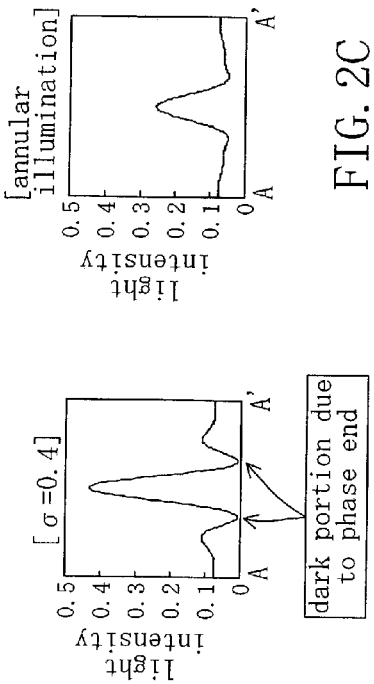
FIG. 2A
FIG. 2B
FIG. 2C
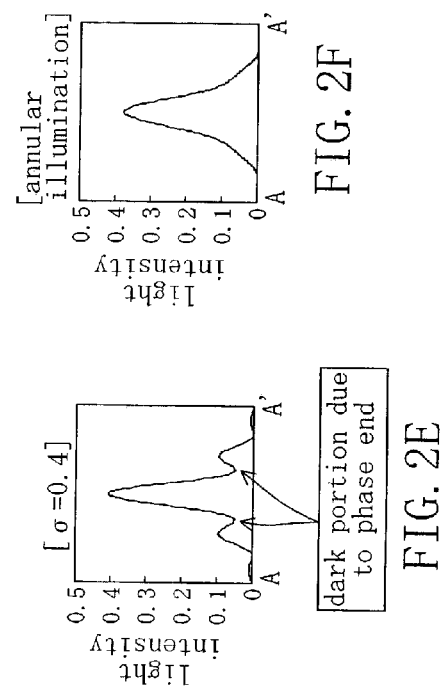
FIG. 2D
FIG. 2E
FIG. 2F

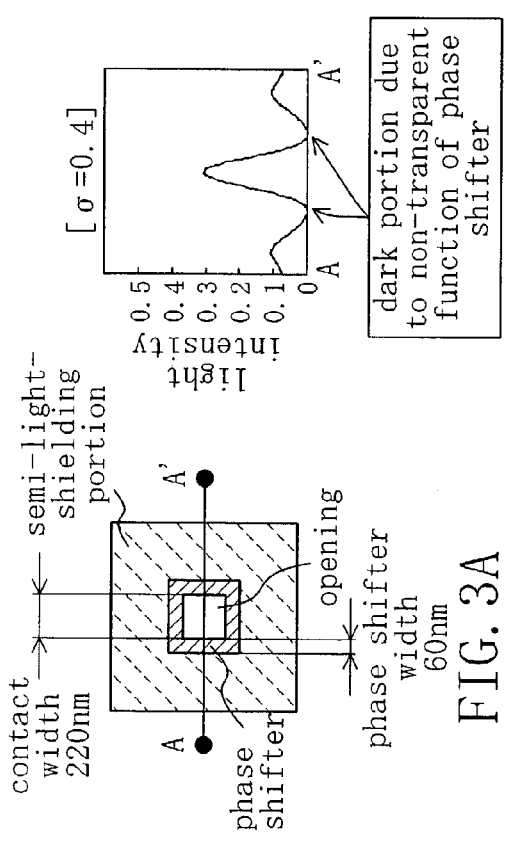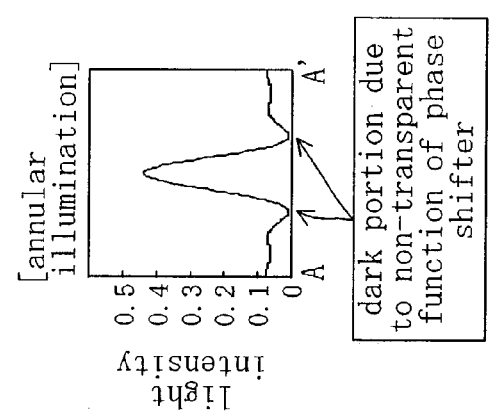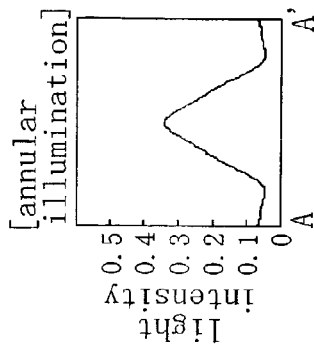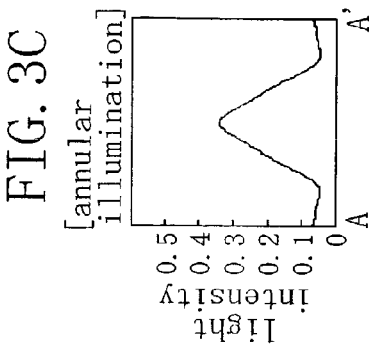

[regular exposure light source]

[annular exposure light source]

[quadrupole exposure light source]

[annular-quadrupole mixed type exposure light source]

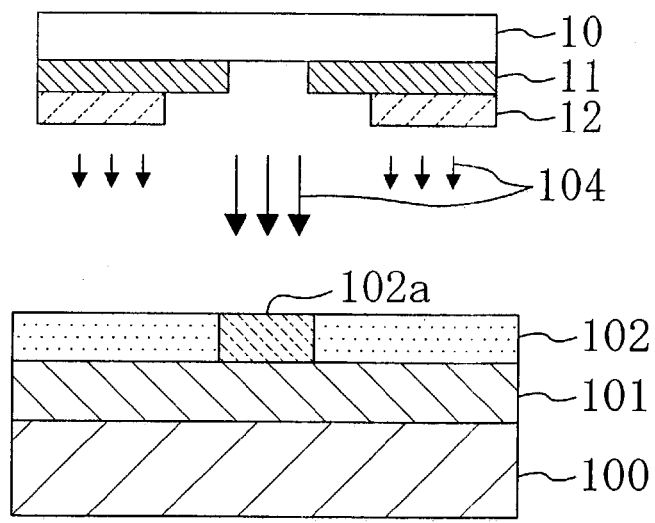

FIG. 17A
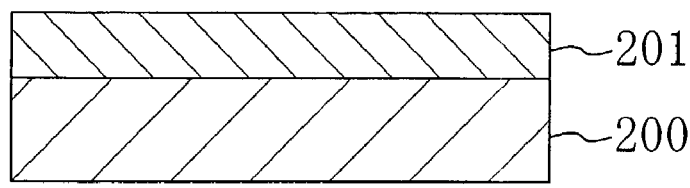
FIG. 17B
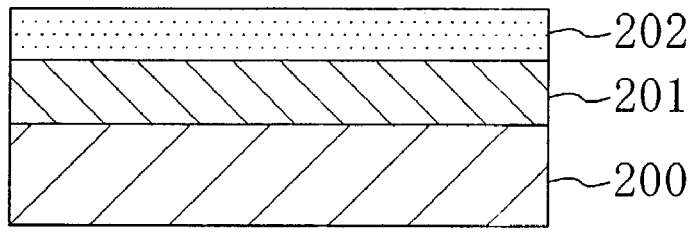
FIG. 17C
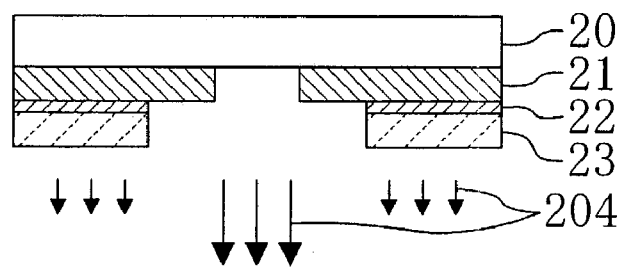
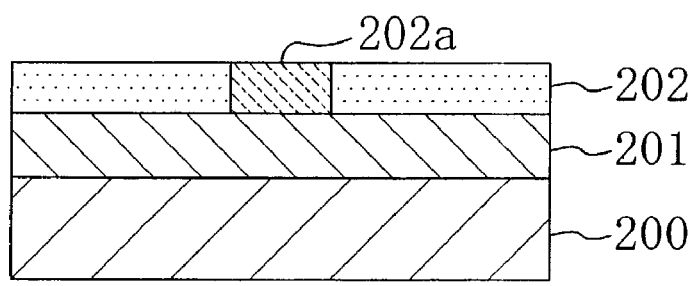
FIG. 17D
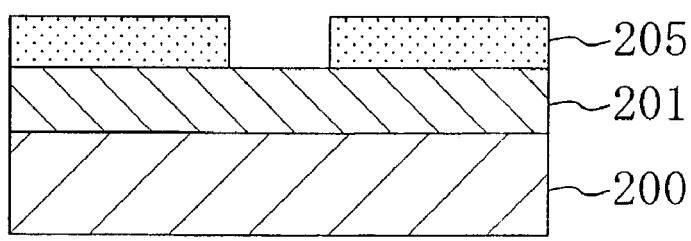

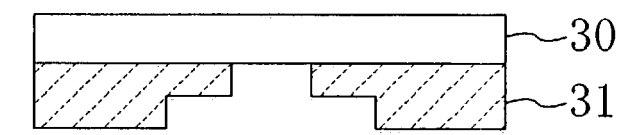
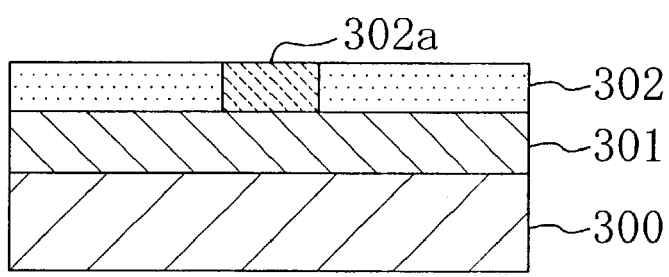

- opening
- phase shifter
- semi-light-shielding portion

- opening
- phase shifter
- semi-light-shielding portion opening
transmittance: 100% phase shifter
transmittance: 100%
phase difference
with opening: 180 degrees semi-light-shielding portion
transmittance: 7.5%
phase difference
with opening: 0 to 30 degrees W=200nm
d=50nm complete light-shielding portion (chromium film)

opening complete light-shielding portion (chromium film)

phase shifter opposite phase phase shifter opening opposite phase phase boundary dark portion due to phase end

PHOTOMASK AND METHOD FOR PRODUCING THE SAME

BACKGROUND OF THE INVENTION

The present invention relates to a photomask for forming a fine pattern used for producing a semiconductor integrated circuit device, a method for producing the same and a method for forming a pattern using the photomask.

In recent years, it is increasingly necessary to miniaturize circuit patterns for high integration of a large-scale integrated circuit device (hereinafter, referred to as "LSI") that can be realized with semiconductors. As a result, a reduction of the width of a line for wiring patterns constituting a circuit or miniaturization of contact hole patterns (hereinafter, referred to as "contact patterns") that connect between layered wirings formed via insulating layers have become very important.

Hereinafter, miniaturization of wiring patterns with a recent light-exposure system will be described by taking the case of using a positive resist process as an example. In a positive resist process, a line pattern refers to a line-shaped resist film (resist pattern) that are left, corresponding to a non-exposed region of a resist by exposure with a photomask and subsequent development. A space pattern refers to a portion from which a resist is removed (resist-removed pattern) corresponding to an exposed region of a resist. A contact pattern refers to a hole-like resist-removed portion and can be regarded as a small space pattern of the space patterns. When using a negative resist process instead of a positive resist process, the definition of the line pattern and the definition of the space pattern are replaced by each other.

In general, for miniaturization of wiring patterns, a method for forming a fine line pattern with oblique incident light exposure (off-axis illumination) called super resolution exposure has been used. This method is an excellent method for miniaturization of a resist pattern corresponding to a non-exposed region of a resist, and also has an effect of improving the depth of focus of dense patterns that are arranged periodically. However, this oblique incident exposure method has little effect on miniaturization of isolated resist-removed portions, and on the contrary, this method deteriorates the contrast of images (optical images) and the depth of focus. Therefore, the oblique incident exposure method is positively used to form patterns characterized in that the size of the resist-removed portion is larger than the size of a resist pattern, for example, to form gate patterns.

On the other hand, to form a micro resist-removed portion that is isolated such as a small contact pattern, it is known that it is useful to use a small light source having a low coherence degree that contains no oblique incident component. In this case, it is more useful to use a half-tone phase-shifting mask (see, for example, Japanese Laid-Open Patent Publication No. 9-90601). In the half-tone phase-shifting mask, a phase sifter that has a very low transmittance of about 3 to 6% with respect to exposure light and that causes phase inversion of 180 degrees with respect to light transmitted through an opening, instead of a complete light-shielding portion, is provided as a mask pattern surrounding a light-transmitting portion (opening) corresponding to a contact pattern.

In this specification, a transmittance is represented by an effective transmittance when the transmittance of a transparent substrate is taken as 100%, unless otherwise specified. Moreover, "complete light-shielding film (complete light-shielding portion) refers to a light-shielding film (light-shielding portion) having an effective transmittance of smaller than 1%.

Hereinafter, the principle of the method for forming patterns using a half-tone phase-shifting mask will be described with reference to FIGS. 27A to 27G.

FIG. 27A is a plan view of a photomask in which an opening corresponding to a contact pattern is provided in a chromium film serving as a complete light-shielding portion provided on the surface of the mask. FIG. 27B shows the amplitude intensity corresponding to line AA' of light transmitted through the photomask shown in FIG. 27A. FIG. 27C is a plan view of a photomask in which a chromium film corresponding to a contact pattern as a complete light-shielding portion is provided in a phase shifter provided on the surface of the mask. FIG. 27D shows the amplitude intensity corresponding to line AA' of light transmitted through the photomask shown in FIG. 27C. FIG. 27E is a plan view of a photomask in which an opening corresponding to a contact pattern is provided in a phase shifter provided on the surface of the mask (i.e., a half-tone phase-shifting mask). FIGS. 27F and 28G show the amplitude intensity and the light intensity corresponding to line AA' of light transmitted through the photomask shown in FIG. 27E, respectively.

As shown in FIGS. 27B, 27D, and 27F, the amplitude intensity of light transmitted through the half-tone phase-shifting mask shown in FIG. 27E is equal to the sum of the amplitude intensities of lights transmitted through the photomasks shown in FIGS. 27A and 27C. That is to say, in the half-tone phase-shifting mask shown in FIG. 27E, the phase shifter serving as a light-shielding portion is configured so as to not only transmit light at a low transmittance, but also provide an optical path difference (phase difference) of 180degrees with respect to the light transmitted through the opening to the light transmitted through this phase shifter. Therefore, as shown in FIGS. 27B and 27D, the light transmitted through the phase shifter has an amplitude intensity with a phase opposite to that of the light transmitted through the opening. Thus, if the amplitude intensity distribution shown in FIG. 27B and the amplitude intensity distribution shown in FIG. 27D are synthesized, a phase boundary in which the amplitude intensity is turned to 0 by a phase change is generated, as shown in FIG. 27F. As a result, as shown in FIG. 27G, in the end of the opening that is the phase boundary (hereinafter, referred to as a "phase end"), the light intensity, which is represented by a square of the amplitude intensity, becomes 0, and a significantly dark portion is formed. Accordingly, in an image of the light transmitted through the half-tone phase-shifting mask shown in FIG. 27E, strong contrast is realized in the vicinity of the opening. However, the following should be noted: This improvement of the contrast occurs with respect to light vertically incident to the mask, more specifically, that is, light incident to the mask from a small light source region having a low coherence degree. However, the contrast is not improved even in the vicinity of the opening (in the vicinity of the phase boundary in which a phase change occurs) with respect to oblique incident exposure light, for example, exposure called annular illumination in which a vertical incident component (illumination component from the center of a light source (the normal direction of the mask) is removed. Furthermore, there is another disadvantage in that compared with the case where exposure is performed with a small light source having a low coherence degree, the depth of focus is lower in the case where oblique incident exposure is performed.

As described above, in order to form a fine resist-removed pattern such as a contact pattern using a positive resist process, it was necessary to perform exposure with a small light source having a coherence degree of about 0.5 or less, which provides illumination only with vertical incident components, in combination with a half-tone phase-shifting mask. This method was very useful to form fine and isolated contact patterns.

There is a recent tendency associated with a high degree of integration of recent semiconductor devices that densely arranged patterns as well as isolated patterns are also required not only for wiring patterns but also contact patterns. In order to realize a high depth of focus when forming densely arranged contact patterns, oblique incident exposure is useful as in the case of the densely arranged wiring patterns.

Furthermore, in recent years, also when forming wiring patterns, in addition to miniaturization of line patterns serving as wiring patterns, there is an increasing demand for miniaturization of space patterns between wirings. As in the case of the isolated contact patterns, it is useful to use a light source having a low coherence degree in combination with a half-tone phase-shifting mask in order to form small isolated space patterns between wirings.

That is to say, although oblique incident exposure is essential to form high density wiring patterns and high density contact patterns, the contrast and the depth of focus of isolated contact patterns and isolated space patterns between wirings are significantly deteriorated when oblique incident exposure is performed. The contrast and the depth of focus are deteriorated even more significantly when a half-tone phase-shifting mask is used to improve the resolution.

On the other hand, when a small light source having a low coherence degree is used to form small isolated contact patterns and small isolated space patterns between wirings, it becomes difficult to form high density patterns or small line patterns.

Therefore, the optimal illumination conditions with respect to small isolated space patterns and the optical illumination conditions with respect to densely arranged patterns or small line patterns have a contradictory relationship. Therefore, in order to form small resist patterns and small isolated resist-removed patterns at the same time, a light source having a medium coherence degree (about 0.5 to 0.6) is used for a trade-off between the effect of vertical incident components from a light source and the effect of oblique incident components from a light source. However, in this case, both the effect of vertical incident components and the effect of oblique incident components are canceled, so that it is difficult to realize further high integration of semiconductor devices by miniaturizing isolated line patterns or densely arranged patterns and isolated space patterns at the same time.

SUMMARY OF THE INVENTION

Therefore, with the foregoing in mind, it is an object of the present invention to miniaturize isolated space patterns and isolated line patterns or dense patterns at the same time.

In order to achieve the above object, a first photomask of the present invention includes on a transparent substrate: a semi-light-shielding portion having a light-shielding property with respect to exposure light: a light-transmitting portion surrounded by the semi-light-shielding portion and having a light-transmitting property with respect to exposure light: and a peripheral portion surrounded by the semi-light-shielding portion and positioned in a periphery of the light-transmitting portion. The semi-light-shielding portion and the light-transmitting portion transmit the exposure light in the same phase. The peripheral portion transmits the exposure light in a phase opposite to that of the semi-light-shielding portion and the light-transmitting portion. The surface of the transparent substrate in a formation region for the light-transmitting portion is exposed. A first phase shift film that transmits the exposure light in a phase opposite to that of the light-transmitting portion is formed on the transparent substrate in a formation region for the peripheral portion. The first phase shift film and a second phase shift film that transmits the exposure light in a phase opposite to that of the light-transmitting portion are laminated sequentially on the transparent substrate in a formation region for the semi-light-shielding portion. A multilayered structure of the first phase shift film and the second phase shift film has a transmittance that allows the exposure light to be transmitted partially and transmits the exposure light in the same phase as that of the light-transmitting portion.

According to the first photomask, a peripheral portion that transmits exposure light in a phase opposite to that of a light-transmitting portion is sandwiched by the light-transmitting portion and a semi-light-shielding portion having a light-shielding property that transmits the exposure light in the same phase as that of the light-transmitting portion. As a result, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to the light-transmitting portion) is formed with oblique incident exposure (off-axis illumination), for example, in the positive resist process. That is to say, it is possible to miniaturize isolated space patterns and isolated line patterns or dense patterns at the same time by combining the first photomask and oblique incident exposure.

Furthermore, according to the first photomask, the transmittance of the peripheral portion can be defined by the single layered structure of the first phase shift film, and the transmittance of the semi-light-shielding portion can be defined by the multilayered structure of the first phase shift film and the second phase shift film, so that a combination of the transmittance of the peripheral portion and the semi-light-shielding portion can be set arbitrarily.

In this specification, "having light-transmitting properties with respect to exposure" means having a transmittance that allows a resist to be exposed, and "having light-shielding properties with respect to exposure" means having a transmittance that does not allow a resist to be exposed. The "same phase" means a phase difference of $(-30+360 \times n)$ degrees or more and $(30+360 \times n)$ degrees or less, (where n=an integer), and the "opposite phase" means a phase difference of $(150+360 \times n)$ degrees or more and $(210+360 \times n)$ degrees or less.

In the first photomask, it is preferable that the first phase shift film has a first transmittance adjusting film and a first phase adjusting film formed on the first transmittance adjusting film, the first transmittance adjusting film transmits the exposure light in the same phase as that of the light-transmitting portion and has a relatively low transmittance with respect to the exposure light, and the first phase adjusting film transmits the exposure light in a phase opposite to that of the light-transmitting portion and has a relatively high transmittance with respect to the exposure light.

With this embodiment, a combination of a desired phase difference and a desired transmittance can be selected arbitrarily for the first phase shift film, and a combination of the material of the transmittance adjusting film and the material of the phase adjusting film makes it possible to improve the selection ratio at etching for processing the first phase shift film.

In the first photomask, it is preferable that the second phase shift film has a second transmittance adjusting film and a second phase adjusting film formed on the second transmittance adjusting film, the second transmittance adjusting film transmits the exposure light in the same phase as that of the light-transmitting portion and has a relatively low transmittance with respect to the exposure light, and the second phase adjusting film transmits the exposure light in a phase opposite to that of the light-transmitting portion and has a relatively high transmittance with respect to the exposure light.

With this embodiment, a combination of a desired phase difference and a desired transmittance can be selected arbitrarily for the second phase shift film, and a combination of the material of the transmittance adjusting film and the material of the phase adjusting film makes it possible to improve the selection ratio at etching for processing the second phase shift film.

In the first photomask, the peripheral portion may be in contact with the light-transmitting portion or may be spaced apart from the light-transmitting portion by a predetermined distance.

In the first photomask, it is preferable that the first phase shift film has a first phase adjusting film that transmits the exposure light in a phase opposite to that of the light-transmitting portion, the second phase shift film has a second phase adjusting film that is formed on the first phase adjusting film and transmits the exposure light in a phase opposite to that of the light-transmitting portion, and a transmittance adjusting film having a lower transmittance than that of the phase adjusting films with respect to the exposure light is formed between the first phase adjusting film and the second phase adjusting film.

With this embodiment, the semi-light-shielding portion has a structure in which a transmittance adjusting film having a low transmittance is provided between the first phase adjusting film and the second phase adjusting film, and therefore the difference in transmittance between the semi-light-shielding portion and the peripheral portion can be increased, so that the contrast in the light intensity distribution between the light-transmitting portion and the peripheral portion can be enhanced more. Furthermore, when the structure in which the transmittance adjusting film is formed partially on the first phase adjusting film in the peripheral portion formation region is used, the effective transmittance of the peripheral portion can be adjusted finely by the area ratio of the peripheral portion that is covered with the transmittance adjusting film (=(the area of the transmittance adjusting film in the peripheral portion formation region)/(the area of the peripheral portion)). Therefore, it is possible to arbitrarily change the transmittance of the peripheral portion depending on the pattern shape on the same photomask.

In the photomask, it is preferable that the transmittance of the semi-light-shielding portion with respect to the exposure light is 6% or more and 15% or less.

With this embodiment, the contrast enhancement effect by the first photomask can be obtained reliably while preventing a reduction in thickness of the resist film in pattern formation.

A second photomask of the present invention includes on a transparent substrate: a semi-light-shielding portion having a light-shielding property with respect to exposure light: a light-transmitting portion surrounded by the semi-light-shielding portion and having a light-transmitting property with respect to exposure light: and a peripheral portion surrounded by the semi-light-shielding portion and positioned in a periphery of the light-transmitting portion. The semi-light-shielding portion and the light-transmitting portion transmit the exposure light in the same phase. The peripheral portion transmits the exposure light in a phase opposite to that of the semi-light-shielding portion and the light-transmitting portion. The surface of the transparent substrate in a formation region for the light-transmitting portion is exposed. A semi-light-shielding film that has a transmittance allowing the exposure light to be transmitted partially and transmits the exposure light in the same phase to that of the light-transmitting portion is formed on the transparent substrate in the semi-light-shielding portion formation region. The semi-light-shielding film with a reduced thickness is formed on the transparent substrate in a formation region for the peripheral portion, the thickness being such an extent that the exposure light is transmitted in a phase opposite to that of the light-transmitting portion.

According to the second photomask, a peripheral portion that transmits exposure light in a phase opposite to that of a light-transmitting portion is sandwiched by the light-transmitting portion and a semi-light-shielding portion having a light-shielding property that transmits the exposure light in the same phase as that of the light-transmitting portion. As a result, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to the light-transmitting portion) is formed with oblique incident exposure, for example, in the positive resist process. That is to say, it is possible to miniaturize isolated space patterns and isolated line patterns or dense patterns at the same time by combining the second photomask and oblique incident exposure.

Furthermore, according to the second photomask, the semi-light-shielding portion is constituted by a single layered structure of the semi-light-shielding film, so that the mask structure is very simple. Moreover, a peripheral portion can be formed easily simply by partially reducing the thickness of the semi-light-shielding film, in other words, by providing a recess in the light-shielding film. Furthermore, also in the case where a semi-light-shielding portion having a small width is present between the peripheral portion and the light-transmitting portion, peeling of the film constituting the semi-light-shielding portion having a small width can be suppressed, compared with the case where a semi-light-shielding portion of a multilayered film structure is used.

In the second photomask, it is preferable that the semi-light-shielding film has a transmittance adjusting film formed on the transparent substrate and a phase adjusting film formed on the transmittance adjusting film. The transmittance adjusting film transmits the exposure light in the same phase as that of the light-transmitting portion and has a relatively low transmittance with respect to the exposure light, and the phase adjusting film has a relatively high transmittance with respect to the exposure light. The phase adjusting film in a formation region for the semi-light-shielding portion has a thickness that transmits the exposure light in the same phase as that of the light-transmitting portion. The phase adjusting film in a formation region for the peripheral portion has a thickness that transmits the exposure light in a phase opposite to that of the light-transmitting portion.

With this embodiment, a combination of a desired phase difference and a desired transmittance can be selected arbitrarily for the semi-light-shielding film, and a combination of the material of the transmittance adjusting film and the material of the phase adjusting film makes it possible to improve the selection ratio at etching for processing the semi-light-shielding film.

In the second photomask, it is preferable that the semi-light-shielding film has a phase adjusting film formed on the transparent substrate and a transmittance adjusting film formed only on the phase adjusting film in the semi-light-shielding portion formation region, the transmittance adjusting film transmits the exposure light in the same phase as that of the light-transmitting portion and has a relatively low transmittance with respect to the exposure light, the phase adjusting film has a relatively high transmittance with respect to the exposure light, the phase adjusting film in a formation region for the semi-light-shielding portion has a thickness that transmits the exposure light in the same phase as that of the light-transmitting portion, and the phase adjusting film in a formation region for the peripheral portion has a thickness that transmits the exposure light in a phase opposite to that of the light-transmitting portion.

With this embodiment, a combination of a desired phase difference and a desired transmittance can be selected arbitrarily for the semi-light-shielding film, and a combination of the material of the transmittance adjusting film and the material of the phase adjusting film makes it possible to improve the selection ratio at etching for processing the semi-light-shielding film.

In the second photomask, the peripheral portion may be in contact with the light-transmitting portion or may be spaced apart from the light-transmitting portion by a predetermined distance.

In the second photomask, it is preferable that the transmittance of the semi-light-shielding portion with respect to the exposure light is 6% or more and 15% or less.

With this embodiment, the contrast enhancement effect by the second photomask can be obtained reliably while preventing a reduction in thickness of the resist film in pattern formation.

A third photomask of the present invention include on a transparent substrate: a semi-light-shielding portion having a light-shielding property with respect to exposure light: a light-transmitting portion surrounded by the semi-light-shielding portion and having a light-transmitting property with respect to exposure light: and a peripheral portion surrounded by the semi-light-shielding portion and positioned in a periphery of the light-transmitting portion. The semi-light-shielding portion and the light-transmitting portion transmit the exposure light in the same phase. The peripheral portion transmits the exposure light in a phase opposite to that of the semi-light-shielding portion and the light-transmitting portion. The surface of the transparent substrate in a formation region for the light-transmitting portion is exposed. A semi-light-shielding film that has a transmittance that allows the exposure light to be transmitted partially and transmits the exposure light in the same phase as that of the light-transmitting portion is formed on the transparent substrate in the semi-light-shielding portion. The transparent substrate in a formation region for the peripheral portion is dug down so as to have a thickness that transmits the exposure light in a phase opposite to that of the light-transmitting portion.

According to the third photomask, a peripheral portion that transmits exposure light in a phase opposite to that of a light-transmitting portion is sandwiched by the light-transmitting portion and a semi-light-shielding portion having a light-shielding property that transmits the exposure light in the same phase as that of the light-transmitting portion. As a result, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to the light-transmitting portion) is formed with oblique incident exposure, for example, in the positive resist process. That is to say, it is possible to miniaturize isolated space patterns and isolated line patterns or dense patterns at the same time by combining the third photomask and oblique incident exposure.

Furthermore, according to the third photomask, the semi-light-shielding portion is constituted by a single layered structure of the semi-light-shielding film, so that the mask structure is very simple.

In the third photomask, it is preferable that the semi-light-shielding film has a transmittance adjusting film formed on the transparent substrate and a phase adjusting film formed on the transmittance adjusting film, the transmittance adjusting film has a relatively low transmittance with respect to the exposure light, and the phase adjusting film has a relatively high transmittance with respect to the exposure light.

With this embodiment, a combination of a desired phase difference and a desired transmittance can be selected arbitrarily for the semi-light-shielding film, and a combination of the material of the transmittance adjusting film and the material of the phase adjusting film makes it possible to improve the selection ratio at etching for processing the semi-light-shielding film.

In the third photomask, the peripheral portion may be in contact with the light-transmitting portion or may be spaced apart from the light-transmitting portion by a predetermined distance.

In the third photomask, it is preferable that the transmittance of the semi-light-shielding portion with respect to the exposure light is 6% or more and 15% or less.

With this embodiment, the contrast enhancement effect by the third photomask can be obtained reliably while preventing a reduction in thickness of the resist film in pattern formation.

A method for forming a pattern of the present invention, which uses either one of the first to the third photomasks, includes the steps of: forming a resist film on a substrate; irradiating the resist film with the exposure light via the photomask, and developing the resist film irradiated with the exposure light so as to pattern the resist film.

According to the method for forming a pattern of the present invention, the same effects as those of the first to the third photomasks of the present invention can be obtained. The above effects can be obtained reliably by using off-axis illumination (oblique incident exposure) in the step of irradiating the resist film with the exposure light.

A first method for producing a photomask of the present invention is a method for producing the photomask including a semi-light-shielding portion having a light-shielding property with respect to exposure light: a light-transmitting portion surrounded by the semi-light-shielding portion and having a light-transmitting property with respect to exposure light: and a peripheral portion surrounded by the semi-light-shielding portion and positioned in a periphery of the light-transmitting portion on a transparent substrate. More specifically, the method includes a first step of forming a first phase shift film that transmits the exposure light in a phase opposite to that of the light-transmitting portion on the transparent substrate, and a second step of forming a second phase shift film that transmits the exposure light in a phase opposite to that of the light-transmitting portion on the first phase shift film, a third step of removing the second phase shift film in a formation region for the light-transmitting portion and a formation region for the peripheral portion, and a fourth step of removing the first phase shift film in the light-transmitting portion formation region after the third step. A multilayered structure of the first phase shift film and the second phase shift film formed on the transparent substrate in the semi-light-shielding portion formation region has a transmittance that allows the exposure light to be transmitted partially and transmits the exposure light in the same phase as that of the light-transmitting portion.

According to the first method for producing a photomask, the first and the second phase shift films that transmit exposure light with a phase inversion are formed sequentially on the transparent substrate. Then, the second phase shift film in the light-transmitting portion formation region and the peripheral portion formation region is removed. Thereafter, the first phase shift film in the light-transmitting portion formation region is removed. That is to say, the light-transmitting portion is made of the exposed portion of the transparent substrate, and the semi-light-shielding portion is made of a multilayered structure of the first phase shift film and the second phase shift film. The peripheral portion is made of a single layered structure of the first phase shift film. The multilayered structure of the first and the second phase shift films transmits exposure light in the same phase as that of the light-transmitting portion. Therefore, the peripheral portion that transmits exposure light in the phase opposite to that of the light-transmitting portion is sandwiched by the light-transmitting portion and the semi-light-shielding portion that transmits exposure light in the same phase as that of the light-transmitting portion. As a result, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to the light-transmitting portion) is formed with oblique incident exposure, for example, in the positive resist process. That is to say, it is possible to miniaturize isolated space patterns and isolated line patterns or dense patterns at the same time with oblique incident exposure.

According to the first method for producing a photomask, the first and the second phase shift films that are laminated on the transparent substrate are etched selectively, so that a mask pattern with any shape that has the semi-light-shielding portion and the peripheral portion can be easily realized.

Furthermore, according to the first method for producing a photomask, when the light-transmitting portion and the peripheral portion are apart, in other words, when a semi-light-shielding portion made of the multilayered structure of the first and the second phase shift films is present between the light-transmitting portion and the peripheral portion, the first phase shift film can be etched in a self-alignment manner, using the patterned second phase adjusting film as a mask. Therefore, photomask process can be performed precisely.

A second method for producing a photomask of the present invention is a method for producing the photomask including a semi-light-shielding portion having a light-shielding property with respect to exposure light: a light-transmitting portion surrounded by the semi-light-shielding portion and having a light-transmitting property with respect to exposure light: and a peripheral portion surrounded by the semi-light-shielding portion and positioned in a periphery of the light-transmitting portion on a transparent substrate. More specifically, the method includes a first step of forming a first phase shift film that transmits the exposure light in a phase opposite to that of the light-transmitting portion on the transparent substrate, and a second step of forming a second phase shift film that transmits the exposure light in a phase opposite to that of the light-transmitting portion on the first phase shift film, a third step of removing the second phase shift film in a formation region for the peripheral portion, and a fourth step of removing the second phase shift film and the first phase shift film in the light-transmitting portion formation region sequentially after the third step. In a multilayered structure of the first phase shift film and the second phase shift film formed on the transparent substrate in the semi-light-shielding portion formation region has a transmittance that allows the exposure light to be transmitted partially and transmits the exposure light in the same phase as that of the light-transmitting portion.

According to the second method for producing a photomask, the first and the second phase shift films that transmit exposure light with a phase inversion are formed sequentially on the transparent substrate. Then, the second phase shift film in the peripheral portion formation region is removed. Thereafter, the second phase shift film and the first phase shift film in the light-transmitting portion formation region are removed. That is to say, the light-transmitting portion is made of the exposed portion of the transparent substrate, and the semi-light-shielding portion is made of a multilayered structure of the first phase shift film and the second phase shift film. The peripheral portion is made of a single layered structure of the first phase shift film. The multilayered structure of the first and the second phase shift films transmits exposure light in the same phase as that of the light-transmitting portion. Therefore, the peripheral portion that transmits exposure light in the phase opposite to that of the light-transmitting portion is sandwiched by the light-transmitting portion and the semi-light-shielding portion that transmits exposure light in the same phase as that of the light-transmitting portion. Therefore, the contrast in the light intensity distribution between the light-transmitting portion and the peripheral portion can be enhanced by mutual interference between the light transmitted through the light-transmitting portion and the light transmitted through the peripheral portion. This contrast enhancement effect also can be obtained when a fine isolated resist-removed portion (i.e., a fine isolated space pattern corresponding to the light-transmitting portion) is formed with oblique incident exposure, for example, in the positive resist process. That is to say, it is possible to miniaturize isolated space patterns and isolated line patterns or dense patterns at the same time with oblique incident exposure.

According to the second method for producing a photomask, the first and the second phase shift films that are laminated on the transparent substrate are etched selectively, so that a mask pattern with any shape that has the semi-light-shielding portion and the peripheral portion can be easily realized.

Furthermore, according to the second method for producing a photomask, the step of removing the second phase shift film in the peripheral portion formation region and the step of removing the second phase shift film in the light-transmitting portion formation region are performed separately. Therefore, when the light-transmitting portion and the peripheral portion are apart by a small distance, in other words, when the semi-light-shielding portion having a small width made of the multilayered structure of the first and the second phase shift films is present between the light-transmitting portion and the peripheral portion, the margin for photomask processing is increased.

In the first and the second methods for producing a photomask, it is preferable that the transmittance of the semi-light-shielding portion with respect to the exposure light is 6% or more and 15% or less.

With this embodiment, the contrast enhancement effect by the first and the second methods for producing a photomask can be obtained reliably while preventing a reduction in thickness of the resist film in pattern formation.

BRIEF DESCRIPTION OF THE DRAWINGS

FIGS. 2A to 2F are diagrams illustrating the dependence of the conventional image enhancement effect utilizing a phase end on the shape of a light source.

FIGS. 3A to 3F are diagrams illustrating the limit of the size of a phase shifter in the outline enhancement method of the present invention.

FIGS. 5A to 5F are diagrams illustrating the light intensity distribution produced by exposure light incident from various light source positions in forming isolated patterns with an outline enhancement mask of the present invention.

FIGS. 17A to 17D are cross-sectional views showing the processes of a method forming a pattern with the photomask of the second embodiment of the present invention.

DETAILED DESCRIPTION OF THE INVENTION

First, a method for improving the resolution with the photomask invented by the inventors of the present application to realize the present invention, more specifically, an "outline enhancement method" to improve the resolution of isolated space patterns will be described below.

Outline Enhancement Method

Hereinafter, the outline enhancement method will be described by taking formation of contact patterns by a positive resist process as an example. The "outline enhancement method" is a principle that can be used for any patterns, regardless of its shape, as long as the patterns are small space patterns in a positive resist process. Furthermore, the "outline enhancement method" can be applied to a negative resist process totally in the same manner, if the small space patterns (resist-removed patterns) in the positive resist process are replaced by small patterns (resist patterns).

FIGS. 1A to 1G are diagrams illustrating the principle to enhance the contract of transferred images of light in exposure for forming contact patterns.

Figure 1A:
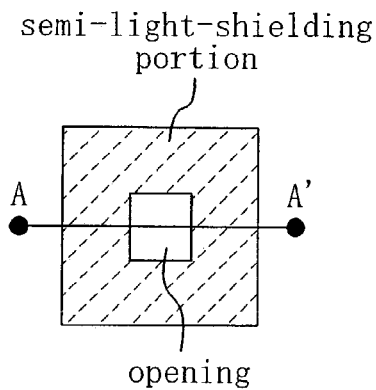
FIGS. 1A to 1G are diagrams illustrating the principle of the outline enhancement method of the present invention.
Figure 1B:
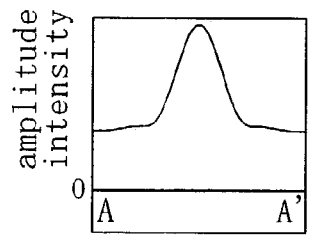

FIG. 1A is a plan view of a photomask in which an opening (i.e., light-transmitting portion) corresponding to a contact pattern is surrounded by a semi-light-shielding portion having a transmittance of 6% or more and 15% or less with respect to exposure light. FIG. 1B shows the amplitude intensity corresponding to line AA' of light transmitted through the photomask shown in FIG. 1A.

Figure 1C:
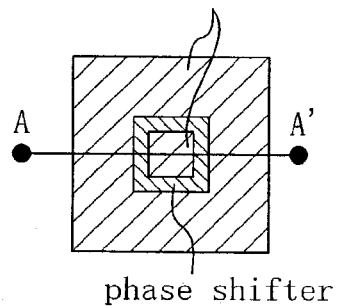
Figure 1D:
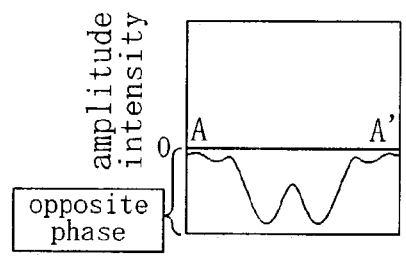

FIG. 1C is a plan view of a photomask in which a phase shifter is disposed in a peripheral area of the opening shown in FIG. 1A, and a complete light-shielding portion is disposed in the other area. FIG. 1D shows the amplitude intensity corresponding to line AA' of light transmitted through the photomask shown in FIG. 1C. The amplitude intensity of light shown in FIG. 1D is that of the light transmitted through a phase shifter, and therefore this amplitude intensity has an opposite phase with respect to the amplitude intensity of light shown in FIG. 1B.

Figure 1E:
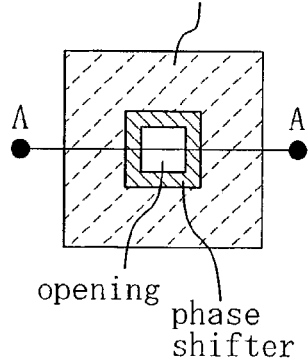
Figure 1F:
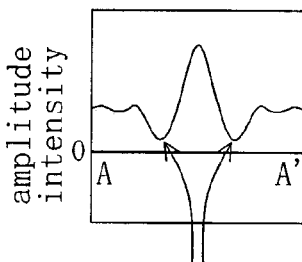
Figure 1G:
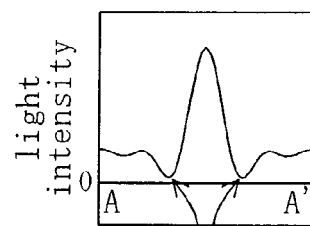

FIG. 1E is a plan view of a photomask in which an opening corresponding to a contact pattern and a phase shifter disposed in the peripheral area of the opening are surrounded by a semi-light-shielding portion having a transmittance of 6% or more and 15% or less with respect to exposure light. FIGS. 1F and 1G are the amplitude intensity and the light intensity (a square of the amplitude intensity of light) corresponding to line AA' of light transmitted through the photomask shown in FIG. 1E. The photomask shown in FIG. 1E is a photomask obtained by disposing a phase shifter in a peripheral area of the opening in the photomask shown in FIG. 1A. The photomask shown in FIG. 1E is an example of the photomask of the present invention that can realize the outline enhancement method (hereinafter, referred to as "outline enhancement mask").

The photomask shown in FIG. 1A or 1E, the light transmitted through the semi-light shielding portion and the light transmitted through the opening have the same phase (more specifically, a phase difference of (−30+360×n) degrees or more and (30+360×n) degrees or less, where n=an integer). In the photomask shown in FIG. 1E, the light transmitted through the phase shifter and the light transmitted through the opening have opposite phases (more specifically, a phase difference of (150+360×n) degrees or more and (210+360× n) degrees or less, where n=an integer).

The principle based on which transferred image of light transmitted through the outline enhancement mask shown in FIG. 1E is as follows. The structure of the photomask shown in FIG. 1E is a structure in which the photomasks shown in FIGS. 1A and 1C are overlapped each other. Therefore, as shown in FIGS. 1B, 1D, and 1F, the amplitude intensity of light transmitted through the photomask shown in FIG. 1E has a distribution similar to that obtained by overlapping the amplitude intensities of the lights transmitted through the photomasks shown in FIGS. 1A and 1C. As seen from FIG. 1F, in the photomask shown in FIG. 1E, if the intensity of light transmitted through the phase shifter disposed in the periphery of the opening can cancel a part of each of the lights transmitted through the opening and the semi-light shielding portion. Therefore, in the photomask shown in FIG. 1E, if the intensity of the light transmitted through the phase shifter is adjusted such that light in the periphery of the opening is canceled, it is possible to form a light intensity distribution in which the light intensity corresponding to the periphery of the opening is reduced to nearly 0, as shown in FIG. 1G.

In the photomask shown in FIG. 1E, the light transmitted through the phase shifter cancels the light in the periphery of the opening to a high degree, but cancels the light in the vicinity of the center of the opening to a low degree. As a result, there is another advantage that the slope of the profile of the light intensity distribution of the light transmitted through the photomask shown in FIG. 1E in which the light intensity changes from the center of the opening to the periphery of the opening is increased, as shown in FIG. 1G. Therefore, the light intensity distribution of the light transmitted through the photomask shown in FIG. 1E has a sharp profile, so that images having a high contrast can be formed.

Above described is the principle based on which optical images (images of light intensity) in the present invention are enhanced. In other words, a phase shifter is disposed along the outline of an opening in a mask formed of a semi-light shielding portion having a low transmittance, so that it is possible to form a very dark portion corresponding to the outline of the opening in a light intensity image formed with the photomask shown in FIG. 1A. Thus, a light intensity distribution in which the contrast between the light intensity in the opening and the light intensity in the periphery of the opening is enhanced can be formed. In this specification, a method by which image enhancement is performed based on this principle is referred to as the "outline enhancement method", and the photomask that realizes this principle is referred to as an "outline enhancement mask".

Hereinafter, the difference between the outline enhancement method, which is the basic principle of the present invention, and the principle of a conventional method using a half-tone phase-shifting mask will be described. The most important point of the principle of the outline enhancement mask is that a part of the light transmitted through each of the semi-light shielding portion and the opening is canceled by the light transmitted through the phase shifter, so that a dark portion is formed in the light intensity distribution, that is, that the phase shifter behaves in a manner similar to a non-transparent pattern (opaque pattern). Therefore, as shown in FIG. 1F, a dark portion is formed by a change in intensity on the same phase side in the amplitude intensity of the light transmitted through the outline enhancement mask. Only in this state, the contrast can be improved by oblique incident exposure, which will be described in detail later.

Figure 27A:
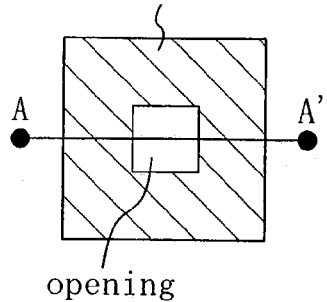
FIGS. 27A to 27G are diagrams illustrating the image enhancement principle with a conventional half-tone phase-shifting mask.
Figure 27B:
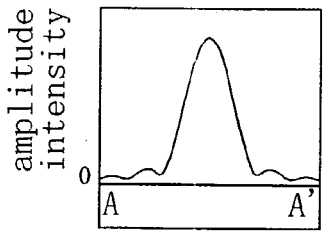
Figure 27C:
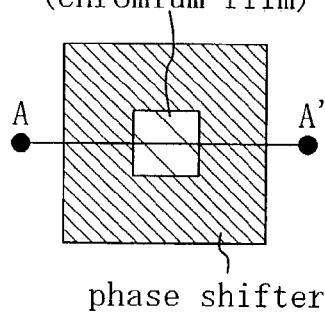
Figure 27D:
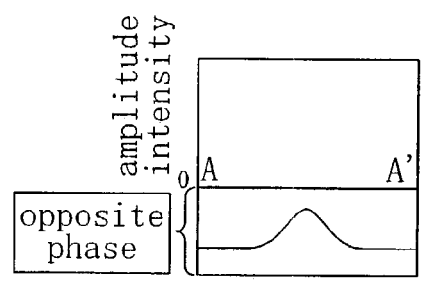
Figure 27E:
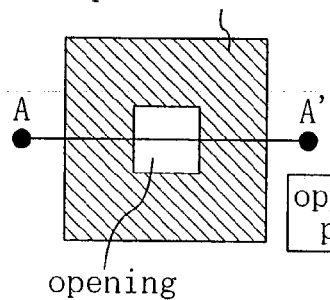
Figure 27F:
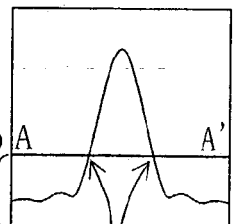
Figure 27G:
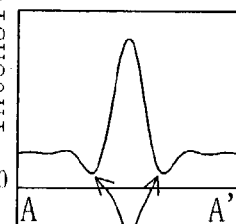

On the other hand, also in the light intensity distribution obtained by exposure with the conventional half-tone phase-shifting mask having an opening corresponding to a contact pattern, a very dark portion is formed in the periphery of the opening, as shown in FIG. 27G. However, when the amplitude intensity of the light shown in FIG. 27F obtained by exposure with the half-tone phase-shifting mask is compared with the amplitude intensity of the light shown in FIG. 1F obtained by exposure with the outline enhancement mask, the following difference is clearly present. As shown in FIG. 27F, in the amplitude intensity distribution obtained by exposure with the half-tone phase-shifting mask, a phase boundary in which a phase inversion occurs is present. As shown in FIG. 27G, this phase boundary constitutes a dark portion of the light intensity distribution due to the phase end and thus image enhancement is realized. However, in order to form a dark portion due to the phase end to obtain an enhancement effect of the contract, a component of light incident vertically to the photomask is required. On the other hand, oblique incident exposure cannot provide a dark portion due to a phase end, even if the phase boundary is generated, and consequently the contrast enhancement effect cannot be obtained. This is the reason why the contrast enhancement effect cannot be obtained when oblique incident exposure is performed with the half-tone phase-shifting mask. In other words, in order to obtain the contrast enhancement effect with the half-tone phase-shifting mask, it is necessary to perform exposure using a small light source having a low coherence degree.

As described above, in forming contact patterns, although the light intensity distribution with the half-tone phase-shifting mask is similar to that with the outline enhancement mask, the outline enhancement method can provide a higher contrast to a transferred image of light, which is necessary for forming small isolated space patterns, even with oblique incident exposure, because of the difference in the principle for formation of a dark portion (the phase boundary is not generated in the amplitude intensity distribution of the light transmitted through the outline enhancement mask (see FIG. 1F).

FIG. 2A is a plan view of a half-tone phase-shifting mask in which an opening corresponding to a contact pattern is surrounded by a phase shifter. FIG. 2B shows calculation results of the light intensity distribution corresponding to line AA' when exposure is performed with a small light source having a small coherence degree σ=0.4 with respect to the half-tone phase-shifting mask shown in FIG. 2A. FIG. 2C shows calculation results of the light intensity distribution corresponding to line AA' when exposure is performed with annular illumination, which is one type of oblique incident exposure, with respect to the half-tone phase-shifting mask shown in FIG. 2A. In this case, what is called ⅔ annular illumination having an outer diameter σ of 0.75 and an inner diameter σ of 0.5 is used as the annular illumination. For the exposure conditions, the light source wavelength λ is 193 nm (ArF light source) and the numerical aperture NA is 0.6. The contact size is 180 nm square, and the transmittance of the phase shifter is 6%. In the following description, the light intensity is shown by a relative light intensity when taking the light intensity of exposure light as 1, unless otherwise specified.

As shown in FIGS. 2B and 2C, when the half-tone phase-shifting mask is used, a dark portion due to a phase end is formed in the light intensity distribution from exposure with a small light source and an image having a high contrast can be formed. On the other hand, in the light intensity distribution from oblique incident exposure, a dark portion due to a phase end is not formed, and therefore an image having a very poor contrast is formed.

FIG. 2D is a plan view of an edge enhancement phase-shifting mask in which an opening corresponding to a contact pattern and a phase shifter positioned in an area surrounding the opening are surrounded by a chromium film serving as a complete light-shielding portion. FIG. 2E shows calculation results of the light intensity distribution corresponding to line AA' when exposure is performed with a small light source having a small coherence degree σ=0.4 with respect to the edge enhancement phase-shifting mask shown in FIG. 2D. FIG. 2F shows calculation results of the light intensity distribution corresponding to line AA' when exposure is performed with annular illumination with respect to the edge enhancement phase-shifting mask shown in FIG. 2E. Herein, similarly to the half-tone phase-shifting mask, the "edge enhancement phase-shifting mask" is a mask that can realize image enhancement by forming a dark portion due to a phase end between an opening and a phase shifter. The type of annular illumination, the exposure conditions and the transmission of the phase shifter are the same as those in the case of the half-tone phase-shifting mask shown in FIGS. 2A to 2C. The contact size is 220 nm square, and the width of the phase shifter is 80 nm.

As shown in FIGS. 2E and 2F, when the edge enhancement phase-shifting mask is used, similarly to the case of the half-tone phase-shifting mask, a dark portion due to a phase end is formed in the light intensity distribution from exposure with a small light source, and an image having a high contrast can be formed. On the other hand, in the light intensity distribution from oblique incident exposure, a dark portion due to a phase end is not formed, and therefore an image having a very poor contrast is formed.

Next, in the outline enhancement method, before showing in detail that oblique incident exposure components can provide high contrast, the fact that the structure of the outline enhancement mask as shown in FIG. 1E cannot provide the outline enhancement effect when the width of the phase shifter becomes too large will be described.

FIG. 3A is a plan view of an outline enhancement mask in which an opening corresponding to a contact pattern and a phase shifter having a small width positioned in an area surrounding the opening are surrounded by a semi-light shielding portion having a transmittance of 6% or more and 15% or less with respect to exposure light. FIG. 3B shows calculation results of the light intensity distribution corresponding to line AA' when exposure is performed with a small light source having a small coherence degree σ=0.4 with respect to the outline enhancement mask shown in FIG. 3A. FIG. 3C shows calculation results of the light intensity distribution corresponding to line AA' when exposure is performed with annular illumination with respect to the outline enhancement mask shown in FIG. 3A.

FIG. 3D is a plan view of an outline enhancement mask in which an opening corresponding to a contact pattern and a phase shifter having a large width positioned in an area surrounding the opening are surrounded by a semi-light shielding portion having a transmittance of 6% or more and 15% or less with respect to exposure light. FIG. 3E shows calculation results of the light intensity distribution corresponding to line AA' when exposure is performed with a small light source having a small coherence degree σ=0.4 with respect to the outline enhancement mask shown in FIG. 3D. FIG. 3F shows calculation results of the light intensity distribution corresponding to line AA' when exposure is performed with annular illumination with respect to the outline enhancement mask shown in FIG. 3D.

In this case, it is assumed that the width of the phase shifter in the outline enhancement mask shown in FIG. 3D is set to be too large to satisfy the principle of the outline enhancement method. More specifically, the sizes of the openings shown in FIGS. 3A and 3D are both 220 nm square, and the width of the phase shifter shown in FIG. 3A is 60 nm and the width of the phase shifter shown in FIG. 3D is 150 nm. The types of the annular illumination and the exposure conditions are the same as those in the case of the half-tone phase-shifting mask shown in FIGS. 2A to 2C.

As shown in FIGS. 3B and 3C, when the outline enhancement mask shown in FIG. 3A that satisfies the principle of the outline enhancement method is used, a dark portion due to a non-transparent function of the phase shifter appears regardless of the type of the light source and the contrast in the light intensity distribution is higher in the annular illumination.

On the other hand, when the outline enhancement mask shown in FIG. 3D with an excessively large phase shifter is used, the light transmitted through the phase shifter is too strong, so that an amplitude intensity distribution having an opposite phase is formed. In this situation, the same principle as in the case of the half-tone phase-shifting mask or the edge enhancement phase-shifting mask acts. In other words, as shown in FIGS. 3E and 3F, a dark portion due to a phase end is formed in the light intensity distribution obtained by exposure with a small light source and the contrast enhancement effect is provided, whereas no dark portion due to a phase end is formed in the light intensity distribution obtained by oblique incident exposure, so that an image having very poor contrast is formed.

In other words, in order to realize the outline enhancement method, in the mask structure, it is necessary that not only the phase shifter is disposed in the periphery of the opening surrounded by the semi-light shielding portion, but also that the light transmitted through the phase shifter is limited. According to the mechanism of the principle, the latter means that the light transmitted through the phase shifter has an intensity that at least can cancel the lights transmitted through the semi-light shielding portion and the opening, and the intensity distribution having an opposite phase with a predetermined size or more is not formed in its amplitude intensity distribution.

In order to actually limit the light transmitted through the phase shifter, a condition (more specifically the upper limit) can be imposed on the width of the phase shifter, depending on the transmittance of the phase shifter. Hereinafter, the condition will be described with reference to the results of observing conditions under which the light from the periphery of the phase shifter is cancelled by the light transmitted through the phase shifter (see FIGS. 4A and 4B).

Figure 4A:
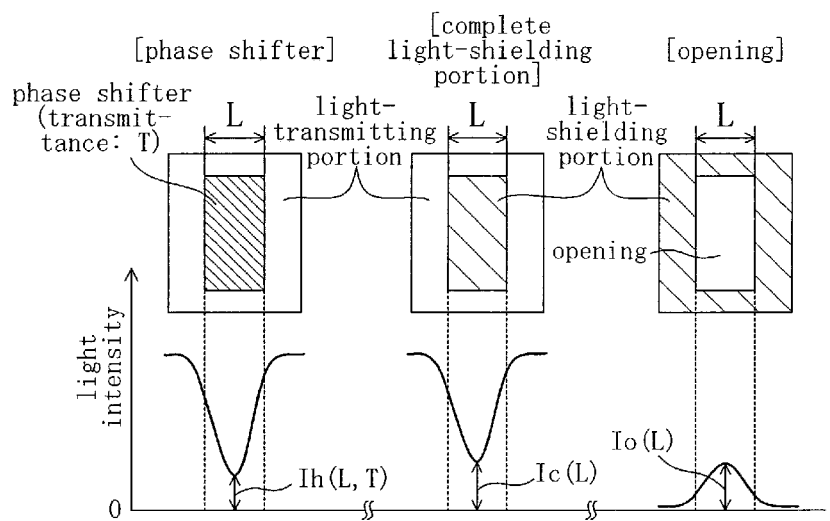
FIGS. 4A and 4B are diagrams illustrating the limit of the size of a phase shifter in the outline enhancement method of the present invention.
Figure 4B:
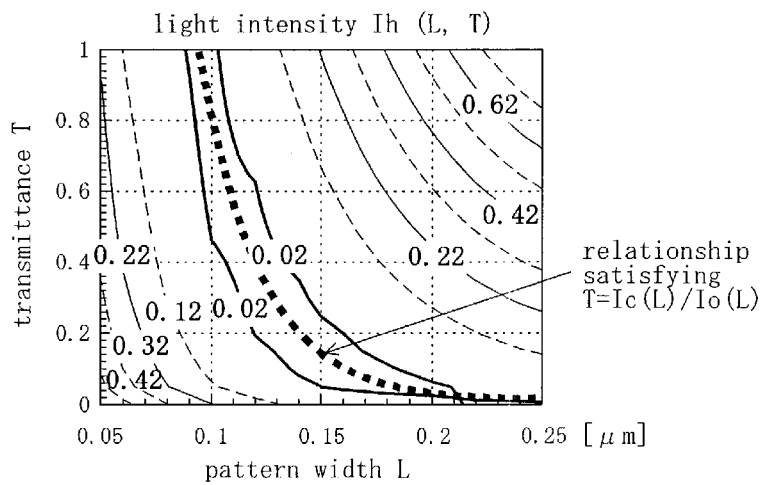

As shown in FIG. 4A, in exposure with a photomask (phase shifter mask) in which a phase shifter having a transmittance T and a line width L is provided on a transparent substrate is used, the light intensity generated in a position corresponding to the center of the phase shifter in an exposed material is expressed as Ih (L, T). In exposure with a photomask (light-shielding mask) in which the phase shifter of the phase-shifting mask is replaced by a complete light-shielding portion is used, the light intensity generated in a position corresponding to the center of the complete light-shielding portion in an exposed material is expressed as Ic (L). In exposure with a photomask (light-transmitting mask) in which the phase shifter of the phase-shifting mask is replaced by an opening (light-transmitting portion) and the light-transmitting portion of the phase-shifting mask is replaced by a complete light-shielding portion is used, the light intensity generated in a position corresponding to the center of the opening in an exposed material is expressed as Io (L). FIG. 4B is a graph showing the simulation results of the light intensity Ih (L, T) when the transmittance T and the line width L of the phase shifter are varied in exposure with the phase-shifting mask shown in FIG. 4A, represented by contour lines of the light intensity with the transmittance T and the line width L in the vertical axis and the horizontal axis, respectively. In this graph, a graph indicating the relationship of T=Ic (L)/Io (L) is superimposed. The simulation conditions are such that the wavelength of the exposure light λ=0.193 μm (ArF light source), the numerical aperture NA of the projection optical system of the exposure apparatus=0.6, and the coherence degree σ of the exposure light source=0.8 (regular light source).

As shown in FIG. 4B, the condition under which the light intensity Ih (L, T) becomes smallest can be expressed by a relationship T=Ic (L)/Io (L). This physically represents a relationship in which T×Io (L) indicating the light intensity of the light transmitted through the phase shifter is in equilibrium with Ic (L) indicating the light intensity of the light transmitted outside the phase shifter. Therefore, the width L of the phase shifter that provides an amplitude intensity of an opposite phase in the amplitude intensity distribution because of excessive light transmitted through the phase shifter is a width L that allows T×Io (L) to be larger than Ic (L).

It is empirically obtained from various simulation results that the width L that allows the light transmitted through the phase shifter having a transmittance of 1 to be in equilibrium with the light transmitted outside the phase shifter is about 0.3×λ (light source wavelength)/NA (numerical aperture) (about 100 nm in the case of FIG. 4B), although this may depend on the type of the light source. Furthermore, as seen from FIG. 4B, in order to prevent too much light from being transmitted through the phase shifter having a transmittance of 6% (0.06) or more, the width L should be not more than twice the width of the phase shifter having a transmittance of 100% (1.0). That is to say, in order to prevent too much light from being transmitted through the phase shifter having a transmittance of 6% or more, the upper limit of the width L of the phase shifter should be not more than 0.6×λ/NA.

If the above-described findings are applied to the outline enhancement mask, the upper limit of the width L of the phase shifter in the outline enhancement mask can be considered to be a half of the upper limit in the above findings because the light transmitted outside the phase shifter in the outline enhancement mask to be taken into consideration is significantly only light on one side rather than both sides of the phase shifter. Therefore, the upper limit of the width L of the phase shifter in the outline enhancement mask is not more than 0.3×λ/NA when the transmittance of the phase shifter is 6% or more. However, this is not a sufficient condition, and the upper limit of the width L of the phase should be smaller than 0.3×λ/NA, depending on how high the transmittance of the phase shifter is. That is to say, when the transmittance of the phase shifter is as high as 100% or 50% or more, the width L of the phase shifter should be 0.2×λ/NA or less, preferably 0.15×λ/NA or less. When forming fine hole patterns, in order to obtain the effect of enhancing the profile of the light intensity distribution by interference between the light transmitted though the phase shifter and the light transmitted through the light-transmitting portion corresponding to a hole pattern, it is preferable to arrange the phase shifter in a region with a distance from the center of the light-transmitting portion, that is, the hole of 0.5×λ/NA or less. Therefore, when the width L of the phase shifter is 0.3×λ/NA or less, it is preferable in forming hole patterns that the phase shifter surrounding the light-transmitting portion is present in a region with a distance from the center of the light-transmitting portion corresponding to the hole pattern of 0.5×λ/NA or more and 0.8×λ/NA or less.

In this specification, unless otherwise specified, various mask sizes such as the width of a phase shifter are shown by the sizes on an exposed material. The actual mask size can be obtained easily by multiplying the sizes on an exposed material by the reduction ratio M of a reduction projection optical system of an exposure apparatus.

Next, the image enhancement that can be realized with oblique incident exposure in the outline enhancement method will be described in detail, based on a change in the contrast of the light intensity distribution when exposure is performed from various light source positions with respect to the outline enhancement mask.

Figure 5C:
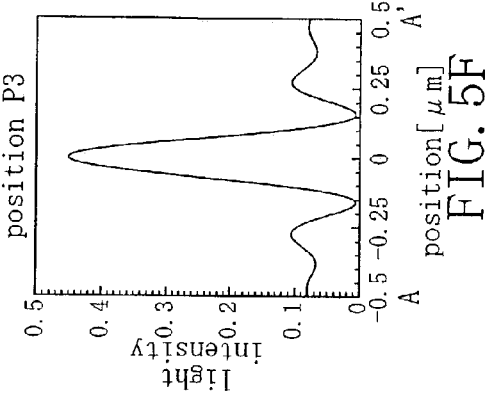
Figure 5B:
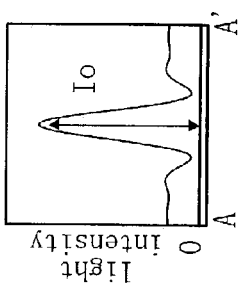
Figure 5A:
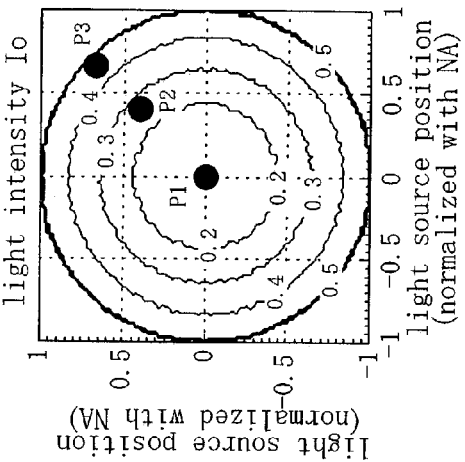

FIG. 5A is a plan view of the outline enhancement mask. In this case, the transmittance of the semi-light-shielding portion is 7.5%, and the transmittance of the phase shifter and the opening is 100%. The size of the opening is 200 nm square, and the width of the phase shifter is 50 nm.

FIG. 5C shows the results obtained by calculating the light intensity distribution corresponding to line AA' of FIG. 5A when exposure is performed from a point light source in various positions normalized with the numerical aperture NA with respect to the outline enhancement mask shown in FIG. 5A with optical simulations, reading the light intensity Io in a position corresponding to the center of the opening in the calculation results (e.g., the light intensity distribution shown in FIG. 5B) and plotting the light intensity Io against each light source position. The results shown in this plot are from the optical calculations that are performed assuming that the light source wavelength λ is 193 nm (ArF light source) and the numerical aperture NA is 0.6. In the following description, unless otherwise specified, in the optical simulations, a calculation is performed under the conditions that the light source wavelength λ is 193 nm (ArF light source) and the numerical aperture NA is 0.6.

Figure 5E:
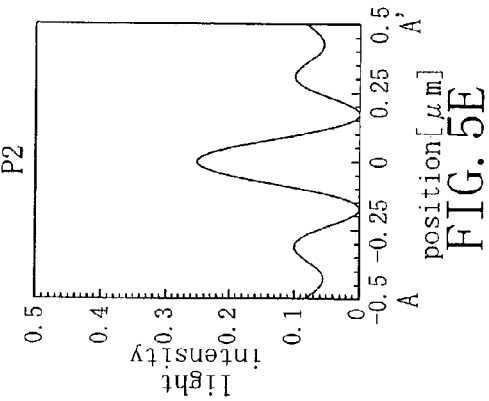
Figure 5F:
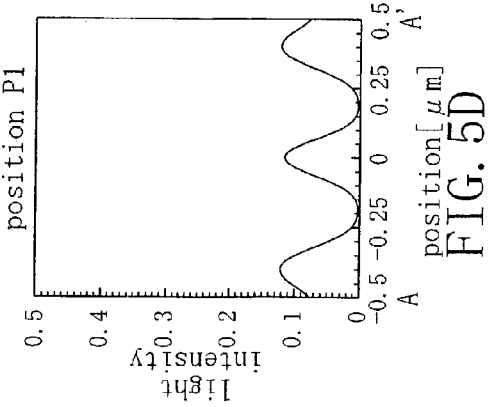

As shown in FIG. 5C, the light intensity Io in the center of the opening is larger, as exposure is performed with a point light source in a light position on the outer side (a light source position more apart from the origin in FIG. 5C). That is to say, the plot shows that as exposure is performed with a light source having a larger oblique incident component, the contrast is larger. This will be described more specifically with reference to the drawings. FIGS. 5D, 5E, and 5F are graphs obtained by plotting the light intensity distribution corresponding to line AA' of FIG. 5A in sample points P1, P2 and P3 of the point light sources shown in FIG. 5C, respectively. As shown in FIGS. 5D, 5E, and 5F, as the position of the point light source is on the outer side, in other words, as the light source is in the position that provides larger oblique incident light, an image of a higher contrast is formed.

Next, for comparison, a change in the contrast of the light intensity distribution when exposure is performed from various light source positions with respect to the half-tone phase-shifting mask will be described. FIG. 6A is a plan view of the half-tone phase-shifting mask. In this case, the transmittance of the phase shifter is 6%, and the transmittance of the opening is 100%. The size of the opening (size on an exposed wafer) is 180 nm square.

Figure 6C:
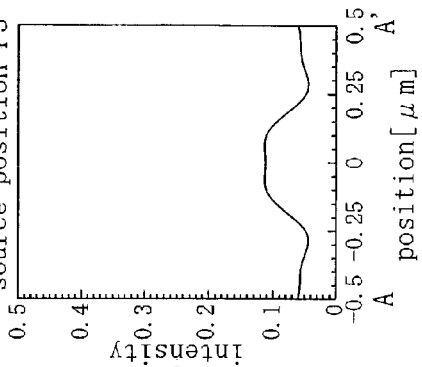
FIGS. 6A to 6F are diagrams illustrating the light intensity distribution produced by exposure light incident from various light source positions in forming isolated patterns with a conventional half-tone phase-shifting mask.
Figure 6B:
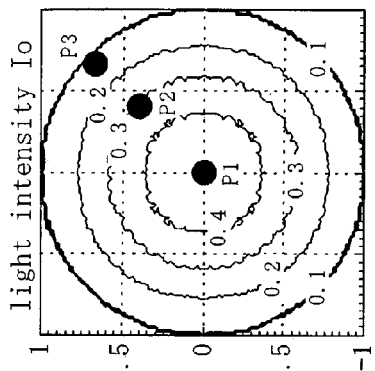
Figure 6A:
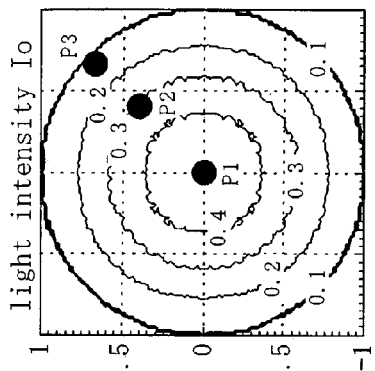

FIG. 6C shows the results obtained by calculating the light intensity distribution corresponding to line AA' of FIG. 6A when exposure is performed from a point light source in various positions normalized with the numerical aperture NA with respect to the half-tone phase-shifting mask shown in FIG. 6A with optical simulations, reading the light intensity Io in a position corresponding to the center of the opening in the calculation results (e.g., the light intensity distribution shown in FIG. 6B) and plotting the light intensity Io against each light source position.

Figure 6F:
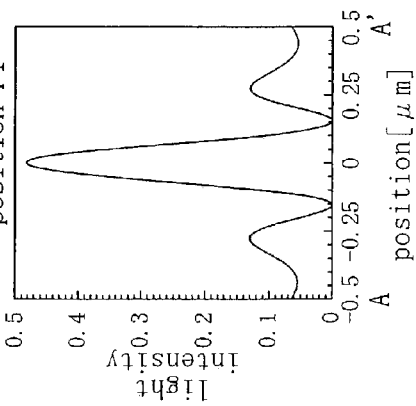
Figure 6E:
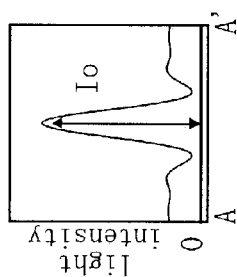
Figure 6D:
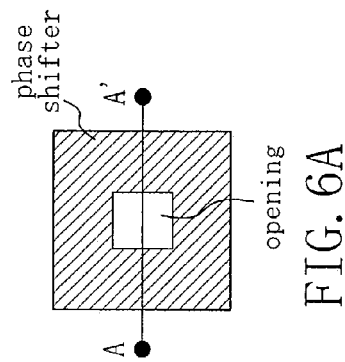

As shown in FIG. 6C, the light intensity Io in the center of the opening is larger, as exposure is performed with a point light source in a light position on the inner side (a light source position closer to the origin in FIG. 6C). That is to say, the plot shows that as exposure is performed with a light source having a larger vertical incident component, the contrast is larger. This will be described more specifically with reference to the drawings. FIGS. 6D, 6E, and 6F are graphs obtained by plotting the light intensity distribution corresponding to line AA' of FIG. 6A in sample points P1, P2 and P3 of the point light sources shown in FIG. 6C, respectively. As shown in FIGS. 6D, 6E, and 6F, as the position of the point light source is on the inner side, in other words, as the light source is in the position that provides larger vertical incident light, an image of a higher contrast is formed.

As seen from the comparison between the results shown in FIGS. 5A to 5F and the results shown in FIGS. 6A to 6F, the outline enhancement method makes it possible to enhance the contrast of the light intensity distribution obtained by oblique incident exposure in forming small isolated space patterns such as contact patterns, which cannot be realized by the conventional methods.

Figure 7A:
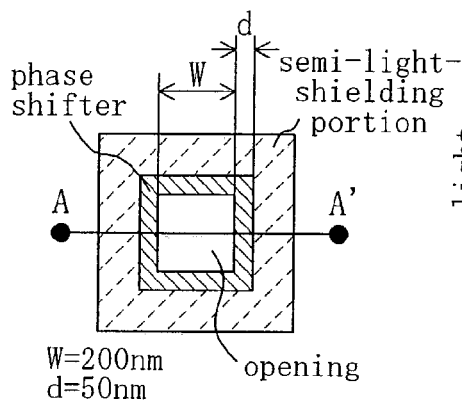
FIGS. 7A to 7F are diagrams illustrating the dependence of the contrast and the DOF on the transmittance of a semi-light shielding portion in the outline enhancement mask of the present invention.
Figure 7B:
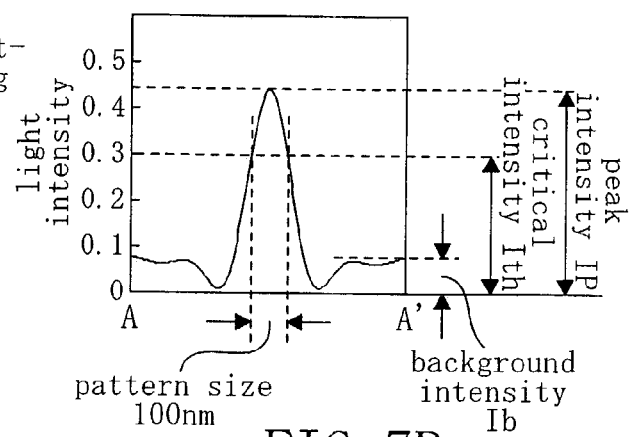

The fact that the contrast is improved by the outline enhancement mask has been described so far. Next, the dependence of the contrast and the DOF on the transmittance of the semi-light-shielding portion in the outline enhancement mask will be described below. The following description is based on the results obtained by simulations of various margins in pattern formation, using the outline enhancement mask shown in FIG. 7A. FIG. 7B shows the light intensity distribution formed when exposure is performed with respect to the outline enhancement mask shown in FIG. 7A. In FIG. 7B, values regarding various margins defined when forming a hole pattern with a width of 100 nm using the outline enhancement mask shown in FIG. 7A are also shown. More specifically, the critical intensity Ith is the light intensity that allows a resist film to be exposed, and the margin is defined with respect to this value. For example, if Ip is the peak value of the light intensity distribution, Ip/Ith is proportional to the sensitivity with which a resist mask is exposed, and the higher value is more preferable. If Ib is the background intensity of light transmitted through the semi-light-shielding portion, a higher Ith/Ib means that a reduction in thickness of the resist film hardly occurs at pattern formation, and the higher value is more preferable. In general, it is preferable that a value of Ith/Ib is at least 2. With the foregoing in mind, each margin will be described.

Figure 7C:
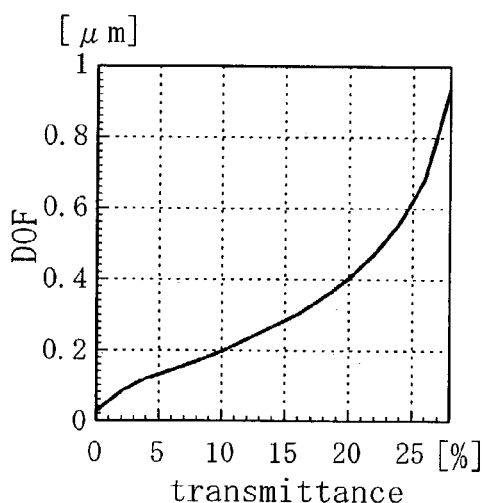
Figure 7D:
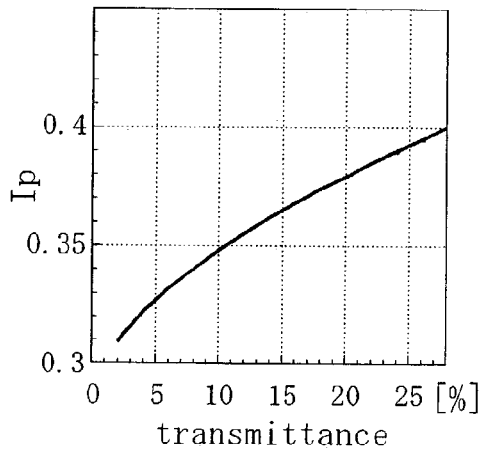

FIG. 7C shows the calculation results regarding the dependence of the DOF on the transmittance of a semi-light-shielding portion in pattern formation using the outline enhancement mask shown in FIG. 7A. Here, the DOF is defined as the width of the focus position in which a change in the size of a finished pattern is within 10%. As shown in FIG. 7C, the higher transmittance the semi-light-shielding portion has, the more preferable it is for improvement of the DOF. FIG. 7D shows the calculation results regarding the peak value Ip with respect to the transmittance of the semi-light shielding portion in pattern formation using the outline enhancement mask shown in FIG. 7A. As shown in FIG. 7D, the higher transmittance the semi-light-shielding portion has, the more preferable it is for improvement of the peak value Ip, that is, the contrast as well. From the above-described results, in the outline enhancement mask, the higher transmittance the semi-light-shielding portion has, the more preferable it is. More specifically, as shown in FIGS. 7C and 7D, the improvement rate of the exposure margin is increased with an increase of the transmittance from 0% to about 6% and it can be appreciated that it is preferable to use a semi-light-shielding portion having a transmittance of about 6% or more.

Figure 7E:
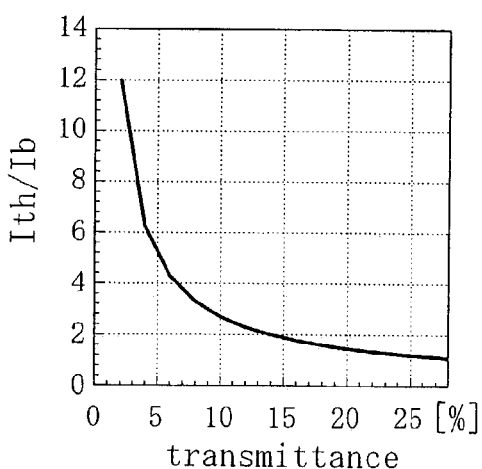
Figure 7F:
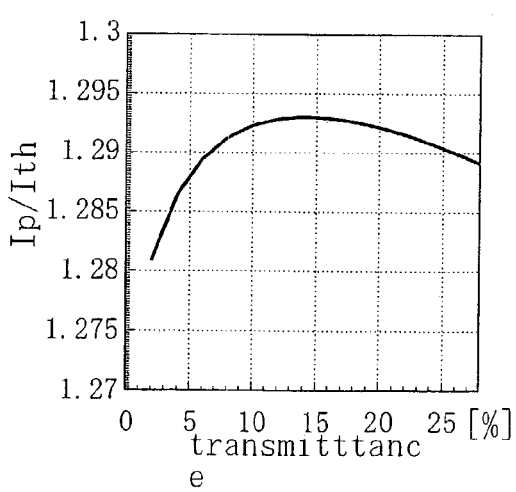

FIG. 7E shows the calculation results regarding the Ith/Ib with respect to the transmittance of the semi-light shielding portion in pattern formation using the outline enhancement mask shown in FIG. 7A. As shown in FIG. 7E, the higher transmittance the semi-light-shielding portion has, the lower the value of Ith/Ib is. It is not preferable for improvement of Ith/Ib that the transmittance is too high. More specifically, Ith/Ib is less than 2 when the transmittance of the semi-light-shielding portion is about 15%. FIG. 7F shows the calculation results regarding the Ip/Ith with respect to the transmittance of the semi-light-shielding portion in pattern formation using the outline enhancement mask shown in FIG. 7A. As shown in FIG. 7F, the Ip/Ith has a peak at a transmittance of about 15% of the semi-light-shielding portion.

As described above, in the outline enhancement mask, the DOF and the contrast are improved more, as the transmittance of the semi-light-shielding portion is higher, and this effect is more significant when the transmittance of the semi-light-shielding portion exceeds 6%. On the other hand, to prevent a reduction in thickness of the resist film during pattern formation or to optimize the resist sensitivity, it is preferable that the maximum of the transmittance of the semi-light-shielding portion is about 15%. Therefore, the optimal value of the transmittance of the semi-light-shielding portion in the outline enhancement mask is 6% or more and 15% or less. That is to say, the semi-light-shielding portion transmits exposure light partially to an extent that the resist is not exposed. In other words, the semi-light-shielding portion transmits a part of the total amount of exposure light. Such a semi-light-shielding portion can be formed of oxides such as ZrSiO, CrAlO, TaSiO, MoSiO or TiSiO.

FIGS. 8A to 8F are plan views showing variations of a light shielding mask patterns constituted by a semi-light shielding portion and a phase shifter in the outline enhancement mask provided with an opening corresponding to a contact pattern.

Figure 8A:
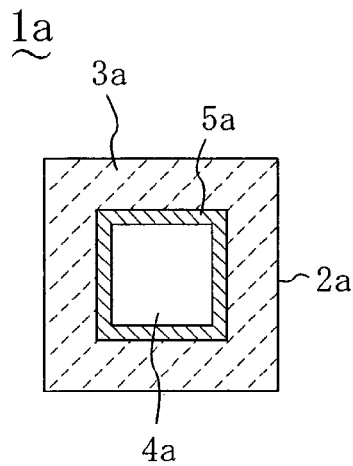
FIGS. 8A to 8F are diagrams illustrating variations of the layout of a light shielding mask patterns constituted by a semi-light shielding portion and a phase shifter in the outline enhancement mask provided with an opening corresponding to a contact pattern.

An outline enhancement mask 1a shown in FIG. 8A has the same structure of that of the outline enhancement mask shown in FIG. 1E. That is, the outline enhancement mask 1a is a photomask using a transparent substrate 2a and includes a semi-light-shielding portion 3a having a transmittance that allows a part of exposure light to be transmitted, an opening 4a surrounded by the semi-light-shielding portion 3a and corresponding to an isolated contact pattern, and a ring-shaped phase shifter 5a positioned around the opening 4a.

Figure 8B:
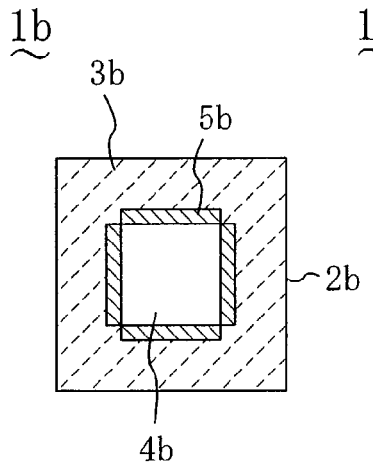

The outline enhancement mask 1b shown in FIG. 8B is a photomask using a transparent substrate 2b and includes a semi-light-shielding portion 3b having a transmittance that allows a part of exposure light to be transmitted, an opening 4b surrounded by the semi-light-shielding portion 3b and corresponding to an isolated contact pattern, and a phase shifter 5b constituted by four rectangular phase shifter portions that have a side having the same length of each side of the opening 4b and are in contact with the respective sides of the opening 4b. This outline enhancement mask 1b has substantially the same characteristics as those of the outline enhancement mask 1a in isolated pattern formation.

Figure 8C:
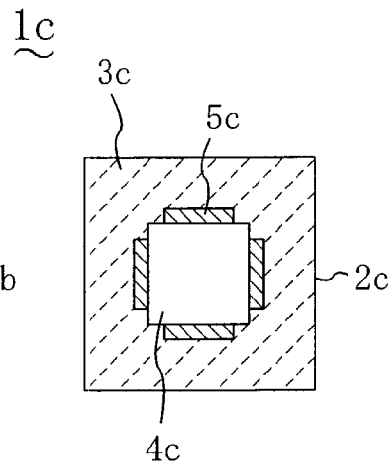

The outline enhancement mask 1c shown in FIG. 8C is a photomask using a transparent substrate 2c and includes a semi-light-shielding portion 3c having a transmittance that allows a part of exposure light to be transmitted, an opening 4c surrounded by the semi-light-shielding portion 3c and corresponding to an isolated contact pattern, and a phase shifter 5c constituted by four rectangular phase shifter portions that have a side having a length smaller than each side of the opening 4c and are in contact with the respective sides of the opening 4c. The center of each phase shifter portion of the phase shifter 5c is aligned with the center of the respective side of the opening 4c. In this outline enhancement mask 1c, the size of the resist pattern to be formed after exposure can be adjusted by changing the length of each phase shifter portion of the phase shifter 5c with the width (size) of the opening 4c unchanged. For example, as the length of each phase shifter portion of the phase shifter 5c is smaller, the size of the resist pattern becomes larger. In this case, the lower limit within which the length of each phase shifter portion of the phase shifter 5c can be changed without losing the function of outline enhancement is limited to about a half of the wavelength of the light source (exposure light). On the other hand, since the pattern size is changed only to an extent of about a half of the change amount of the mask size, adjusting the length of the phase shifter portion is an excellent approach to adjust the pattern size.

Figure 8D:
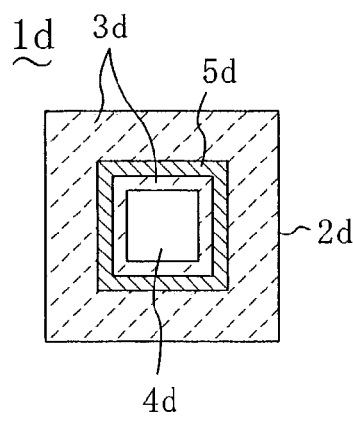

The outline enhancement mask 1d shown in FIG. 8D is a photomask using a transparent substrate 2d and includes a semi-light-shielding portion 3d having a transmittance that allows a part of exposure light to be transmitted, an opening 4d surrounded by the semi-light-shielding portion 3d and corresponding to an isolated contact pattern, and a ring-shaped phase shifter 5d positioned apart from the boundary of the semi-light-shielding portion 3d and the opening 4d by a predetermined distance on the side of the semi-light-shielding portion 3d. That is to say, a ring-shaped semi-light-shielding portion 3d is present between the phase shifter 5d and the opening 4d.

Figure 8E:
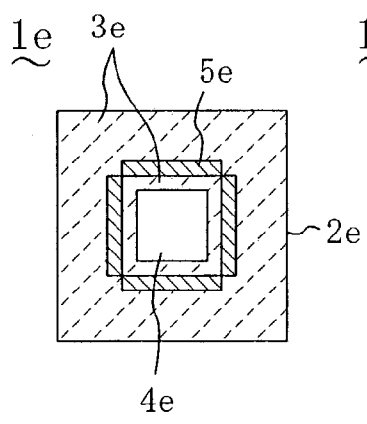

The outline enhancement mask 1e shown in FIG. 8E is a photomask using a transparent substrate 2c and includes a semi-light-shielding portion 3c having a transmittance that allows a part of exposure light to be transmitted, an opening 4e surrounded by the semi-light-shielding portion 3e and corresponding to an isolated contact pattern, and a phase shifter 5e positioned apart from the boundary of the semi-light-shielding portion 3c and the opening 4e by a predetermined distance on the side of the semi-light-shielding portion 3e. The phase shifter 5e is constituted by four phase shifter portions, each of which is a rectangular shape having a length larger than each side of the opening 4e and whose corner is in contact with the corners of the adjacent portions on the diagonal line of the opening 4e. In this case, a ring-shaped semi-light-shielding portion 3e is present between the phase shifter 5e and the opening 4e. In this outline enhancement mask 1e, the size of the resist pattern to be formed after exposure can be adjusted by changing only the width (size) of the opening 4e with the size and the arrangement of the phase shifter 5e with unchanged. For example, as the width of the opening 4e is increased, the size of the resist pattern is increased. According to this approach of adjusting the pattern size by changing only the width of the opening, MEEF (Mask Error Enhancement Factor: the ratio of the change amount of the pattern size with respect to the change amount of the mask size) is reduced to about a half of that obtained by an approach of scaling both the opening and the phase shifter at the same time to adjust the pattern size.

Figure 8F:
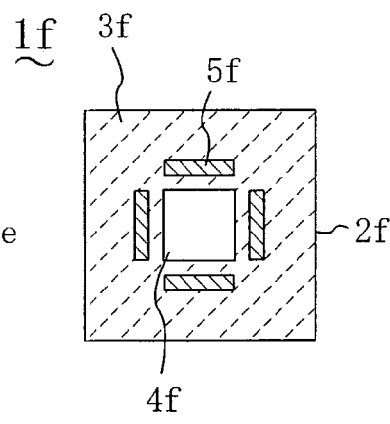

The outline enhancement mask 1f shown in FIG. 8F is a photomask using a transparent substrate 2f and includes a semi-light-shielding portion 3f having a transmittance that allows a part of exposure light to be transmitted, an opening 4f surrounded by the semi-light-shielding portion 3f and corresponding to an isolated contact pattern, and a phase shifter 5f positioned apart from the boundary of the semi-light-shielding portion 3f and the opening 4f by a predetermined distance on the side of the semi-light-shielding portion 3f. The phase shifter 5f is constituted by four phase shifter portions, each of which is a rectangular shape having the same length as that of each side of the opening 4f and whose side is opposed to the corresponding side of the opening 4f. In this case, the length of each phase shifter portion of the phase shifter 5f may be larger or smaller than that of the side of the opening 4f. According to this outline enhancement mask 1f, the size of the resist pattern can be adjusted as in the case of the outline enhancement mask Ic shown in FIG. 8C.

In the outline enhancement masks shown in FIGS. 8D to 8F, in order to increase the effect of reducing the MEEF, it is preferable that the width of the semi-light-shielding portion between the opening and the phase shifter is about ⅕ of λ/NA (λ is the wavelength of the exposure light and NA is the numerical aperture). In order to obtain the effect of improving the DOF, it is preferable that the width of the semi-light-shielding portion is a size that allows an interference effect of light by the phase shifter to be provided, that is, about 1/10 of λ/NA or less. In the outline enhancement masks shown in FIGS. 8A to 8F, a square is used as the shape of the opening. However, a polygon such as an octagon or a circle, or other shapes can be used. The shape of the phase shifter is not limited to a continuous ring shape or a plurality of rectangles. For example, the phase shifter can be formed by aligning a plurality of square phase shifter portions.

All the above description has been based on the positive resist process in which the portion corresponding to a resist-removed portion in the outline enhancement mask is defined as the opening. However, if a phase shifter having a sufficiently high transmittance can be used, in the outline enhancement mask used for the above description, the portion defined as the opening can be replaced by a phase shifter having a high transmittance, the portion defined as the phase shifter can be replaced by an opening, and the portion defined as the semi-light-shielding portion can be replaced by a phase shifter having a low transmittance (e.g., a phase shifter of a half-tone phase-shifting mask). In this case, the relationship of the relative phase difference between the elements is the same as in the above-described case, so that an outline enhancement mask having the same effect can be realized.

FIRST EMBODIMENT

Hereinafter, a photomask according to a first embodiment of the present invention, a method for producing the photomask and a method for forming a pattern using the photomask will be described with reference to the accompanying drawings. The photomask of the first embodiment is a photomask of a reduction projection exposure system to realize the above-described outline enhancement method.

Figure 9A:
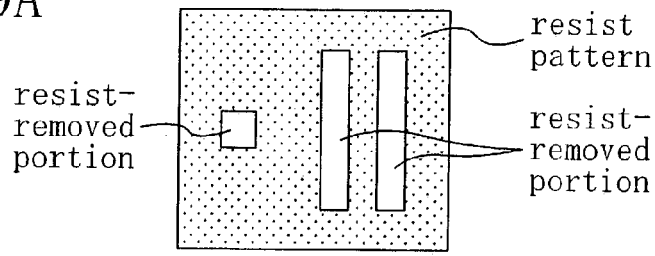
FIG. 9A shows a view showing an example of a desired pattern to be formed with a photomask of a first embodiment of the present invention.

FIG. 9A shows an example of a desired pattern to be formed with the photomask of the first embodiment.

When the reduction ratio of a reduction projection optical system of an exposure apparatus is M, in a regular photomask, a pattern having a size M times the size of a desired pattern (in general, having a designed value on a wafer) is drawn on a substrate (transparent substrate) formed of a material having a high transmittance with respect to exposure light, using a material, such as chromium film serving as a complete light-shielding portion with respect to the exposure light. However, in this specification, for simplification, the present invention is described, using the size on a wafer rather than using the size on the mask, which is a size M times the size on a wafer, unless otherwise specified. In this embodiment, when describing pattern formation, the description is based on the positive resist process, unless otherwise specified. That is to say, the description is based on the assumption that an exposed portion of the resist film is removed. On the other hand, when a negative resist process is assumed to be used, the description is totally the same as in the case of the positive resist process, except that the exposed portion of the resist film becomes a resist pattern. In this embodiment, the transmittance is expressed by an effective transmittance when the transmittance of the transparent substrate is taken as 100%, unless otherwise specified.

Figure 9B:
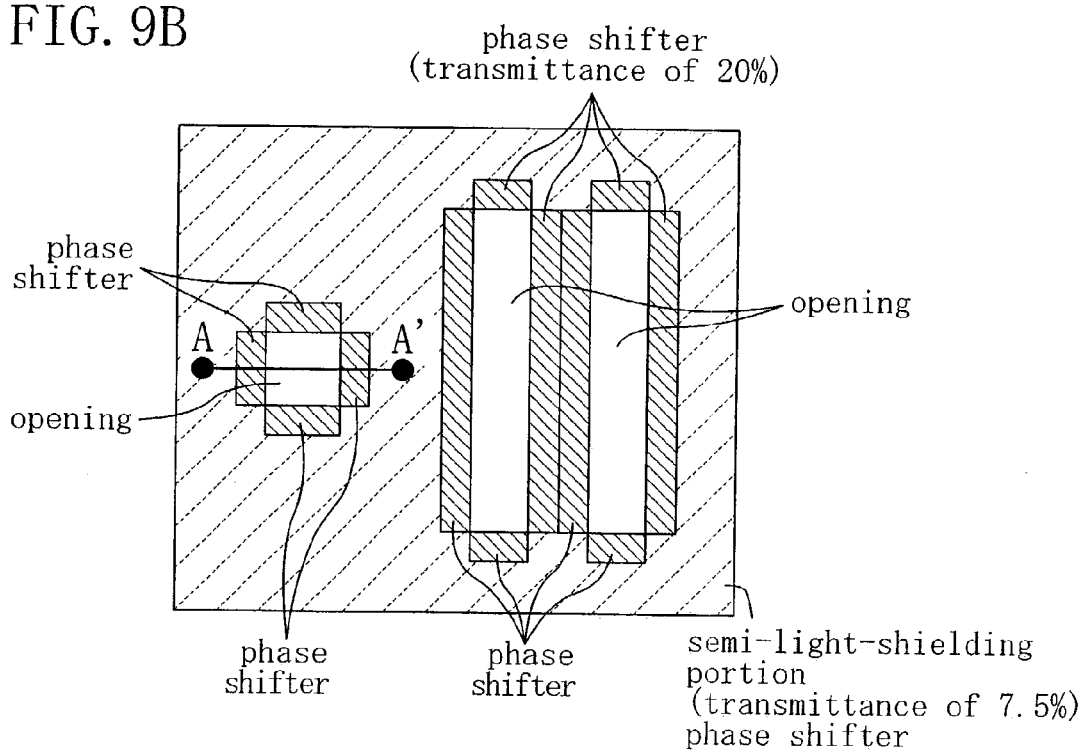
FIG. 9B is a plan view of the photomask of the first embodiment of the present invention.

FIG. 9B is a plan view of the photomask of the first embodiment, more specifically, a photomask for forming the desired pattern shown in FIG. 9A. As shown in FIG. 9B, openings (light-transmitting portions) are provided so as to correspond to resist-removed portions in the desired pattern. Furthermore, a semi-light-shielding portion having a low transmittance (about 6 to 15%) that does not allow the resist film to be exposed and transmits exposure light in the same phase as that of the opening is used as the light-shielding mask pattern surrounding the opening, instead of the complete light-shielding portion that completely shields exposure light. In the first embodiment, the transmittance of the semi-light-shielding portion is set to, for example, 7.5%. Phase shifters (peripheral portions) that transmit exposure light in a phase opposite to that of the opening are provided in the periphery of the openings. In this embodiment, the transmittance of the phase shifters is set to a higher value than that of the semi-light-shielding portion, for example, 20% so that the light transmitted through the phase shifter can cancel the lights transmitted through the openings and the semi-light-shielding portions effectively, according to the principle of the outline enhancement method.

In the first embodiment, for example, as shown in FIG. 8B, the phase shifters are arranged in such a manner that the sides of the phase shifters are in contact with the corresponding sides of the rectangular opening in a region having a predetermine size or less from each side of the rectangular opening.

Figure 9C:
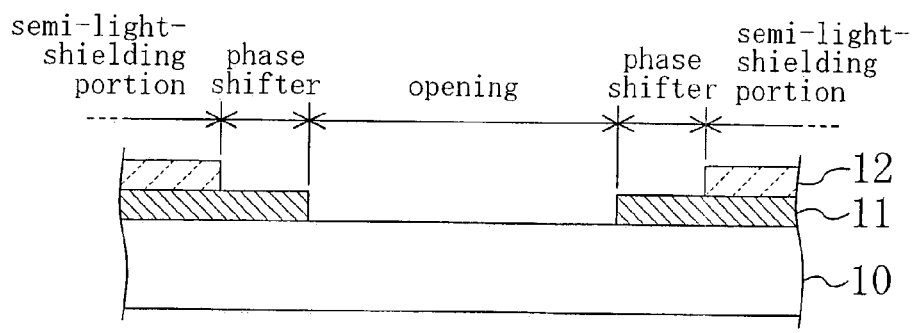
FIG. 9C is a cross-sectional view taken along line AA' in FIG. 9B.

FIG. 9C is a cross-sectional view taken along line AA' in FIG. 9B, that is a cross-sectional view of the photomask of the first embodiment. As shown in FIG. 9C, the surface of the transparent substrate 10 in the opening (light-transmitting portion) formation region is exposed. A lower phase shift film 11 that transmits exposure light with a phase difference (opposite phase) of 180 degrees (more specifically (150+360×n) degrees or more and (210+360×n) degrees or less (where n is an integer)) between this film and the opening is formed on the transparent substrate 10 in the phase shifter (peripheral portion) formation region. The lower phase shift film 11 and an upper phase shift film 12 that transmits exposure light in a phase opposite to that of the opening are laminated sequentially on the transparent substrate 10 in the semi-light-shielding portion formation region. As the lower phase shift film 11 and the upper phase shift film 12, an oxide film such as ZrSiO, CrAlO, TaSiO, MoSiO or TiSiO can be used. However, it is preferable that the lower phase shift film 11 and the upper phase shift film 12 are formed of different oxide films each other. Here, the lower phase shift film 11 is a phase shift film having a transmittance of 20% as a single film. On the other hand, the structure in which the lower phase shift film 11 and the upper phase shift film 12 are laminated acts as a semi-light-shielding film that has a transmittance of 7.5% and causes a phase difference (the same phase) of 360 degrees (more specifically, (−30+360×n) degrees or more and (30+360×n) degrees or less, (where n=an integer)). In other words, the structure in which the lower phase shift film 11 and the upper phase shift film 12 are laminated acts as a half-tone film in which phase inversion does not occur. Furthermore, a peripheral portion, that is, a phase shifter having a single layered structure of the lower phase shift film 11 is formed between the semi-light-shielding portion and the opening. As described above, the photomask of this embodiment acts as an outline enhancement mask. However, as described above, in order to obtain contrast enhancement by the outline enhancement method, it is necessary to limit the width of the phase shifter to a predetermined size or less.

Figure 10A:
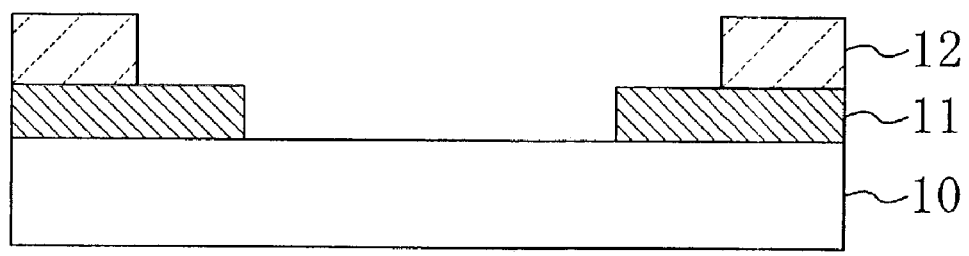
FIG. 10A is a cross-sectional view of the photomask of the first embodiment of the present invention in which each of a lower phase shifter and an upper phase shifter is a single layered film.
Figure 10B:
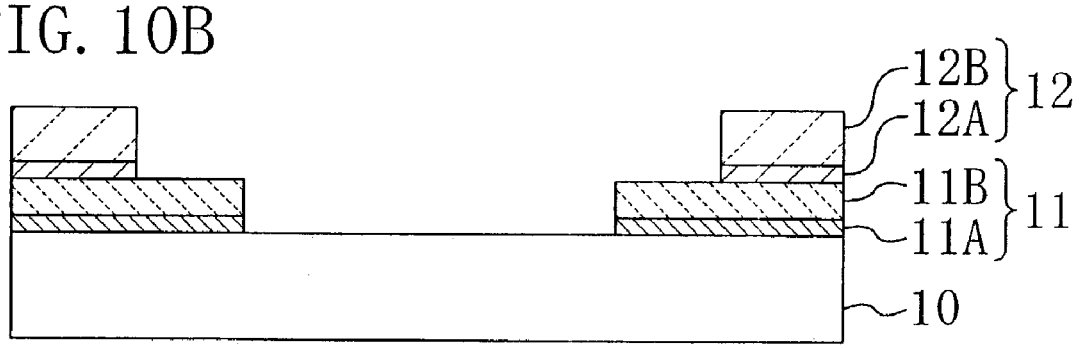
FIG. 10B is a cross-sectional view of the photomask of the first embodiment of the present invention in which each of a lower phase shifter and an upper phase shifter is a multilayered film of a transmittance adjusting film and a phase adjusting film.

In the above description, as shown in FIG. 10A, it is assumed that the lower phase shift film 11 and the upper phase shift film 12 are each a single layered film. In this case, the optical constant of each phase shift film is determined by its material, so that the thickness of each phase shift film is determined by the amount of the phase shift. On the other hand, the transmittance depends on not only the optical constant, but also the film thickness, so that for the material of the phase shift film, a material having an appropriate optical constant, more specifically, a material that can achieve exactly a predetermined transmittance with a thickness that can transmit exposure light in a phase opposite to that of the opening is not necessarily present. Therefore, in the first embodiment, as shown in FIG. 10B, it is preferable that the lower phase shift film 11 has a first transmittance adjusting film 11A and a first phase adjusting film 11B on the first transmittance adjusting film 11A, and the upper phase shift film 12 has a second transmittance adjusting film 12A and a second phase adjusting film 12B on the second transmittance adjusting film 12A in order to achieve an arbitrary transmittance in each phase shift film. The first transmittance adjusting film 11A and the second transmittance adjusting film 12A transmit exposure light in the same phase as that of the opening and have a relatively low transmittance with respect to exposure light. On the other hand, the first phase adjusting film 11B and the second phase adjusting film 12B transmit exposure light in a phase opposite to that of the opening and have a relatively high transmittance with respect to exposure light. As the first transmittance adjusting film 11A and the second transmittance adjusting film 12A, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. As the first phase adjusting film 11B and the second phase adjusting film 12B, an oxide film such as $SiO_2$ film can be used.

In FIG. 10B, an example in which both the lower phase shift film 11 and the upper phase shift film 12 have a two layered structure is illustrated, but one of the lower phase shift film 11 and the upper phase shift film 12 may have a two layered structure, and the other may have a single layered structure.

In this specification, a transmittance adjusting film refers to a film that has relatively a low transmittance per unit thickness with respect to exposure light and can set the transmittance with respect to exposure light to a desired value by adjusting the thickness without affecting the phase change with respect to the exposure light. A phase adjusting film refers to a film that has relatively a high transmittance per unit thickness with respect to exposure light and can set the phase difference with respect to exposure light between this film and the transparent substrate (opening) to a desired value by adjusting the thickness without affecting the transmittance change with respect to the exposure light.

Figure 11A:
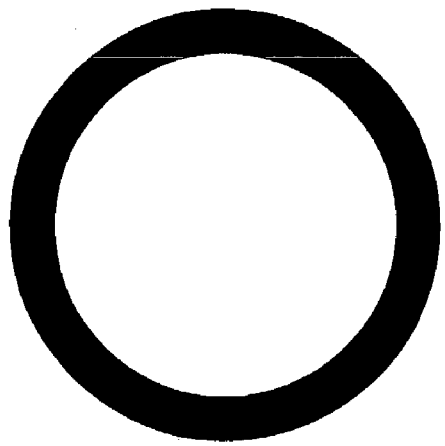
FIG. 11A is a view showing the shape of a regular exposure light source.
Figure 11B:
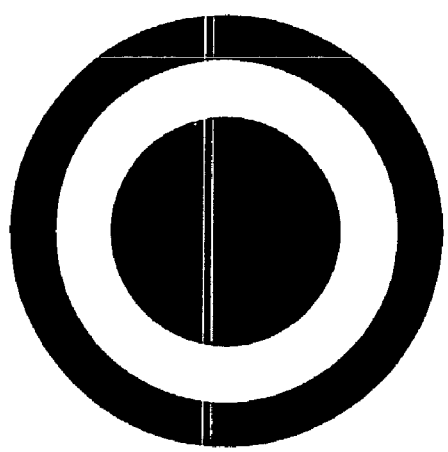
FIG. 11B is a view showing the shape of an annular exposure light source.
Figure 11C:
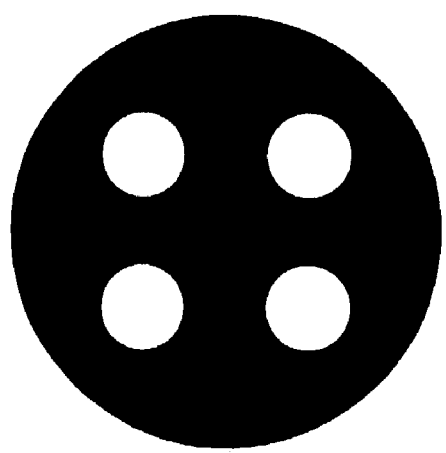
FIG. 11C is a view showing the shape of a quadrupole exposure light source.
Figure 11D:
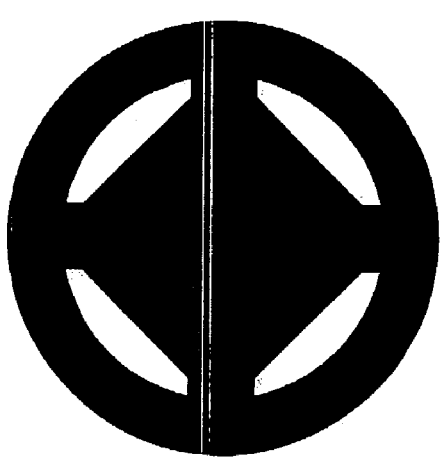
FIG. 11D is a view showing the shape of an annular-quadrupole mixed type exposure light source.

Next, a method for forming a pattern using the photomask of the first embodiment will be described. As described with reference to the principle of the outline enhancement method when transferring a mask pattern in a reduced size with an exposure apparatus, it is preferable to use an oblique incident exposure light source in order to form an image having a high contrast with the outline enhancement mask. Herein, "oblique incident exposure" refers to light sources shown in FIGS. 11B to 11D in which vertical incident components are removed, as opposed to a regular exposure light source as shown in FIG. 11A. Representative oblique incident exposure light sources are an annular exposure light source shown in FIG. 11B and a quadrupole exposure light source shown in FIG. 11C. Although it depends slightly on a desired pattern, in general, quadrupole exposure light sources are more advantageous in enhancement of the contrast and enlargement of the DOF than annular exposure light sources. However, quadrupole exposure light sources have such side effects that a pattern shape is distorted from the mask shape, so that in such a case, it is preferable to use an annular-quadrupole mixed type exposure light source as shown in FIG. 11D. The annular-quadrupole mixed type exposure light source is characterized by having a feature of a quadrupole light source that the center of the light source and the light sources on the XY axis are removed when assuming the XY coordinate with the center of the light source (center of a regular exposure light source) as the origin, and having a feature of an annular light source that a circle is used as the contour of the light source.

FIGS. 12A to 12D are cross-sectional views showing the processes of a method forming patterns with the photomask of the first embodiment.

Figure 12A:
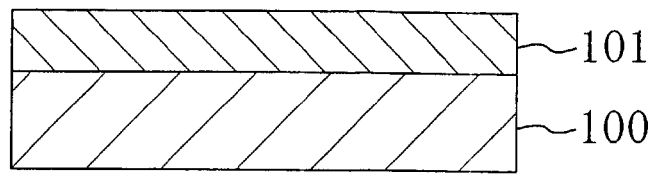
FIGS. 12A to 12D are cross-sectional views showing the processes of a method forming a pattern with the photomask of the first embodiment of the present invention.
Figure 12B:
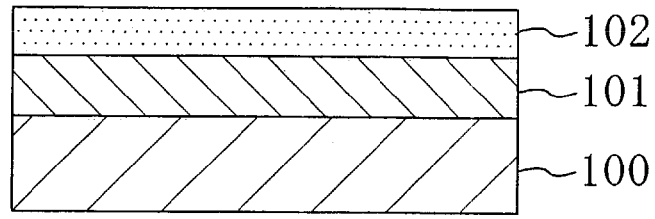

First, as shown in FIG. 12A, after a film 101 to be processed such as a metal film or an insulating film is formed on a substrate 100, as shown in FIG. 12B, a positive resist film 102 is formed on the film 101 to be processed.

Figure 12C:
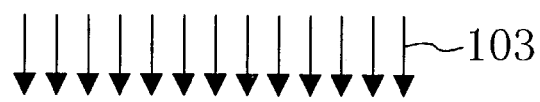

Next, as shown in FIG. 12C, the photomask of the first embodiment including a semi-light-shielding portion made of a multilayered structure of the lower phase shift film 11 and the upper phase shift film 12 and a phase shifter made of a single layered structure of the lower phase shift film 11 is irradiated with exposure light 103 with an oblique incident exposure light source to expose the resist film 102 with transmitted light 104 transmitted through the photomask. In this case, a semi-light-shielding portion having a low transmittance is used as the mask pattern, so that the entire resist film 102 is exposed with weak energy. However, as shown in FIG. 12C, only a latent image portion 102a of the resist film 102 corresponding to the light-transmitting portion (opening) in the photomask is irradiated with the exposure energy that is sufficient to dissolve the resist film 102 in a developing process.

Figure 12D:
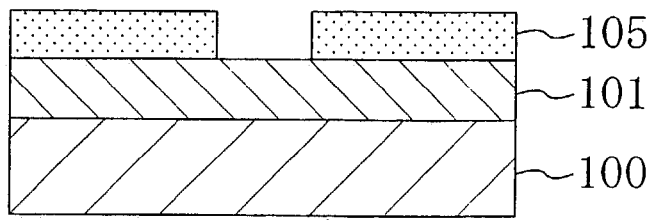

Next, the latent image portion 102a is removed by performing development with respect to the resist film 102, so that as shown in FIG. 12D, a resist pattern 105 is formed. In this case, in the exposure process shown in FIG. 12C, light in the periphery of the opening is canceled, so that a portion corresponding to the phase shifter (peripheral portion) in the resist film 102 is substantially not irradiated with exposure energy. Therefore, the contrast in the light intensity distribution between the light transmitted through the opening and the light transmitted through the peripheral portion, in other words, the contrast in the light intensity distribution between the light with which the latent image portion 102a is irradiated and the light with which the periphery of the latent portion 102a is irradiated can be enhanced. Therefore, the energy distribution in the latent portion 102a is changed sharply, so that a resist pattern 105 having a sharp shape can be formed.

Next, a method for producing a photomask of the first embodiment will be described with reference to the drawings.

Figure 13A:
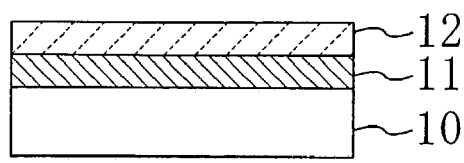
FIGS. 13A to 13E are cross-sectional views showing the processes of a method producing the photomask of the first embodiment of the present invention.
Figure 13B:
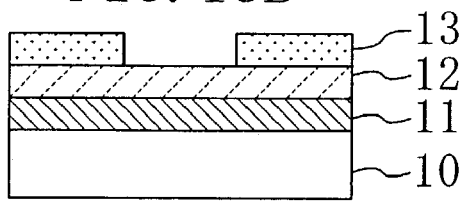
Figure 13C:
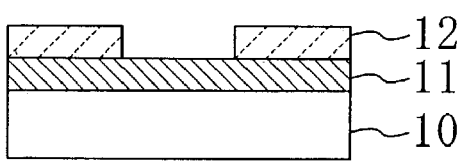

FIGS. 13A to 13E are cross-sectional views showing the processes of a method producing the photomask of the first embodiment. FIG. 13F is a plan view corresponding to the cross-sectional view of FIG. 13C, and FIG. 13G is a plan view corresponding to the cross-sectional view of FIG. 13E.

First, as shown in FIG. 13A, a lower phase shift film 11 made of, for example, TaSiO and an upper phase shift film 12 made of, for example, MoSiO are formed sequentially on a transparent substrate 10 made of a material having light-transmitting properties with respect to exposure light, such as quartz. As the lower phase shift film 11 and the upper phase shift film 12, an oxide film such as ZrSiO, CrAlO, TaSiO, MoSiO or TiSiO can be used. However, it is preferable that the lower phase shift film 11 and the upper phase shift film 12 are made of different oxides each other so that the upper phase shift film 12 can be removed selectively from the lower phase shift film 11. Furthermore, the lower phase shift film 11 and the upper phase shift film 12 each generate a phase difference of (150+360×n) degrees or more and (210+360×n) degrees or less (where n an integer) with respect to exposure light between these films and the light-transmitting portion (opening) in the transparent substrate 10. In this embodiment, at least one of the lower phase shift film 11 and the upper phase shift film 12 may have a two layered structure of a transmittance adjusting film and a phase adjusting film as described above.

Next, as shown in FIG. 13B, a first resist pattern 13 that covers the semi-light-shielding portion formation region is formed on the transparent substrate 10. That is, a first resist pattern 13 having a removed portion in each of the opening (light-transmitting portion) formation region and the phase shifter (peripheral portion) formation region is formed on the transparent substrate 10. Thereafter, the upper phase shift film 12 is etched with the first resist pattern 13 as a mask to pattern the upper phase shift film 12. Then, the first resist pattern 13 is removed. Thus, as shown in FIGS. 13C and 13F, the portions corresponding to the opening formation region and the phase shifter formation region in the upper phase shift film 12 are removed.

Figure 13D:
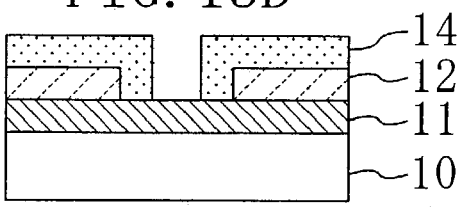
Figure 13E:
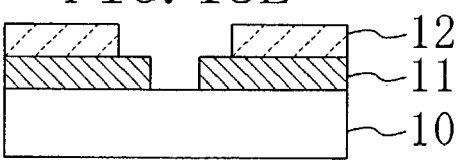
Figure 13F:
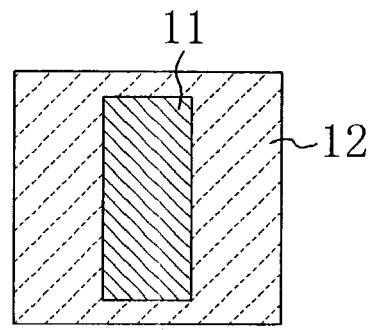
FIG. 13F is a plan view corresponding to the cross-sectional view of FIG. 13C.
Figure 13G:
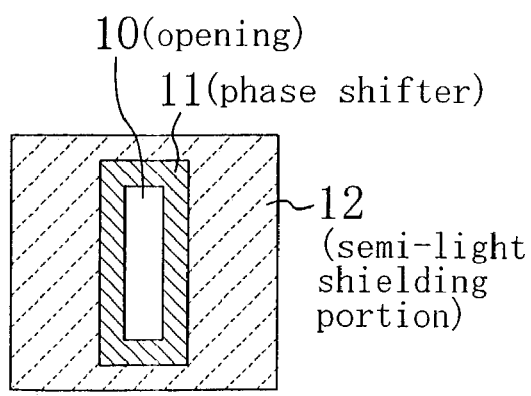
FIG. 13G is a plan view corresponding to the cross-sectional view of FIG. 13E.

Next, as shown in FIG. 13D, a second resist pattern 14 that covers the semi-light-shielding portion formation region and the phase shifter formation region is formed on the transparent substrate 10. That is, a second resist pattern 14 having a removed portion in the opening formation region is formed. Thereafter, the lower phase shift film 11 is etched with the second resist pattern 14 as a mask to pattern the lower phase shift film 11. Then, the second resist pattern 14 is removed. Thus, as shown in FIGS. 13E and 13G, the portion corresponding to the opening formation region in the lower phase shift film 11 is removed, and thus the photomask of the first embodiment is completed. That is to say, the photomask of the first embodiment having the plane structure of the outline enhancement mask can be easily formed by, as a mask blank, preparing a transparent substrate in which two half-tone phase shift films are deposited, and then performing selective etching with respect to the lower and upper phase shift films sequentially.

As described above, according to the first embodiment, the lower phase shift film 11 and the upper phase shift film 12 that transmit exposure light with a phase inversion are formed sequentially on the transparent substrate 10. Then, the portions of upper phase shift film 12 in the opening (light-transmitting portion) formation region and the phase shifter (peripheral portion) formation region is removed. Thereafter, the portion of the lower phase shift film 11 in the opening formation region is removed. That is to say, the opening is made of the exposed portion of the transparent substrate 10, and the semi-light-shielding portion is made of a multilayered structure of the lower phase shift film 11 and the upper phase shift film 12. The phase shifter is made of a single layered structure of the lower phase shift film 11. The multilayered structure of the lower phase shift film 11 and the upper phase shift film 12 transmits exposure light in the same phase as that of the opening. Therefore, the phase shifter that transmits exposure light in the phase opposite to that of the opening is sandwiched by the opening and the semi-light-shielding portion that transmits exposure light in the same phase as that of the opening. As a result, the contrast in the light intensity distribution between the opening and the phase shifter can be enhanced by mutual interference between the light transmitted through the opening and the light transmitted through the phase shifter. This contrast enhancement effect also can be obtained when a fine isolated resist-removed portion (i.e., a fine isolated space pattern corresponding to the light-transmitting portion) is formed with oblique incident exposure, for example, in the positive resist process. That is to say, it is possible to miniaturize isolated space patterns and isolated line patterns or dense patterns at the same time with oblique incident exposure.

According to the first embodiment, the lower phase shift film 11 and the upper phase shift film 12 that are laminated on the transparent substrate 10 are etched selectively, so that a mask pattern with any shape that has the semi-light-shielding portion and the phase shifter (peripheral portion) can be easily realized.

According to the first embodiment, a phase shifter with any shape can be formed by processing the upper phase shift film 12 of the multilayered structure of the lower phase shift film 11 and the upper phase shift film 12 constituting the semi-light-shielding portion. For this reason, as the pattern layout of the outline enhancement mask, not only the type shown in FIGS. 9B and 9C, that is, the type shown in FIG. 8B, but also all the types shown in FIGS. 8A to 8F, for example, can be realized.

According to the first embodiment, the transmittance of the phase shifter can be defined by the single layered structure of the lower phase shift film 11, and the transmittance of the semi-light-shielding portion can be defined by the multilayered structure of the lower phase shift film 11 and the upper phase shift film 12, so that a combination of the transmittances of the phase shifter and the semi-light-shielding portion can be set arbitrarily.

In the first embodiment, it is preferable that the transmittance of the semi-light-shielding portion (multilayered structure of the lower phase shift film 11 and the upper phase shift film 12) is 6% or more and 15% or less. Thus, the contrast enhancement effect can be obtained reliably while preventing a reduction in thickness of the resist film in pattern formation.

In the first embodiment, the description is based on the use of the positive resist process, but the negative resist process can be used, instead of the positive resist process. In this case, in either one of the processes, as the exposure light source, the i line (wavelength 365 nm), KrF excimer laser light (wavelength 248 nm), ArF excimer laser light (wavelength 193 nm), or $F_2$ excimer laser light (wavelength 157 nm) can be used, for example.

First Variation of the First Embodiment

Hereinafter, a photomask of a first variation of the first embodiment and a method for producing the photomask will be described with reference to the accompanying drawings.

The first variation of the first embodiment is different from the first embodiment in the following aspects. In the first embodiment, the outline enhancement mask having a layout in which the phase shifter (peripheral portion) and the opening (light-transmitting portion) are adjacent as shown, for example, in FIGS. 8A to 8C is described. In the first variation of the first embodiment, the outline enhancement mask having a layout in which the phase shifter and the opening are apart as shown, for example, in FIGS. 8D to 8F is described.

Figure 14A:
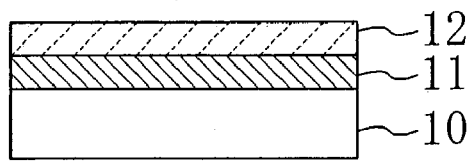
FIGS. 14A to 14E are cross-sectional views showing the processes of a method producing the photomask of a first variation of the first embodiment of the present invention.
Figure 14B:
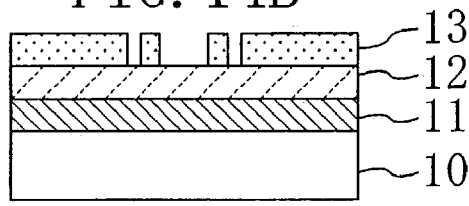
Figure 14C:
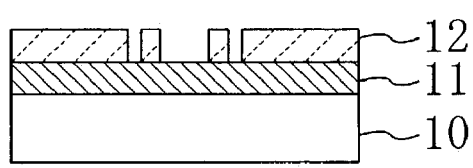

FIGS. 14A to 14E are cross-sectional views showing the processes of a method producing a photomask of the first variation of the first embodiment. FIG. 14F is a plan view corresponding to the cross-sectional view of FIG. 14C, and FIG. 14G is a plan view corresponding to the cross-sectional view of FIG. 14E.

First, as shown in FIG. 14A, a lower phase shift film 11 and an upper phase shift film 12 are formed sequentially on a transparent substrate 10 made of a material having light-transmitting properties with respect to exposure light, such as quartz. The lower phase shift film 11 and the upper phase shift film 12 generate a phase difference (opposite phase) of (150+360×n) degrees or more and (210+360×n) degrees or less (where n=an integer) with respect to exposure light between these films and the light-transmitting portion (opening) in the transparent substrate 10. In this variation, at least one of the lower phase shift film 11 and the upper phase shift film 12 may have a two layered structure of a transmittance adjusting film and a phase adjusting film (see the first embodiment).

Next, as shown in FIG. 14B, a first resist pattern 13 that covers a semi-light-shielding portion formation region is formed on the transparent substrate 10. That is, a first resist pattern 13 having a removed portion in each of an opening (light-transmitting portion) formation region and a phase shifter (peripheral portion) formation region is formed on the transparent substrate 10. In this variation, the opening formation region and the phase shifter formation region are apart. In other words, the first resist pattern 13 is interposed between the opening formation region and the phase shifter formation region. Thereafter, the upper phase shift film 12 is etched with the first resist pattern 13 as a mask to pattern the upper phase shift film 12. Then, the first resist pattern 13 is removed. Thus, as shown in FIGS. 14C and 14F, the portions corresponding to the opening formation region and the phase shifter formation region in the upper phase shift film 12 are removed.

Figure 14D:
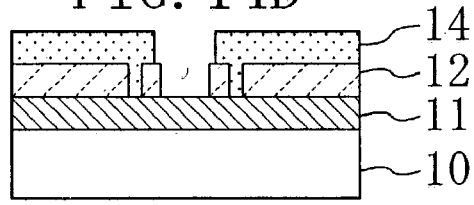
Figure 14E:
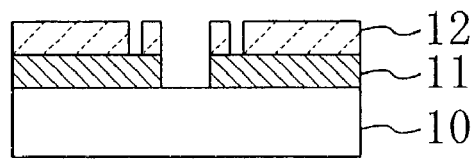
Figure 14F:
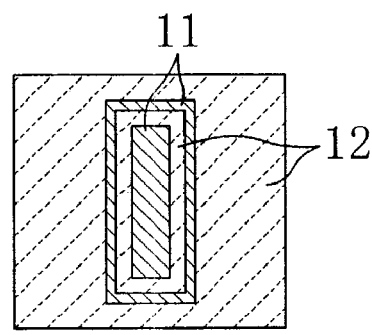
FIG. 14F is a plan view corresponding to the cross-sectional view of FIG. 14C.
Figure 14G:
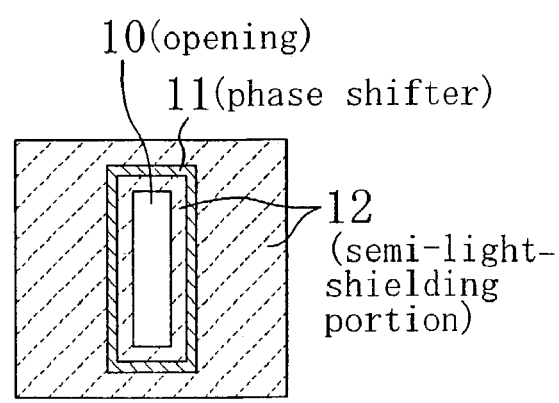
FIG. 14G is a plan view corresponding to the cross-sectional view of FIG. 14E.

Next, as shown in FIG. 14D, a second resist pattern 14 that covers the semi-light-shielding portion formation region including the phase shifter formation region and that has a removed portion in the opening formation region is formed on the transparent substrate 10. Thereafter, the lower phase shift film 11 is etched with the second resist pattern 14 and the patterned upper phase shift film 12 as masks to pattern the lower phase shift film 11. Then, the second resist pattern 14 is removed. Thus, as shown in FIGS. 14E and 14G, the portion corresponding to the opening formation region in the lower phase shift film 11 is removed, and thus the photomask of the first variation of the first embodiment is completed.

According to the first variation of the first embodiment, the following advantages can be obtained, in addition to those of the first embodiment. Since the patterned upper phase shift film 12 is used as a mask for etching the lower phase shift film 11 in a self-alignment manner, photomask process can be performed precisely.

Second Variation of the First Embodiment

Hereinafter, a photomask of a second variation of the first embodiment and a method for producing the photomask will be described with reference to the accompanying drawings.

The second variation of the first embodiment is different from the first embodiment in the following aspects. In the first embodiment, the outline enhancement mask having a layout in which the phase shifter (peripheral portion) and the opening (light-transmitting portion) are adjacent as shown, for example, in FIGS. 8A to 8C is described. In the second variation of the first embodiment as well as the first variation of the first embodiment, the outline enhancement mask having a layout in which the phase shifter and the opening are apart as shown, for example, in FIGS. 8D to 8F is described.

Figure 15A:
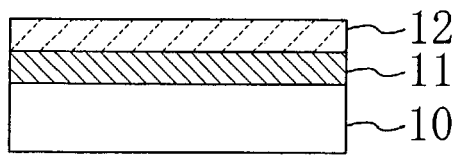
FIGS. 15A to 15E are cross-sectional views showing the processes of a method producing the photomask of a second variation of the first embodiment of the present invention.
Figure 15B:
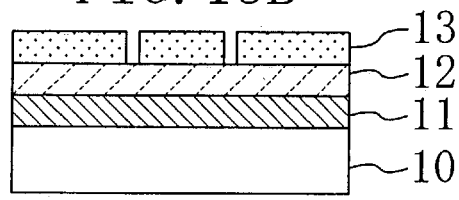
Figure 15C:
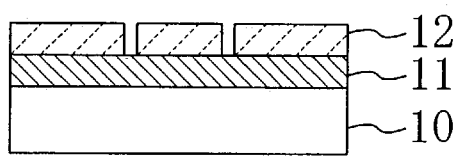
Figure 15F:
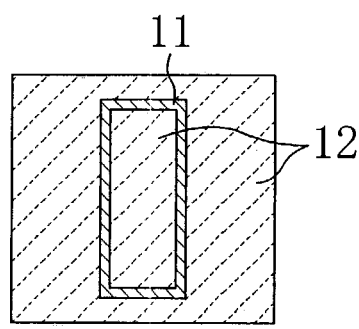
FIG. 15F is a plan view corresponding to the cross-sectional view of FIG. 15C.

FIGS. 15A to 15E are cross-sectional views showing the processes of a method producing a photomask of the second variation of the first embodiment. FIG. 15F is a plan view corresponding to the cross-sectional view of FIG. 15C, and FIG. 15G is a plan view corresponding to the cross-sectional view of FIG. 15E.

First, as shown in FIG. 15A, a lower phase shift film 11 and an upper phase shift film 12 are formed sequentially on a transparent substrate 10 made of a material having light-transmitting properties with respect to exposure light, such as quartz. The lower phase shift film 11 and the upper phase shift film 12 generate a phase difference (opposite phase) of (150+360×n) degrees or more and (210+360×n) degrees or less (where n=an integer) with respect to exposure light between these films and the light-transmitting portion (opening) in the transparent substrate 10. In this variation, at least one of the lower phase shift film 11 and the upper phase shift film 12 may have a two layered structure of a transmittance adjusting film and a phase adjusting film (see the first embodiment).

Next, as shown in FIG. 15B, a first resist pattern 13 that covers a semi-light-shielding portion formation region and an opening (light-transmitting portion) formation region is formed on the transparent substrate 10. That is, a first resist pattern 13 having a removed portion in a phase shifter (peripheral portion) formation region is formed on the transparent substrate 10. Thereafter, the upper phase shift film 12 is etched with the first resist pattern 13 as a mask to pattern the upper phase shift film 12. Then, the first resist pattern 13 is removed. Thus, as shown in FIGS. 15C and 15F, the portion corresponding to the phase shifter formation region in the upper phase shift film 12 is removed.

Figure 15D:
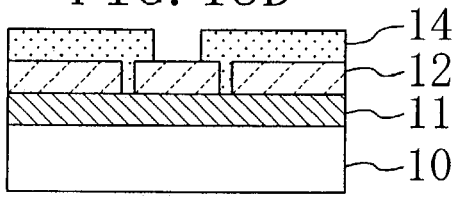
Figure 15E:
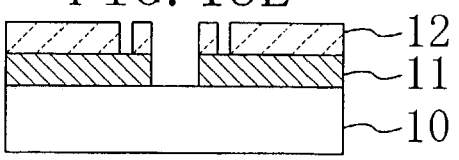
Figure 15G:
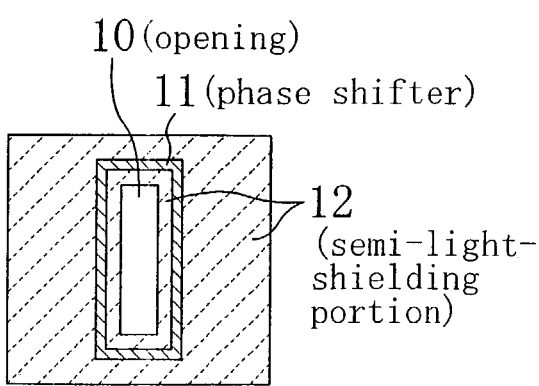
FIG. 15G is a plan view corresponding to the cross-sectional view of FIG. 15E.

Next, as shown in FIG. 15D, a second resist pattern 14 that covers the semi-light-shielding portion formation region and the phase shifter formation region is formed on the transparent substrate 10. That is to say, a second resist pattern 14 that has a removed portion in the opening formation region is formed on the transparent substrate 10. Thereafter, the upper phase shift film 12 and the lower phase shift film 11 are etched sequentially with the second resist pattern 14 as a mask to pattern each phase shift film. Then, the second resist pattern 14 is removed. Thus, as shown in FIGS. 15E and 15G, the portions corresponding to the opening formation region in the lower phase shift film 11 and the upper phase shift film 12 are removed, and thus the photomask of the second variation of the first embodiment is completed.

According to the second variation of the first embodiment, the following advantages can be obtained, in addition to those of the first embodiment. In this variation, the process of removing the portion corresponding to the phase shifter formation region in the upper phase shift film 12 (see FIG. 15C) and the process of removing the portion corresponding to the opening formation region in the upper phase shift film 12 (see FIG. 15E) are performed separately. Therefore, if the opening is apart from the phase shifter with a small distance, in other words, if a semi-light-shielding portion having a small width made of a multilayered structure of the lower phase shift film 11 and the upper phase shift film 12 is present between the opening and the phase shifter, the margin for photomask process is increased.

In the second variation of the first embodiment, before performing the process of removing the portion corresponding to the phase shifter formation region in the upper phase shift film 12, the process of removing the portions corresponding to the opening formation region in the lower phase shift film 11 and the upper phase shift film 12 may be performed.

SECOND EMBODIMENT

Hereinafter, a photomask according to a second embodiment of the present invention, a method for producing the photomask and a method for forming a pattern using the photomask will be described with reference to the accompanying drawings. The photomask of the second embodiment is a photomask of a reduction projection exposure system to realize the above-described outline enhancement method.

Figure 16A:
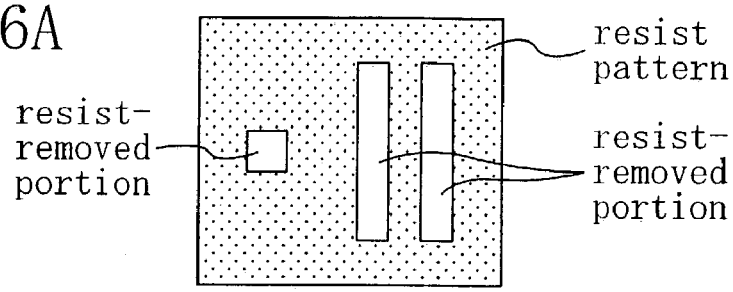
FIG. 16A is a view showing an example of a desired pattern to be formed with the photomask of a second embodiment of the present invention.

FIG. 16A shows an example of a desired pattern to be formed with the photomask of the second embodiment. In this embodiment as well as the first embodiment, the description is based on the assumption that the positive resist process is used. Furthermore, in this embodiment, the transmittance is expressed by an effective transmittance when the transmittance of the transparent substrate is taken as 100%, unless otherwise specified.

Figure 16B:
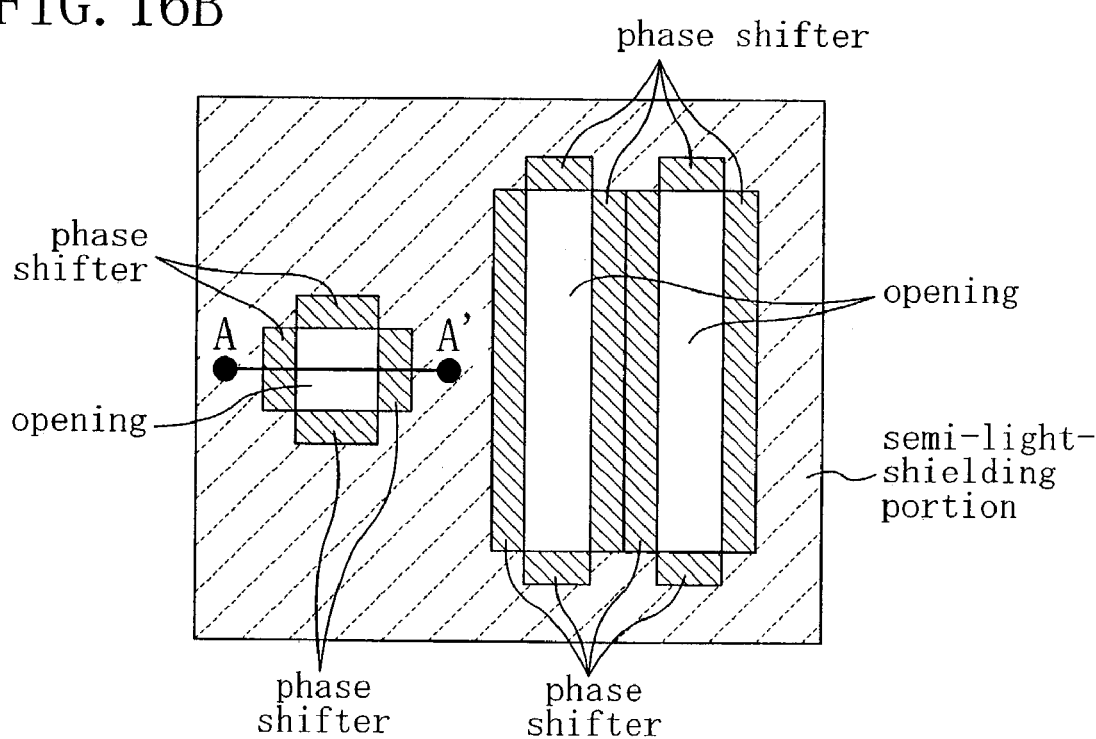
FIG. 16B is a plan view of the photomask of the second embodiment of the present invention.

FIG. 16B is a plan view of the photomask of the second embodiment, more specifically, a photomask for forming the desired pattern shown in FIG. 16A. As shown in FIG. 16B, openings (light-transmitting portions) are provided so as to correspond to resist-removed portions in the desired pattern. Furthermore, a semi-light-shielding portion having a low transmittance (about 6 to 15%) that does not allow the resist film to be exposed and transmits exposure light in the same phase as that of the opening is used as the light-shielding mask pattern surrounding the opening, instead of the complete light-shielding portion that completely shields exposure light. Furthermore, phase shifters (peripheral portions) that transmit exposure light in a phase opposite to that of the openings are provided in the periphery of the openings. In this embodiment, the transmittance of the phase shifter is set to a higher value than that of the semi-light-shielding portion so that the light transmitted through the phase shifters can cancel effectively the light transmitted through the openings and the semi-light-shielding portion, according to the principle of the outline enhancement method.

In the second embodiment, the phase shifters are arranged in such a manner that the sides of the phase shifters are in contact with the corresponding sides of the rectangular opening in a region having a predetermine size or less from each side of the rectangular opening, for example, as shown in FIG. 8B.

Figure 16C:
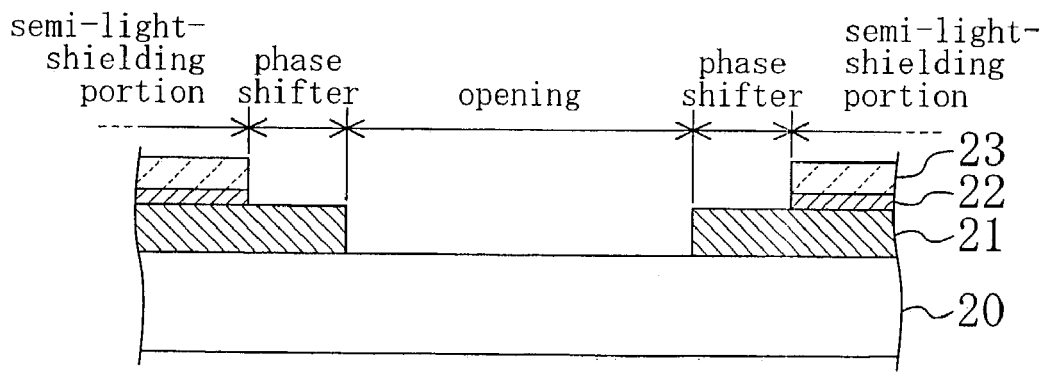
FIG. 16C is a cross-sectional view taken along line AA' of FIG. 16B.

FIG. 16C is a cross-sectional view taken along line AA' in FIG. 16B, that is a cross-sectional view of the photomask of the second embodiment. As shown in FIG. 16C, the surface of the transparent substrate 20 in the opening (light-transmitting portion) formation region is exposed. A lower phase adjusting film 21 is formed on the transparent substrate 20 in the phase shifter (peripheral portion) formation region. The lower phase adjusting film 21, a transmittance adjusting film 22 and an upper phase adjusting film 23 are formed sequentially on the transparent substrate 20 in the semi-light-shielding portion formation region. The lower phase adjusting film 21 and the upper phase adjusting film 23 constitute a phase shift film that transmits exposure light with a phase difference (opposite phase) of 180 degrees (more specifically (150+360×n) degrees or more and (210+360×n) degrees or less (where n is an integer)) between this film and the opening. The transmittance adjusting film 22 has a lower transmittance than those of the lower phase adjusting film 21 and the upper phase adjusting film 23. As the lower phase shift film 21 and the upper phase adjusting film 23, an oxide film such as $SiO_2$ film can be used. As the transmittance adjusting film 22, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. The lower phase adjusting film 21 is a phase shift film that has a very high transmittance as a single film and transmits exposure light in a phase opposite to that of the opening (transparent substrate 20). The transmittance of the transmittance adjusting film 22 is set such that the multilayered structure of the lower phase adjusting film 21, the transmittance adjusting film 22 and the upper phase adjusting film 23 has a predetermined transmittance (low transmittance that does not allow the resist film to be exposed) with respect to exposure light. Moreover, the multilayered structure of the lower phase adjusting film 21, the transmittance adjusting film 22 and the upper phase adjusting film 23 transmits exposure light in the same phase (more specifically, the phase difference of (−30+360×n) degrees or more and (30+360×n) degrees or less, (where n=an integer)) between this structure and the opening (transparent substrate 20). That is to say, the multilayered structure of the lower phase adjusting film 21, the transmittance adjusting film 22 and the upper phase adjusting film 23 constitute a semi-light-shielding portion that transmits exposure light in the same phase as that of the opening and has a predetermined transmittance with respect to exposure light. Thus, the peripheral portion, that is, a phase shifter, having a single layered structure of the lower phase adjusting film 21 is formed between the semi-light-shielding portion and the opening, and thus an outline enhancement mask is realized. However, in order to enhance the contrast by the outline enhancement method, it is necessary to limit the width of the phase shifter to a predetermined size.

A method for producing the photomask of the second embodiment is as follows. The lower phase adjusting film 21, the transmittance adjusting film 22 and the upper phase adjusting film 23 are formed sequentially on the transparent substrate 20 made of a material having light-transmitting properties with respect to exposure light (e.g., quartz). Thereafter, the upper phase adjusting film 23, the transmittance adjusting film 22 and the lower phase adjusting film 21 are selectively etched sequentially. More specifically, if the lower phase adjusting film 21 is regarded as a lower phase shift film and the transmittance adjusting film 22 and the upper phase adjusting film 23 are regarded as an upper phase shift film, the method for producing the photomask of the first embodiment shown in FIGS. 13 to 15 can be used as it is to produce the photomask of the second embodiment.

Next, a method for forming a pattern using the photomask of the second embodiment will be described. In this case, as described with reference to the principle of the outline enhancement method when transferring a mask pattern in a reduced size with an exposure apparatus, it is preferable to use an oblique incident exposure light source as shown in FIGS. 11B to 11D in order to form an image having a high contrast with the outline enhancement mask.

FIGS. 17A to 17D are cross-sectional views showing the processes of a method forming a pattern with the photomask of the second embodiment.

First, as shown in FIG. 17A, after a film 201 to be processed such as a metal film or an insulating film is formed on a substrate 200, as shown in FIG. 17B, a positive resist film 202 is formed on the film 201 to be processed.

Next, as shown in FIG. 17C, the photomask of the second embodiment including the semi-light-shielding portion made of the multilayered structure of the lower phase adjusting film 21, the transmittance adjusting film 22 and the upper phase adjusting film 23, and a phase shifter made of the single layered structure of the lower phase adjusting film 21 is irradiated with exposure light 203 with an oblique incident exposure light source to expose the resist film 202 with transmitted light 204 transmitted through the photomask. In this case, the semi-light-shielding portion having a low transmittance is used as the mask pattern, so that the entire resist film 202 is exposed with weak energy. However, as shown in FIG. 17C, only a latent image portion 202a of the resist film 202 corresponding to the light-transmitting portion (opening) in the photomask is irradiated with exposure energy that is sufficient to dissolve the resist film 202 in a developing process.

Next, the latent image portion 202a is removed by performing development with respect to the resist film 202, so that as shown in FIG. 17D, a resist pattern 205 is formed. In this case, in the exposure process shown in FIG. 17C, light in the periphery of the opening is canceled, so that a portion corresponding to the phase shifter (peripheral portion) in the resist film 202 is substantially not irradiated with exposure energy. Therefore, the contrast in the light intensity distribution between the light transmitted through the opening and the light transmitted through the peripheral portion, in other words, the contrast in the light intensity distribution between the light with which the latent image portion 202a is irradiated and the light with which the periphery of the latent portion 202a is irradiated can be enhanced. Therefore, the energy distribution in the latent portion 202a is changed sharply, so that a resist pattern 205 having a sharp shape can be formed.

As described above, according to the second embodiment, the phase shifter (peripheral portion) made of a single layered structure of the lower phase adjusting film 21 is sandwiched by the opening (light-transmitting portion) made of the exposed portion of the transparent substrate 20 and the semi-light-shielding portion made of a multilayered structure of the lower phase adjusting film 21, the transmittance adjusting film 22 and the upper phase adjusting film 23. In this case, the multilayered structure of the lower phase adjusting film 21, the transmittance adjusting film 22 and the upper phase adjusting film 23 transmit exposure light in the same phase as that of the opening, whereas the single layered structure of the lower phase adjusting film 21 transmits exposure light in a phase opposite to that of the opening. Therefore, the contrast in the light intensity distribution between the opening and the phase shifter can be enhanced by mutual interference between the light transmitted through the opening and the light transmitted through the phase shifter. This contrast enhancement effect also can be obtained when a fine isolated resist-removed portion (i.e., a fine isolated space pattern corresponding to the light-transmitting portion) is formed with oblique incident exposure (off-axis illumination), for example, in the positive resist process. That is to say, it is possible to miniaturize isolated space patterns and isolated line patterns or dense patterns at the same time with oblique incident exposure.

According to the second embodiment, the lower phase adjusting film 21, the transmittance adjusting film 22, the upper phase adjusting film 23 that are laminated on the transparent substrate 20 are etched selectively, so that a mask pattern with any shape that has the semi-light-shielding portion and the phase shifter (peripheral portion) can be easily produced.

According to the second embodiment, a phase shifter with any shape can be formed by processing the transmittance adjusting film 22 and the upper phase adjusting film 23 of the multilayered structure of the lower phase adjusting film 21, the transmittance adjusting film 22 and the upper phase adjusting film 23 constituting the semi-light-shielding portion. Therefore, as the layout of the outline enhancement mask, not only the type shown in FIGS. 16B and 16C, that is, the type shown in FIG. 8B, but also all the types shown in FIGS. 8A to 8F, for example, can be realized.

According to the second embodiment, the semi-light-shielding portion is formed by providing the transmittance adjusting film 22 having a lower transmittance than that of the phase adjusting films between the lower phase adjusting film 21 and the upper phase adjusting film 23. Therefore, the difference in the transmittance between the semi-light-shielding portion and the phase shifter (peripheral portion)

made of the single layered structure of the lower phase adjusting film 21 can be increased, so that the contrast in the light intensity distribution between the opening (light-transmitting portion) and the peripheral portion can be enhanced more significantly.

In the second embodiment, it is preferable that the transmittance of the semi-light-shielding portion of the photomask is 6% or more and 15% or less. Thus, the contrast enhancement effect can be obtained reliably while preventing a reduction in thickness of the resist film in pattern formation.

In the second embodiment, the description is based on the use of the positive resist process, but the negative resist process can be used, instead of the positive resist process. In this case, in either one of the processes, as the exposure light source, the i line (wavelength 365 nm), KrF excimer laser light (wavelength 248 nm), ArF excimer laser light (wavelength 193 nm), or $F_2$ excimer laser light (wavelength 157 nm) can be used, for example.

Figure 18A:
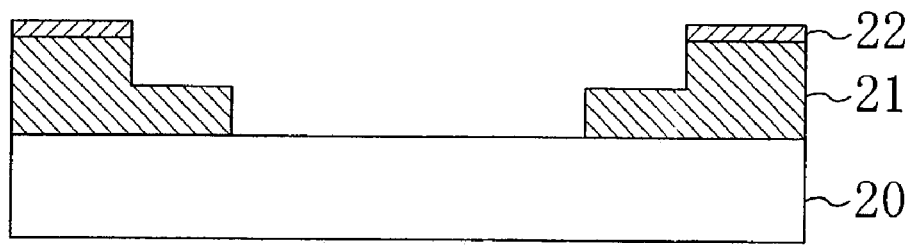
FIGS. 18A to 18D are views showing variations of the cross-sectional structure of the photomask of the second embodiment of the present invention.

In the second embodiment, for example, as shown in FIG. 16C, the multilayered structure of the lower phase adjusting film 21, the transmittance adjusting film 22 and the upper phase adjusting film 23 is used as the semi-light-shielding portion. However, instead of this, for example, as shown in FIG. 18A, even if a two layered structure of the phase adjusting film 21 as the lower layer and the transmittance adjusting film 22 as the upper layer is used, the photomask having the same effect can be realized. More specifically, in the structure shown in FIG. 18A, the phase adjusting film 21 and the transmittance adjusting film 22 formed only on the phase adjusting film 21 in the semi-light-shielding portion formation region constitute the semi-light-shielding film that transmits exposure light in the same phase as that of the opening. The transmittance adjusting film 22 has a relatively low transmittance with respect to exposure light, whereas the phase adjusting film 21 has a relatively high transmittance. Thus, the semi-light-shielding film made of the phase adjusting film 21 and the transmittance adjusting film 22 has a transmittance that allows exposure light to be transmitted partially. The transmittance adjusting film 22 transmits exposure light in the same phase as that of the opening, and the portion of the phase adjusting film 21 in the semi-light-shielding portion formation region transmits exposure light in the same phase as that of the opening. On the other hand, the portion of the phase adjusting film 21 in the phase shifter (peripheral portion) formation region is made thin so as to have a thickness that allows exposure light to be transmitted in the phase opposite to that of the opening. When comparing the structure shown in FIG. 16C and the structure shown in FIG. 18A, the structure shown in FIG. 16C is better than the structure shown in FIG. 18A in that the transmittance adjusting film 22 can be utilized as an etching stopper when etching the upper phase adjusting film 23 in mask processing. On the other hand, the structure shown in FIG. 18A is better than the structure shown in FIG. 16C in that the phase shifter can be formed by changing the thickness of the phase adjusting film 21 formed as a single film by etching, in other words, in that the photomask structure is simple. Furthermore, according to the structure shown in FIG. 18A, a combination of a desired phase difference and a desired transmittance can be selected arbitrarily for the semi-light-shielding film made of the phase adjusting film 21 and the transmittance adjusting film 22. Moreover, a combination of the material of the transmittance adjusting film 22 and the material of the phase adjusting film 21 makes it possible to improve the selection ratio at etching for processing the semi-light-shielding film.

Figure 18B:
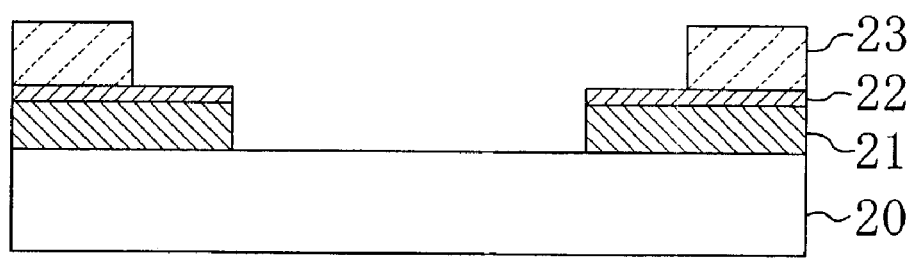

In the second embodiment, for example, as shown in FIG. 16C, the transmittance adjusting film 22 is not formed on the lower phase adjusting film 21 in the phase shifter formation region. However, instead of this, as shown in FIG. 18B, the transmittance adjusting film 22 may be formed on the lower phase adjusting film 21 in the phase shifter formation region. In other words, the phase shifter made of a single layered structure of the lower phase adjusting film 21 can be replaced by a phase shifter made of a multilayered structure of the lower phase adjusting film 21 and the transmittance adjusting film 22. In this case, the transmittance of the phase shifter and the transmittance of the semi-light-shielding portion are in the same level. When comparing the structure shown in FIG. 16C and the structure shown in FIG. 18B, the structure shown in FIG. 16C is better than the structure shown in FIG. 18B in that the transmittance of the semi-light-shielding portion is higher than that of the phase shifter, that is, in that the contrast enhancement effect by the outline enhancement method is improved. On the other hand, the structure shown in FIG. 18B is better than the structure shown in FIG. 16C in that the size of the phase shifter can be increased to the extent corresponding to how low the transmittance of the phase shifter is, that is, in that the mask processing is easy.

Figure 18C:

Furthermore, a photomask having the same effect can be realized, even if a two layered structure of the transmittance adjusting film 22 as the lower layer and the phase adjusting film 23 as the upper layer is used as the semi-light-shielding portion and the phase shifter, for example, as shown in FIG. 18C, instead of the structure shown in FIG. 18B. More specifically, in the structure shown in FIG. 18C, the transmittance adjusting film 22 and the phase adjusting film 23 in the semi-light-shielding portion formation region constitute a semi-light-shielding film that transmits exposure light in the same phase as that of the opening. Furthermore, the transmittance adjusting film 22 has a relatively low transmittance with respect to exposure light, whereas the phase adjusting film 23 has a relatively high transmittance with respect to exposure light. Thus, the semi-light-shielding film made of the transmittance adjusting film 22 and the phase adjusting film 23 has a transmittance that allows exposure light to be transmitted partially. The transmittance adjusting film 22 transmits exposure light in the same phase as that of the opening, and the portion of the phase adjusting film 23 in the semi-light-shielding portion formation region transmits exposure light in the same phase as that of the opening. On the other hand, the portion of the phase adjusting film 23 in the phase shifter (peripheral portion) formation region is made thin so as to have a thickness that allows exposure light to be transmitted in the phase opposite to that of the opening. When comparing the structure shown in FIG. 18B and the structure shown in FIG. 18C, the structure shown in FIG. 18C is better in that the photomask structure is simple. In addition, in the case where the phase adjusting film 23 is formed of a material that hardly can increase the etching selection ratio with respect to the transparent substrate 20 made of quartz or the like, the structure shown in FIG. 18C is better in that the transmittance adjusting film 22 can be utilized as an etching stopper for preventing etching of quartz when etching the phase adjusting film 23. Furthermore, according to the structure shown in FIG. 18C, a combination of a desired phase difference and a desired transmittance can be selected arbitrarily for the semi-light-shielding film made of the phase adjusting film 23 and the transmittance adjusting film 22. Moreover, a combination of the material of the transmittance adjusting film 22 and the material of the phase adjusting film 23 makes it possible to improve the selection ratio at etching for processing the semi-light-shielding film.

Figure 18D:
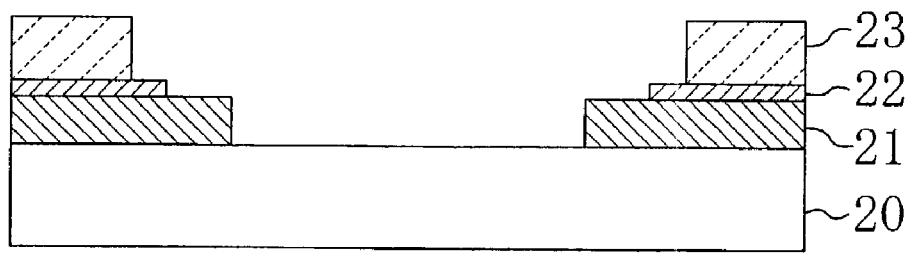

In the second embodiment, as seen from the comparison of the structure shown in FIG. 16C and the structure shown in FIG. 18B, phase shifters having different transmittances can be formed with the same multilayered structure in which the transmittance adjusting film 22 is present between the lower phase adjusting film 21 and the upper phase adjusting film 23 by changing the processing method of the transmittance adjusting film 22. In other words, when the structure in which the transmittance adjusting film is sandwiched by the two phase adjusting films is used, both the structure shown in FIG. 16C and the structure shown in FIG. 18B can be realized in the same photomask, so that the transmittance of the phase shifter (peripheral portion) can be changed depending on the pattern shape. Furthermore, for example, as shown in FIG. 18D, when the structure in which the transmittance adjusting film 22 is formed partially on the lower phase adjusting film 21 in the phase shifter formation region is used, the effective transmittance of the phase shifter can be adjusted finely by the area ratio of the phase shifter that is covered with the transmittance adjusting film 22 (=(the area of the transmittance adjusting film 22 in the phase shifter formation region)/(the area of the phase shifter)). Therefore, it is possible to arbitrarily change the transmittance of the phase shifter depending on the pattern shape on the same photomask.

THIRD EMBODIMENT

Hereinafter, a photomask according to a third embodiment of the present invention, a method for producing the photomask and a method for forming a pattern using the photomask will be described with reference to the accompanying drawings. The photomask of the third embodiment is a photomask of a reduction projection exposure system to realize the above-described outline enhancement method.

Figure 19A:
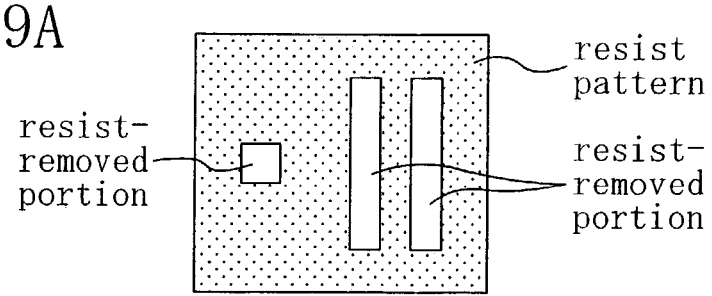
FIG. 19A is a view showing an example of a desired pattern to be formed with the photomask of a third embodiment of the present invention.

FIG. 19A shows an example of a desired pattern to be formed with the photomask of the third embodiment. In this embodiment as well as the first embodiment, the description is based on the assumption that the positive resist process is used. In this embodiment, the transmittance is expressed by an effective transmittance when the transmittance of the transparent substrate is taken as 100%, unless otherwise specified.

Figure 19B:
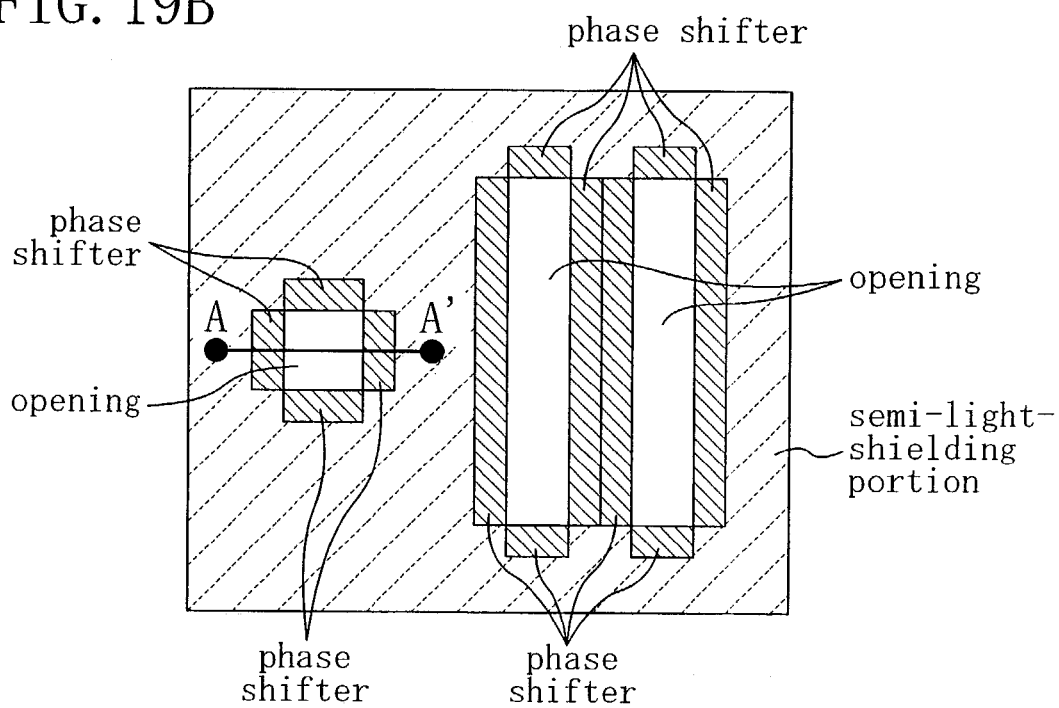
FIG. 19B is a plan view of the photomask of the third embodiment of the present invention.

FIG. 19B is a plan view of the photomask of the third embodiment, more specifically, a photomask for forming the desired pattern shown in FIG. 19A. As shown in FIG. 19B, openings (light-transmitting portions) are provided so as to correspond to resist-removed portions in the desired pattern. Furthermore, a semi-light-shielding portion that has a low transmittance (about 6 to 15%) that does not allow the resist film to be exposed and transmits exposure light in the same phase as that of the opening is used as the light-shielding mask pattern surrounding the opening, instead of the complete light-shielding portion that completely shields exposure light. Furthermore, phase shifters (peripheral portions) that transmit exposure light in a phase opposite to that of the openings are provided in the periphery of the openings. In this embodiment, the transmittance of the phase shifter is set to a higher value than that of the semi-light-shielding portion so that the light transmitted through the phase shifters can cancel effectively the lights transmitted through the openings and the semi-light-shielding portion, according to the principle of the outline enhancement method.

In the third embodiment, the phase shifters are arranged in such a manner that the sides of the phase shifters are in contact with the corresponding sides of the rectangular opening in a region having a predetermine size or less from each side of the rectangular opening, for example, as shown in FIG. 8B.

Figure 19C:
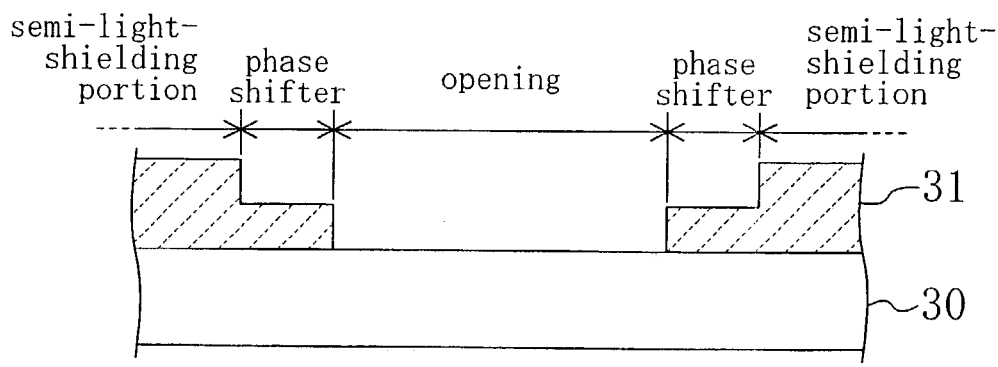
FIG. 19C is a cross-sectional view taken along line AA' of FIG. 19B.

FIG. 19C is a cross-sectional view taken along line AA' in FIG. 19B, that is a cross-sectional view of the photomask of the third embodiment. As shown in FIG. 19C, the surface of the transparent substrate 30 in the opening formation region is exposed. A semi-light-shielding film (half-tone film) 31 having a low transmittance (about 6 to 15%) that does not allow the resist film to be exposed is formed on the transparent substrate 30 in the semi-light-shielding portion formation region and the phase shifter formation region. As the portion of the half-tone film 31, an oxide film such as ZrSiO, CrAlO, TaSiO, MoSiO or TiSiO can be used. The portion of the half-tone film 31 in the semi-light-shielding portion formation region has a thickness that causes a phase difference (the same phase) of 360 degrees (more specifically, (−30+360×n) degrees or more and (30+360×n) degrees or less (where n=an integer)) with respect to exposure light between this film and the transparent substrate 30 (opening). On the other hand, the portion of the half-tone film 31 in the phase shifter formation region has a small thickness that causes a phase difference (opposite phase) of (150+360×n) degrees or more and (210+360×n) degrees or less (where n is an integer) between this film and the opening. That is to say, the half-tone film 31 can transmit exposure light in a phase opposite to that of the opening when its thickness is changed.

As described above, in the photomask of this embodiment, the peripheral portion, that is, the phase shifter, made of a thin portion of the half-tone film 31 is formed between the semi-light-shielding portion made of a thick portion of the half-tone film 31 and the opening (light-transmitting portion), and thus the function of the outline enhancement mask is realized. However, in this phase shifter, by decreasing the thickness of the half-tone phase film 31, phase inversion occurs and the transmittance with respect to exposure light is made larger than that of the semi-light-shielding portion made of the thick portion of the half-tone film 31. Furthermore, it is necessary to limit the width of the phase shifter to a predetermined size or less in order to enhance the contrast by the outline enhancement method.

A method for producing the photomask of the third embodiment is as follows. The half-tone film 31 is formed on the transparent substrate 30 made of a material having light-transmitting properties with respect to exposure light (e.g., quartz). Thereafter, the half-tone film 31 is selectively etched.

Next, a method for forming a pattern using the photomask of the third embodiment will be described. In this case, as described with reference to the principle of the outline enhancement method when transferring a mask pattern in a reduced size with an exposure apparatus, it is preferable to use an oblique incident exposure light source as shown in FIGS. 11B to 11D in order to form an image having a high contrast with the outline enhancement mask.

FIGS. 20A to 20D are cross-sectional views showing the processes of a method forming a pattern with the photomask of the third embodiment.

Figure 20A:
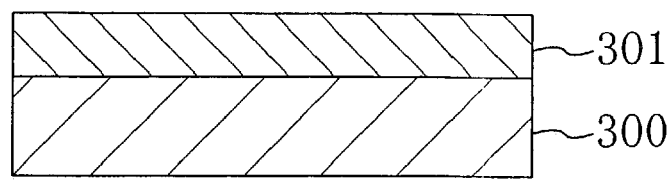
FIGS. 20A to 20D are cross-sectional views showing the processes of a method forming a pattern with the photomask of the third embodiment of the present invention.
Figure 20B:
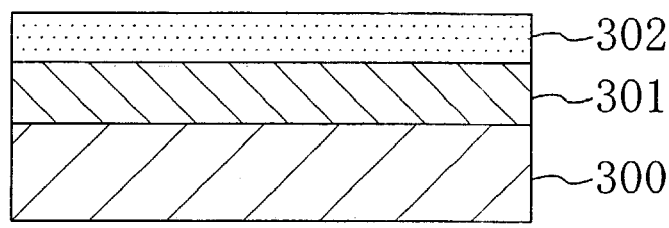

First, as shown in FIG. 20A, after a film 301 to be processed such as a metal film or an insulating film is formed on a substrate 300, as shown in FIG. 20B, a positive resist film 302 is formed on the film 301 to be processed.

Figure 20C:
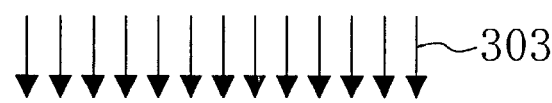

Next, as shown in FIG. 20C, the photomask of the third embodiment including the semi-light-shielding portion made of the thick portion of the half-tone film 31 and the phase shifter made of the thin portion of the half-tone film 31 is irradiated with exposure light 303 with an oblique incident exposure light source to expose the resist film 302 with transmitted light 304 transmitted through the photomask. In this case, as the mask pattern, the semi-light-shielding portion having a low transmittance is used, so that the entire resist film 302 is exposed with weak energy. However, as shown in FIG. 20C, only a latent image portion 302a of the resist film 302 corresponding to the light-transmitting portion (opening) in the photomask is irradiated with exposure energy that is sufficient to dissolve the resist film 302 in a developing process.

Figure 20D:
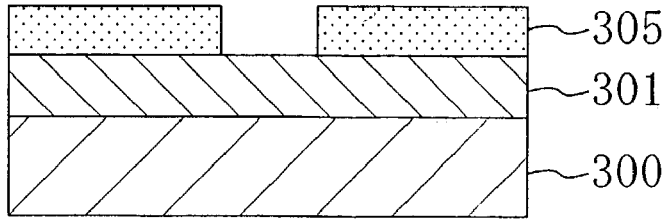

Next, the latent image portion 302a is removed by performing development with respect to the resist film 302, so that as shown in FIG. 20D, a resist pattern 305 is formed. In this case, in the exposure process shown in FIG. 20C, light around the opening is canceled, so that a portion corresponding to the phase shifter (peripheral portion) in the resist film 302 is substantially not irradiated with exposure energy. Therefore, the contrast in the light intensity distribution between the light transmitted through the opening and the light transmitted through the peripheral portion, in other words, the contrast in the light intensity distribution between the light with which the latent image portion 302a is irradiated and the light with which the periphery of the latent portion 302a is irradiated can be enhanced. Therefore, the energy distribution in the latent portion 302a is changed sharply, so that a resist pattern 305 having a sharp shape can be formed.

As described above, according to the third embodiment, the phase shifter (peripheral portion) made of the thin portion of the half-tone film 31 is sandwiched by the opening (light-transmitting portion) made of the exposed portion of the transparent substrate 30 and the semi-light-shielding portion made of the thick portion of the half-tone film 31. In this case, the thick portion of the half-tone film 31 transmits exposure light in the same phase as that of the opening, whereas the thin portion of the half-tone film 31 transmits exposure light in a phase opposite to that of the opening. Therefore, the contrast in the light intensity distribution between the opening and the phase shifter can be enhanced by mutual interference between the light transmitted through the opening and the light transmitted through the phase shifter. This contrast enhancement effect also can be obtained when a fine isolated resist-removed portion (i.e., a fine isolated space pattern corresponding to the light-transmitting portion) is formed with oblique incident exposure, for example, in the positive resist process. That is to say, it is possible to miniaturize isolated space patterns and isolated line patterns or dense patterns at the same time with oblique incident exposure.

According to the third embodiment, the semi-light-shielding portion is constituted by a single layered structure of the half-tone film 31, so that the mask structure is very simple. Moreover, a phase shifter (peripheral portion) can be formed easily simply by partially reducing the thickness of the half-tone film 31, in other words, by providing a recess in the half-tone film 31.

According to the third embodiment, the half-tone film 31 formed on the transparent substrate 30 is etched selectively, so that a mask pattern with any shape that has the semi-light-shielding portion and the phase shifter can be easily produced.

According to the third embodiment, a phase shifter with any shape can be formed by processing the half-tone film 31 serving as the semi-light-shielding portion. Therefore, as the layout of the outline enhancement mask, not only the type shown in FIGS. 19B and 19C, that is, the type shown in FIG. 8B, but also all the types shown in FIGS. 8A to 8F, for example, can be realized.

In the third embodiment, it is preferable that the transmittance of the semi-light-shielding portion of the photomask is 6% or more and 15% or less. Thus, the contrast enhancement effect can be obtained reliably while preventing a reduction in thickness of the resist film in pattern formation.

In the third embodiment, the description is based on the use of the positive resist process, but the negative resist process can be used, instead of the positive resist process. In this case, in either one of the processes, as the exposure light source, the i line (wavelength 365 nm), KrF excimer laser light (wavelength 248 nm), ArF excimer laser light (wavelength 193 nm), or $F_2$ excimer laser light (wavelength 157 nm) can be used, for example.

In the third embodiment, for example, a two layered structure in which the transmittance adjusting film having a low transmittance and the phase adjusting film having a high transmittance are laminated can be used as the structure of the half-tone film 31 (see FIGS. 18A and 18C). By doing this, a combination of a desired phase difference and a desired transmittance can be selected arbitrarily for the half-tone film 31. Moreover, the selection ratio at etching for processing the half-tone film 31 can be improved by a combination of the material of the transmittance adjusting film and the material of the phase adjusting film.

Figure 21A:
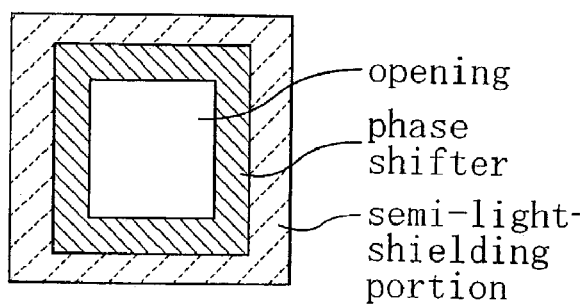
FIGS. 21A and 21B are a plan view and a cross-sectional view of the photomask of the third embodiment of the present invention in which a thin portion of a half-tone film is in contact with an opening, respectively.
Figure 21B:
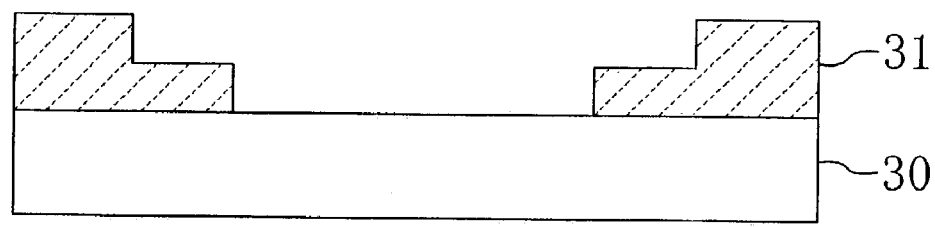
Figure 21C:
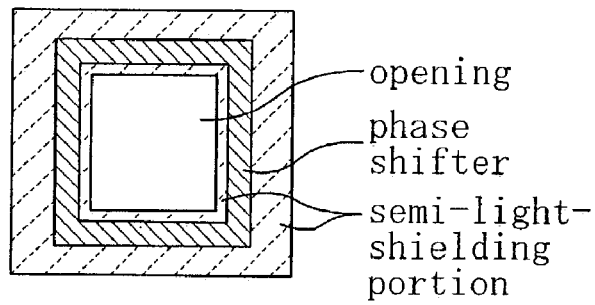
FIGS. 21C and 21D are a plan view and a cross-sectional view of the photomask of the third embodiment of the present invention in which a thin portion of a half-tone film is apart from an opening by a predetermined distance, respectively.
Figure 21D:
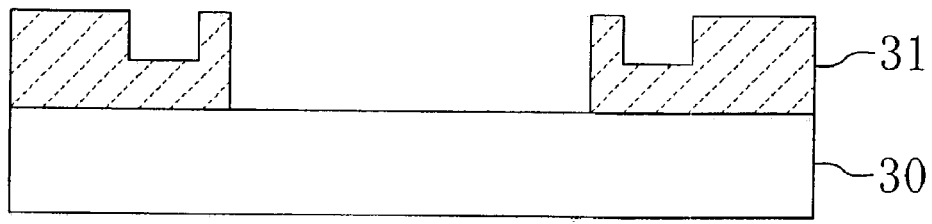

In the third embodiment, as shown in the plan view of FIG. 21A and the corresponding cross-sectional view of FIG. 21B, the phase shifter (peripheral portion) made of the thin portion of the half-tone film 31 is in contact with the opening (light-transmitting portion). However, instead of this, for example, as shown in the plan view of FIG. 21C and the corresponding cross-sectional view of FIG. 21D, the thin portion of the half-tone film 31 can be spaced apart from the opening by a predetermined size. In other words, the phase shifter and the opening are spaced apart from each other, and a semi-light-shielding portion made of the thick portion of the half-tone film 31 can be formed between the phase shifter and the opening. In this case, as shown in FIGS. 21C and 21D, a phase shifter can be formed simply by partially reducing the thickness of the half-tone film 31, in other words, by providing a recess in the half-tone film 31. As a result, also in the case where a semi-light-shielding portion having a small width is present between the phase shifter and the opening, peeling of the film constituting the semi-light-shielding portion having a small width can be suppressed better, compared with the case where a semi-light-shielding portion of a multilayered film structure is used. On the other hand, when the semi-light-shielding portion with a small width having a multilayered structure is provided between the phase shifter and the opening, the semi-light-shielding portion is present as a small isolated region of the upper film formed on the lower film, so that the isolated region tends to be peeled while processing the upper film.

FOURTH EMBODIMENT

Hereinafter, a photomask according to a fourth embodiment of the present invention, a method for producing the photomask and a method for forming a pattern using the photomask will be described with reference to the accompanying drawings. The photomask of the fourth embodiment is a photomask of a reduction projection exposure system to realize the above-described outline enhancement method.

Figure 22A:
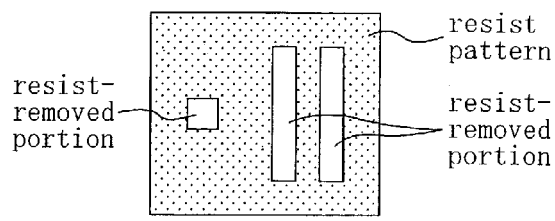
FIG. 22A is a view showing an example of a desired pattern to be formed with the photomask of a fourth embodiment of the present invention.

FIG. 22A shows an example of a desired pattern to be formed with the photomask of the fourth embodiment. In this embodiment as well as the first embodiment, the description is based on the assumption that the positive resist process is used. In this embodiment, the transmittance is expressed by an effective transmittance when the transmittance of the transparent substrate is taken as 100%, unless otherwise specified.

Figure 22B:
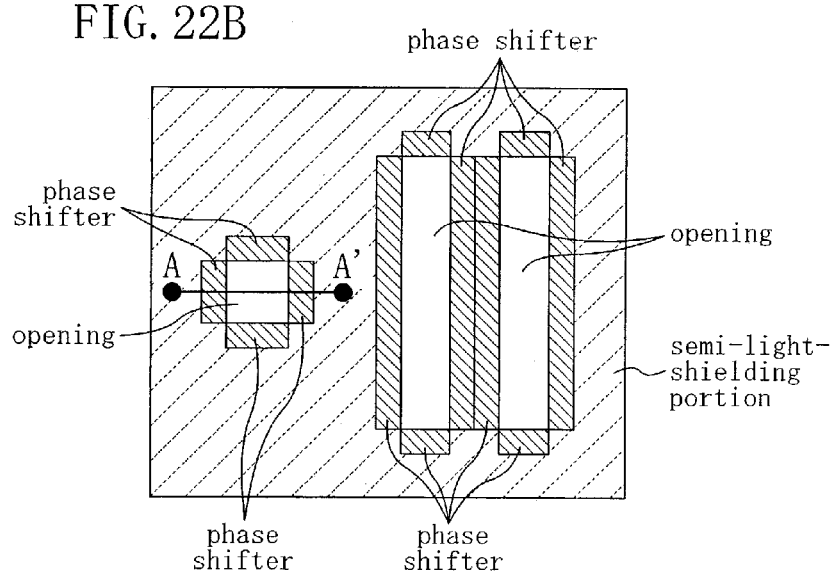
FIG. 22B is a plan view of the photomask of the fourth embodiment of the present invention.

FIG. 22B is a plan view of the photomask of the fourth embodiment, more specifically, a photomask for forming the desired pattern shown in FIG. 22A. As shown in FIG. 22B, openings (light-transmitting portions) are provided so as to correspond to resist-removed portions in the desired pattern. Furthermore, a semi-light-shielding portion that has a low transmittance (about 6 to 15%) that does not allow the resist film to be exposed and transmits exposure light in the same phase as that of the opening is used as the light-shielding mask pattern surrounding the opening, instead of the complete light-shielding portion that completely shields exposure light. Furthermore, phase shifters (peripheral portions) that transmit exposure light in a phase opposite to that of the openings are provided in the periphery of the openings. In this embodiment, the transmittance of the phase shifter is set to a higher value than that of the semi-light-shielding portion so that the light transmitted through the phase shifters can cancel effectively the lights transmitted through the openings and the semi-light-shielding portion, according to the principle of the outline enhancement method.

In the fourth embodiment, the phase shifters are arranged in such a manner that the sides of the phase shifters are in contact with the corresponding sides of the rectangular opening in a region having a predetermine size or less from each side of the rectangular opening, for example, as shown in FIG. 8B.

Figure 22C:
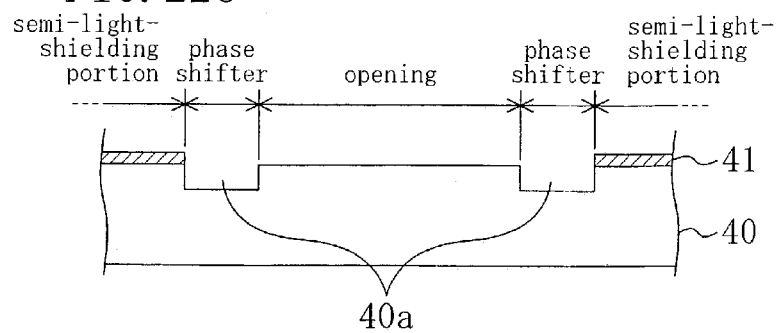
FIG. 22C is a cross-sectional view taken along line AA' of FIG. 22B.

FIG. 22C is a cross-sectional view taken along line AA' in FIG. 22B, that is a cross-sectional view of the photomask of the fourth embodiment. As shown in FIG. 22C, the surface of the transparent substrate 40 in the opening formation region is exposed. A semi-light-shielding film (half-tone film) 41 having a low transmittance (about 6 to 15%) that does not allow the resist film to be exposed is formed on the transparent substrate 40 in the semi-light-shielding portion formation region. The half-tone film 41 generates a phase difference (the same phase) of 360 degrees with respect to exposure light (more specifically, (−30+360×n) degrees or more and (30+360×n) degrees or less, (where n=an integer)) between this film and the transparent substrate 40 (opening). The portion of the transparent substrate 40 in the phase shifter formation region is dug down so as to have a thickness that causes a phase difference (opposite phase) of (150+360×n) degrees or more and (210+360×n) degrees or less (where n is an integer) between this film and the opening. That is to say, the dug portion 40a is provided in the transparent substrate 40 in the phase shifter formation region.

As the half-tone film 41, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. In this embodiment, as the half-tone film 41, for example, a single layered structure of a light-shielding film (e.g., a chromium film used as a light-shielding film of a regular photomask) that is made thin so as to have a very small phase difference between this film and the opening and thus has a low transmittance that does not allow the resist film to be exposed is used.

As described above, according to the photomask of this embodiment, the phase shifter made of the dug portion 40a of the transparent substrate 40 is formed between the semi-light-shielding portion made of the half-tone film 41 and the opening (light-transmitting portion), and thus the function of the outline enhancement mask is realized. However, it is necessary to limit the width of the phase shifter to a predetermined size or less in order to enhance the contrast by the outline enhancement method.

Next, a method for forming a pattern using the photomask of the fourth embodiment will be described. In this case, as described with reference to the principle of the outline enhancement method when transferring a mask pattern in a reduced size with an exposure apparatus, it is preferable to use an oblique incident exposure light source as shown in FIGS. 11B to 11D in order to form an image having a high contrast with the outline enhancement mask.

FIGS. 23A to 23D are cross-sectional views showing the processes of a method forming a pattern with the photomask of the fourth embodiment.

Figure 23A:
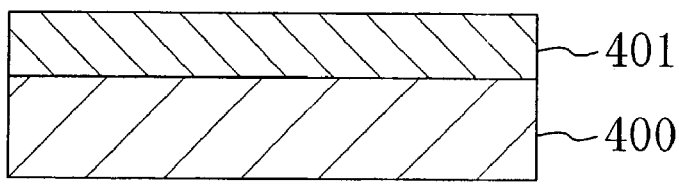
FIGS. 23A to 23D are cross-sectional views showing the processes of a method forming a pattern with the photomask of the fourth embodiment of the present invention.
Figure 23B:
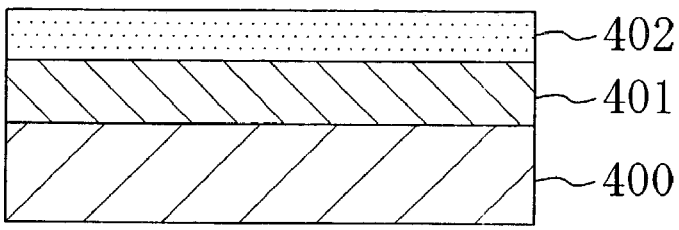

First, as shown in FIG. 23A, after a film 401 to be processed such as a metal film or an insulating film is formed on a substrate 400, as shown in FIG. 23B, a positive resist film 402 is formed on the film 401 to be processed.

Figure 23C:
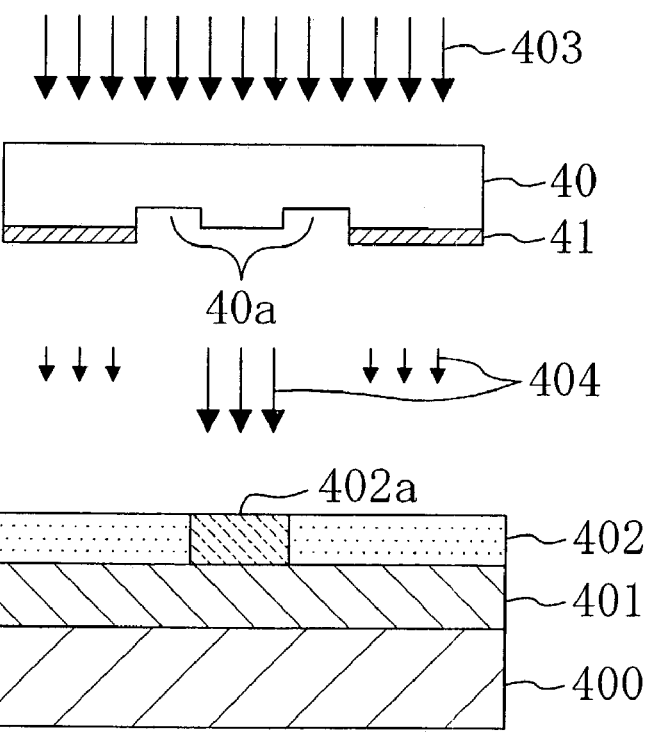

Next, as shown in FIG. 23C, the photomask of the fourth embodiment including the semi-light-shielding portion made of the half-tone film 41 and the phase shifter (peripheral portion) made of the dug portion 40a of the transparent substrate 40 is irradiated with exposure light 403 with an oblique incident exposure light source to expose the resist film 402 with transmitted light 404 transmitted through the photomask. In this case, as the mask pattern, the semi-light-shielding portion having a low transmittance is used, so that the entire resist film 402 is exposed with weak energy. However, as shown in FIG. 23C, only a latent image portion 402a of the resist film 402 corresponding to the light-transmitting portion (opening) in the photomask is irradiated with exposure energy that is sufficient to dissolve the resist film 402 in a developing process.

Figure 23D:
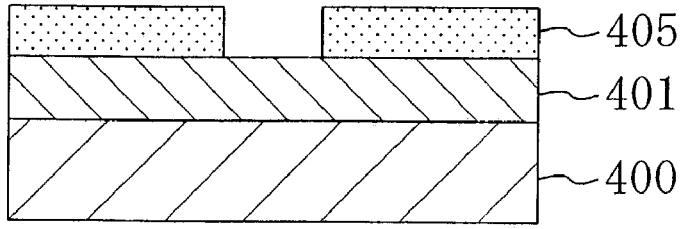

Next, the latent image portion 402a is removed by performing development with respect to the resist film 402, so that as shown in FIG. 23D, a resist pattern 405 is formed. In this case, in the exposure process shown in FIG. 23C, light around the opening is canceled, so that a portion corresponding to the phase shifter (peripheral portion) in the resist film 402 is substantially not irradiated with exposure energy. Therefore, the contrast in the light intensity distribution between the light transmitted through the opening and the light transmitted through the peripheral portion, in other words, the contrast in the light intensity distribution between the light with which the latent image portion 402a is irradiated and the light with which the periphery of the latent portion 402a is irradiated can be enhanced. Therefore, the energy distribution in the latent portion 402a is changed sharply, so that a resist pattern 405 having a sharp shape can be formed.

Next, a method for producing a photomask of the fourth embodiment will be described with reference to the drawings.

FIGS. 24A to 24E are cross-sectional views showing the processes of a method for producing the photomask of the fourth embodiment. FIG. 24F is a plan view corresponding to the cross-sectional view of FIG. 24C. FIG. 24G is a plan view corresponding to the cross-sectional view of FIG. 24E.

Figure 24A:
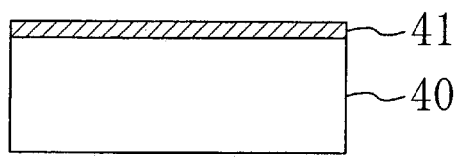
FIGS. 24A to 24E are cross-sectional views showing the processes of a method producing the photomask of the fourth embodiment of the present invention.

First, as shown in FIG. 24A, the half-tone film 41 is formed on the transparent substrate 40 made of a material having light-transmitting properties with respect to exposure light such as quartz. As the half-tone film 41, a single layered light-shielding film with a reduced thickness is used.

Figure 24B:
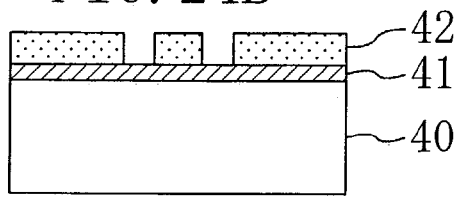
Figure 24C:
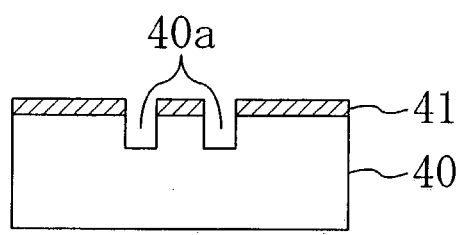

Next, as shown in FIG. 24B, a first resist pattern 42 that covers the semi-light-shielding portion formation region and the opening (light-transmitting portion) formation region is formed on the transparent substrate 40. That is, a first resist pattern 42 having a removed portion in the phase shifter (peripheral portion) formation region is formed on the transparent substrate 40. Thereafter, the half-tone film 41 and the transparent substrate 40 are etched with the first resist pattern 42 as a mask, and then the first resist pattern 42 is removed. Thus, as shown in FIGS. 24C and 24F, the portions corresponding to the phase shifter formation region in the half-tone film 41 are removed. The transparent substrate 40 in the phase shifter formation region is dug down so as to have a thickness that transmits exposure light in a phase opposite to that of the opening. More specifically, a dug portion 40a that causes phase inversion of 180 degrees (more specifically, a phase difference of (150+360×n) degrees or more and (210+360×n) degrees or less, where n=an integer) in the portion corresponding to the phase shifter formation region in the transparent substrate 40.

Figure 24D:
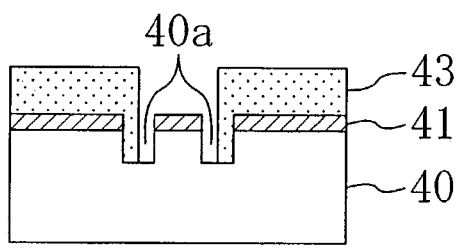
Figure 24E:
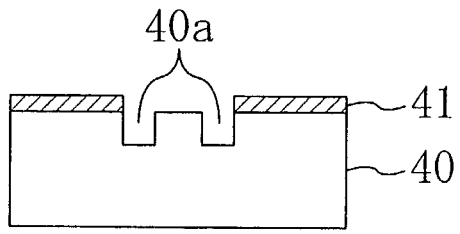
Figure 24F:
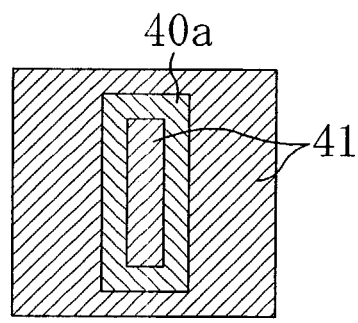
FIG. 24F is a plan view corresponding to the cross-sectional view of FIG. 24C.
Figure 24G:
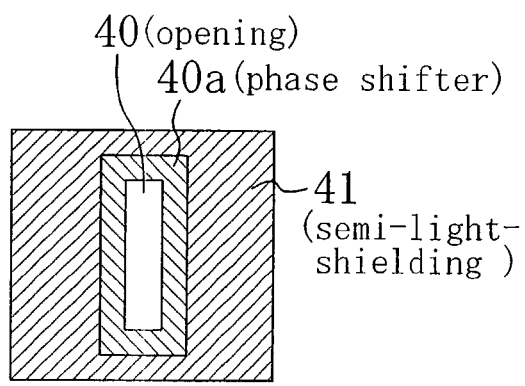
FIG. 24G is a plan view corresponding to the cross-sectional view of FIG. 24E.

Next, as shown in FIG. 24D, a second resist pattern 43 that covers the portion corresponding to the semi-light-shielding portion formation region in the half-tone film 41 is formed on the transparent substrate 40. Thereafter, the half-tone film 41 is etched with the second resist pattern 43 as a mask, and then the second resist pattern 43 is removed. Thus, as shown in FIGS. 24E and 24G, the portion corresponding to the opening formation region in the half-tone film 41 is removed, and thus the photomask of the fourth embodiment is completed. That is to say, the photomask of the fourth embodiment having the plane structure of the outline enhancement mask can be easily formed by, as a mask blank, preparing a transparent substrate in which a light-shielding film with a reduced thickness is deposited, and then performing etching with respect to the light-shielding film and the transparent substrate sequentially.

As described above, according to the fourth embodiment, the phase shifter (peripheral portion) made of the dug portion 40a in the transparent substrate 40 is sandwiched by the opening (light-transmitting portion) made of the exposed portion of the transparent substrate 40 and the semi-light-shielding portion made of the half-tone film 41. The half-tone film 41 transmits exposure light in the same phase as that of the opening, whereas the dug portion 40a transmits exposure light in a phase opposite to that of the opening. Therefore, the contrast in the light intensity distribution between the opening and the phase shifter can be enhanced by mutual interference between the light transmitted through the opening and the light transmitted through the phase shifter. This contrast enhancement effect also can be obtained when a fine isolated resist-removed portion (i.e., a fine isolated space pattern corresponding to the light-transmitting portion) is formed with oblique incident exposure, for example, in the positive resist process. That is to say, it is possible to miniaturize isolated space patterns and isolated line patterns or dense patterns at the same time with oblique incident exposure.

According to the fourth embodiment, the semi-light-shielding portion is constituted by a single layered structure of the half-tone film 41, so that the mask structure is simple.

According to the fourth embodiment, after the half-tone film 41 is formed on the transparent substrate 40, the half-tone film 41 and the transparent substrate 40 are etched selectively, so that a mask pattern with any shape that has the semi-light-shielding portion and the phase shifter (peripheral portion) can be easily realized.

According to the fourth embodiment, a phase shifter with any shape can be formed by processing the multilayered structure of the transparent substrate 40 and the half-tone film 41 by the method for producing a photomask shown in, for example, FIGS. 24A to 24E. Therefore, as the pattern layout of the outline enhancement mask, not only the type shown in FIGS. 22B and 22C, that is, the type shown in FIG. 8B, but also all the types shown in FIGS. 8A to 8F, for example, can be realized.

According to the fourth embodiment, as the half-tone film 41, a film obtained by reducing the thickness of a light-shielding film for a regular photomask is used, so that a substrate to be prepared as a mask blank can be simplified. That is to say, photomask process can be performed easily only by preparing a transparent substrate in which a single layered thin film is formed as a mask blank, and etching each of the single layered thin film and the transparent substrate. For example, the transparent substrate in which a two layered structure of a phase adjusting film and a transmittance adjusting film is formed is used as a mask blank for a regular half-tone phase-shifting mask. However, in this embodiment, a half-tone phase-shifting mask in which the phase adjusting film is not formed, in other words, a mask blank in which only the transmittance adjusting film is formed on the transparent substrate can be used. That is to say, a conventional technology can be utilized in production of a mask blank by using a light-shielding film with a reduced thickness as the half-tone film 41, which is advantageous in practice.

Hereinafter, the results of examination with simulations of an influence of a phase change (a phase difference caused between the opening and the semi-light-shielding portion) due to the use of the light-shielding film with a reduced thickness as the half-tone phase film 41, that is, the semi-light-shielding portion on the pattern formation will be described with reference to FIGS. 25A to 25C. The simulation conditions are such that the wavelength λ of the exposure light is 0.193 μm (ArF light source), the numerical aperture NA of the projection optical system of the exposure apparatus is 0.6, and annular illumination is used.

Figure 25A:
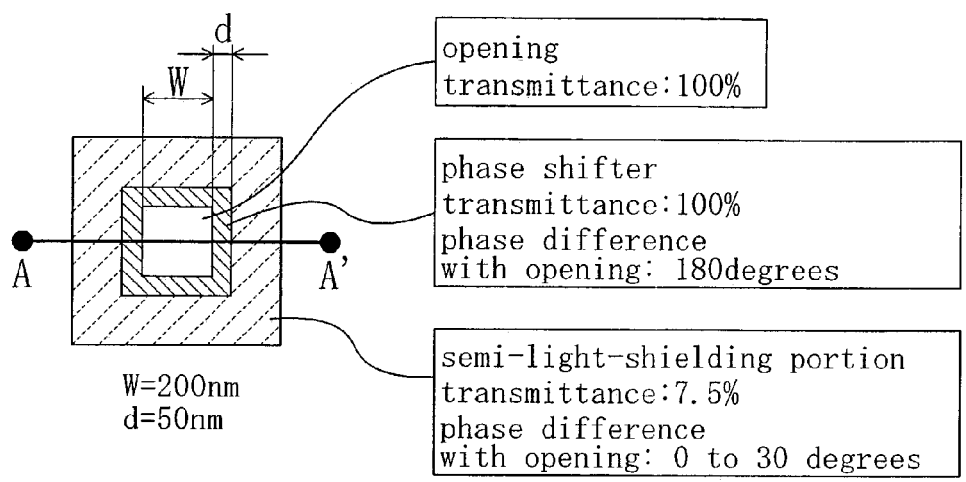
FIGS. 25A to 25C are diagrams illustrating an influence of a phase change due to a light-shielding portion with a reduced thickness being used as the semi-light-shielding portion of the photomask of the fourth embodiment on the pattern formation.

FIG. 25A shows a plan view of an outline enhancement mask used in the simulations. As shown in FIG. 25A, the width of the opening and the phase shifter is 200 nm and 50 nm, respectively. The transmittance of the opening, the phase shifter and the semi-light-shielding portion is 100%, 100% and 7.5%, respectively. The phase shifter generates a phase difference of 180 degrees between this portion and the opening, and the semi-light-shielding portion generates a phase difference of 0 to 30 degrees between this portion and the opening.

Figure 25B:
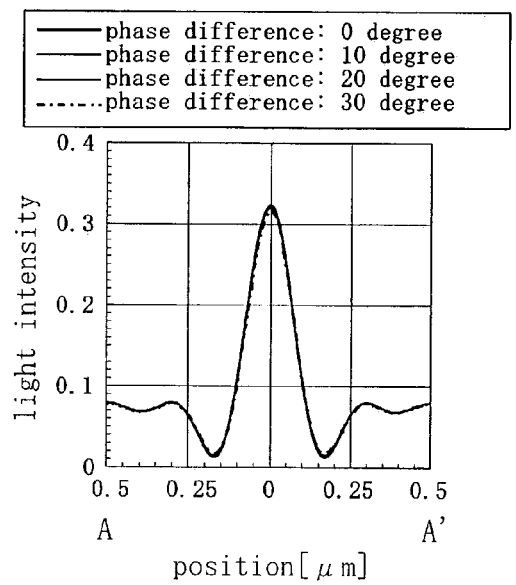

FIG. 25B shows the simulation results of the light intensity distribution corresponding to line AA' when exposure is performed with respect to the outline enhancement mask shown in FIG. 25A in such a manner that a phase difference of 0 degrees, 10 degrees, 20 degrees or 30 degrees is generated between the semi-light-shielding portion and the opening. As shown in FIG. 25B, if the phase difference between the semi-light-shielding portion and the opening is not more than 30 degree or so, the contrast in the light intensity distribution is not substantially affected.

Figure 25C:
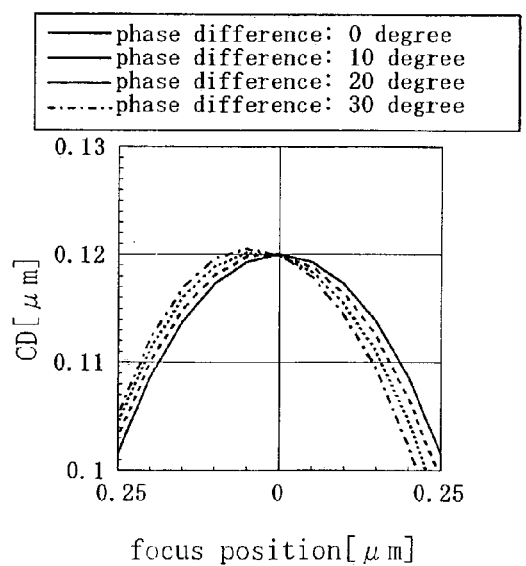

FIG. 25C shows the simulation results of the focus dependence of the size (CD: Critical Dimension) of the finished pattern when exposure is performed with respect to the outline enhancement mask shown in FIG. 25A in such a manner that a phase differences of 0 degrees, 10 degrees, 20 degrees or 30 degrees is generated between the semi-light-shielding portion and the opening. As shown in FIG. 25C, if the phase difference between the semi-light-shielding portion and the opening is changed, the best focus position in which the CD is the peak is changed. However, even if the phase difference is changed, the unlikelihood of CD change with respect to the focus variation, that is, the depth of focus is substantially not changed. No problem is caused in pattern formation, even if the best focus positions are varied in the same manner, at all portions on the photomask. Only the depth of focus is an issue in pattern formation. That is to say, if the phase difference between the semi-light-shielding portion and the opening is up to about 30 degrees, there is no problem in terms of the focus characteristics.

Therefore, in this embodiment, when a light-shielding film with a reduced thickness is used as the half-tone film 41 serving as a semi-light-shielding portion, the outline enhancement mask in a strict sense (the phase difference between the semi-light-shielding portion and the opening is 0 degree) cannot be realized, but if the phase difference that is caused by the reduction of the film is about 30 degrees or less, the effect of the outline enhancement method is not lost. More specifically, when Ta, Cr or alloys containing Ta or Cr or the like is used as the material of the light-shielding film, the thickness of the light-shielding film that generates a phase difference of about 30 degrees between this film and the opening with respect to light from an ArF light source is approximately 30 nm or more. This thickness is sufficient to realize a transmittance of 10% or less.

In the fourth embodiment, it is preferable that the transmittance of the semi-light-shielding portion is 6% or more and 15% or less. Thus, the contrast enhancement effect can be obtained reliably while preventing a reduction in thickness of the resist film in pattern formation.

In the fourth embodiment, the description is based on the use of the positive resist process, but the negative resist process can be used, instead of the positive resist process. In this case, in either one of the processes, as the exposure light source, the i line (wavelength 365 nm), KrF excimer laser light (wavelength 248 nm), ArF excimer laser light (wavelength 193 nm), or $F_2$ excimer laser light (wavelength 157 nm) can be used, for example.

In the fourth embodiment, for example, a two layered structure in which the transmittance adjusting film having a low transmittance and the phase adjusting film having a high transmittance are laminated can be used as the structure of the half-tone film 41. By doing this, a combination of a desired phase difference (more specifically ($-30+360 \times n$) degrees or more and ($30+360 \times n$) degrees or less) and a desired transmittance can be selected arbitrarily for the half-tone film 41. Moreover, the selection ratio at etching for processing the half-tone film 41 can be improved by a combination of the material of the transmittance adjusting film and the material of the phase adjusting film. Furthermore, for example, it is possible to set a phase difference between the opening and the semi-light-shielding portion to 0 degree by depositing a phase adjusting film on the single layered thin light-shielding film used as the half-tone film 41 in this embodiment.

Figure 26A:
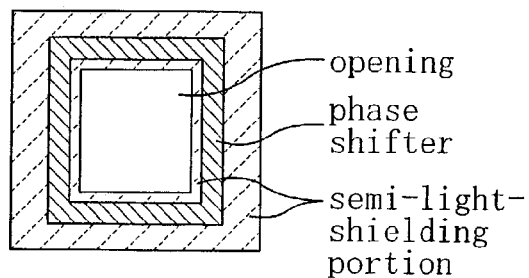
FIG. 26A is a plan view of the photomask of the fourth embodiment of the present invention in which a dug portion in a transparent substrate is apart from an opening by a predetermined distance.
Figure 26B:
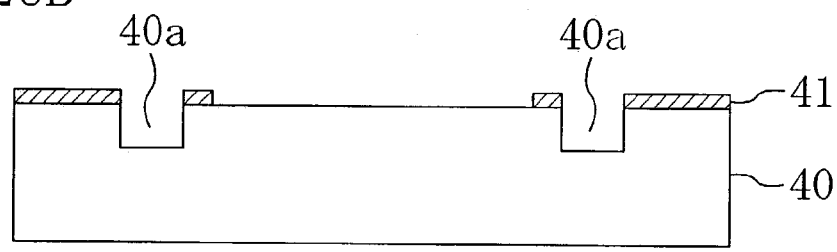
FIGS. 26B to 26D are cross-sectional views in this case.
Figure 26C:
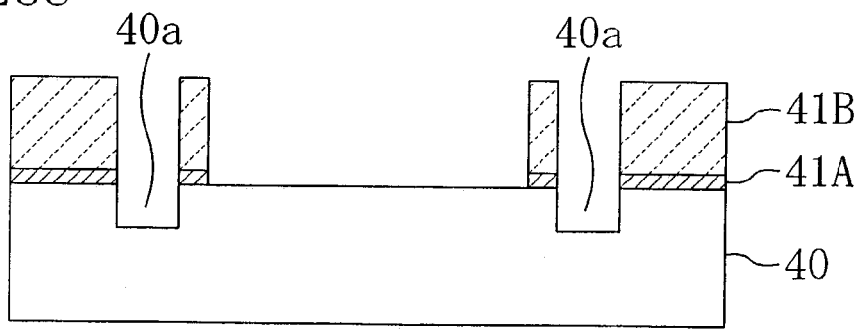

In the fourth embodiment, as shown in the plan view of FIG. 22B and the corresponding cross-sectional view of FIG. 22C, the dug portion 40a in the transparent substrate 40, that is, the phase shifter is in contact with the opening. However, instead of this, for example, as shown in the plan view of FIG. 26A and the corresponding cross-sectional view of FIG. 26B, the half-tone film 41 is used as the semi-light-shielding portion, and the dug portion 40a in the transparent substrate 40 can be spaced apart from the opening by a predetermined size. In other words, the phase shifter (peripheral portion) and the opening (light-transmitting portion) are spaced apart from each other, and a semi-light-shielding portion can be formed between the phase shifter and the opening. FIG. 26C shows a cross-sectional structure of a photomask using a semi-light shielding portion in which the phase adjusting film is deposited on a single layered thin film having a low transmittance, instead of the semi-light-shielding portion constituted only by the half-tone film 41 in the photomask shown in FIG. 26B. In the photomask shown in the plan view of FIG. 26C, a two layered structure in which a transmittance adjusting film 41A having a low transmittance and a phase adjusting film 41B having a high transmittance are laminated is used as the semi-light-shielding portion, and thus the phase difference between the semi-light-shielding portion and the opening is set to 0 degree. As the transmittance adjusting film 41A, a thin film (having a thickness of 30 nm or less) made of a metal such as Zr, Cr, Ta, Mo or Ti or a thin film (having a thickness of 30 nm or less) made of a metal alloy such as a Ta—Cr alloy, a Zr—Si alloy, a Mo—Si alloy or a Ti—Si alloy can be used. As the phase adjusting film 41B, an oxide film such as $SiO_2$ film can be used.

Figure 26D:
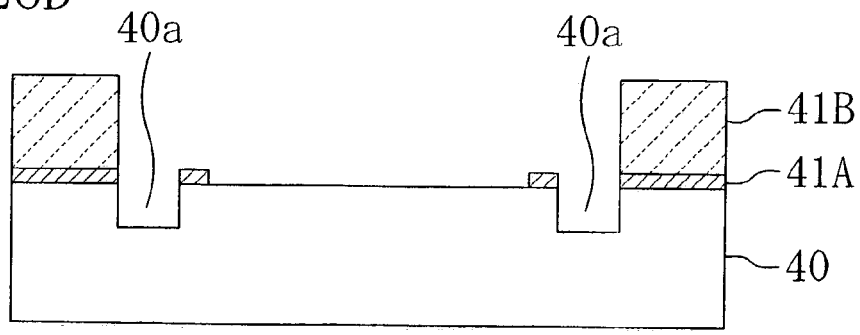

As the photomask shown in FIG. 26C, when the semi-light-shielding portion having a small width that spaces the phase shifter apart from the opening constitutes a thick multilayered film structure, more specifically, a small isolated region of a thick phase adjusting film 41B formed on the lower transmittance adjusting film 41A is present between the phase shifter and the opening, the isolated region tends to be peeled during the processing of the phase adjusting film 41B. As opposed to this, the cross-sectional structure of the photomask can be such as shown in FIG. 26D by utilizing the advantage that no problem is caused if a phase difference of up to 30 degrees is generated between the phase shifter and the opening. That is to say, a single layered structure of a thin transmittance adjusting film 41A that is not provided with the phase adjusting film 41B can be used as the semi-light-shielding portion having a small width between the phase shifter and the opening. The single layered structure of the transmittance adjusting film 41A generates a small phase difference between this structure and the opening. Thus, also when a semi-light-shielding portion having a small width is present between the phase shifter and the opening, a photomask having an effect of the outline enhancement method can be formed while suppressing peeling of the film constituting the semi-light-shielding portion having a small width. For example, in this embodiment, the half-tone film 41 made of the single layered thin light-shielding film is used for the entire semi-light-shielding portion formation region. However, instead of this, the single layered structure of half-tone film 41 is used as the semi-light-shielding portion between the phase shifter and the opening, and the multilayered structure of the half-tone film 41 and the phase adjusting film formed thereon can be used as the semi-light-shielding portion for the other regions.

In the first to fourth embodiments, it is assumed that all the portions except the opening (light-transmitting portion) and the phase shifter (peripheral portion) in the photomask are semi-light-shielding portions. However, the portion in the photomask that is apart from each of the opening and the phase shifter by a sufficient distance, that is, a distance ($=2\times\lambda/NA$ ($\lambda$ is the wavelength of exposure light, and NA is the numerical aperture of a reduction projection optical system of an exposure apparatus)) that allows an influence of optical interference effects from each of the opening and the phase shifter to be ignored may be a complete light-shielding portion.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A photomask comprising on a transparent substrate:
   a semi-light-shielding portion having a light-shielding property with respect to exposure light;
   a light-transmitting portion surrounded by the semi-light-shielding portion and having a light-transmitting property with respect to exposure light; and
   a peripheral portion surrounded by the semi-light-shielding portion and positioned in a periphery of the light-transmitting portion,
   wherein the semi-light-shielding portion and the light-transmitting portion transmit the exposure light in a same phase,
   the peripheral portion transmits the exposure light in a phase opposite to that of the semi-light-shielding portion and the light-transmitting portion, and is spaced apart from the light-transmitting portion by a predetermined distance,
   a surface of the transparent substrate in a formation region for the light-transmitting portion is exposed,
   a first phase shift film that transmits the exposure light in a phase opposite to that of the light-transmitting portion is formed on the transparent substrate in a formation region for the peripheral portion,
   the first phase shift film and a second phase shift film that transmits the exposure light in a phase opposite to that of the light-transmitting portion are laminated sequentially on the transparent substrate in a formation region for the semi-light-shielding portion, and
   a multilayered structure of the first phase shift film and the second phase shift film has a transmittance that allows the exposure light to be transmitted partially and transmits the exposure light in a same phase as that of the light-transmitting portion.

2. The photomask according to claim 1,
   wherein the first phase shift film has a first transmittance adjusting film and a first phase adjusting film formed on the first transmittance adjusting film,
   the first transmittance adjusting film transmits the exposure light in a same phase as that of the light-transmitting portion and has a relatively low transmittance with respect to the exposure light, and
   the first phase adjusting film transmits the exposure light in a phase opposite to that of the light-transmitting portion and has a relatively high transmittance with respect to the exposure light.

3. The photomask according to claim 1,
   wherein the second phase shift film has a second transmittance adjusting film and a second phase adjusting film formed on the second transmittance adjusting film,
   the second transmittance adjusting film transmits the exposure light in a same phase as that of the light-transmitting portion and has a relatively low transmittance with respect to the exposure light, and
   the second phase adjusting film transmits the exposure light in a phase opposite to that of the light-transmitting portion and has a relatively high transmittance with respect to the exposure light.

4. The photomask according to claim 1,
   wherein the first phase shift film has a first phase adjusting film that transmits the exposure light in a phase opposite to that of the light-transmitting portion,
   the second phase shift film has a second phase adjusting film that is formed on the first phase adjusting film and transmits the exposure light in a phase opposite to that of the light-transmitting portion, and
   a transmittance adjusting film having a lower transmittance than that of the phase adjusting films with respect to the exposure light is formed between the first phase adjusting film and the second phase adjusting film.

5. The photomask according to claim 1,
   wherein a transmittance of the semi-light-shielding portion with respect to the exposure light is 6% or more and 15% or less.

6. A photomask comprising on a transparent substrate:
   a semi-light-shielding portion having a light-shielding property with respect to exposure light;
   a light-transmitting portion surrounded by the semi-light-shielding portion and having a light-transmitting property with respect to exposure light; and
   a peripheral portion surrounded by the semi-light-shielding portion and positioned in a periphery of the light-transmitting portion,
   wherein the semi-light-shielding portion and the light-transmitting portion transmit the exposure light in a same phase,
   the peripheral portion transmits the exposure light in a phase opposite to that of the semi-light-shielding portion and the light-transmitting portion, and is spaced apart from the light-transmitting portion by a predetermined distance,
   a surface of the transparent substrate in a formation region for the light-transmitting portion is exposed,
   a semi-light-shielding film that has a transmittance allowing the exposure light to be transmitted partially and transmits the exposure light in a same phase to that of the light-transmitting portion is formed on the transparent substrate in the semi-light-shielding portion formation region, and
   the semi-light-shielding film with a reduced thickness is formed on the transparent substrate in a formation region for the peripheral portion, the thickness being such an extent that the exposure light is transmitted in a phase opposite to that of the light-transmitting portion.

7. The photomask according to claim 6,
   wherein the, semi-light-shielding film has a transmittance adjusting film formed on the transparent substrate and a phase adjusting film formed on the transmittance adjusting film,
   the transmittance adjusting film transmits the exposure light in a same phase as that of the light-transmitting portion and has a relatively low transmittance with respect to the exposure light, and
   the phase adjusting film has a relatively high transmittance with respect to the exposure light,
   the phase adjusting film in a formation region for the semi-light-shielding portion has a thickness that transmits the exposure light in a same phase as that of the light-transmitting portion, and the phase adjusting film in a formation region for the peripheral portion has a thickness that transmits the exposure light in a phase opposite to that of the light-transmitting portion.

8. The photomask according to claim 6, wherein the semi-light-shielding film has a phase adjusting film formed on the transparent substrate and a transmittance adjusting film formed only on the phase adjusting film in the semi-light-shielding portion formation region, the transmittance adjusting film transmits the exposure light in a same phase as that of the light-transmitting portion and has a relatively low transmittance with respect to the exposure light, and the phase adjusting film has a relatively high transmittance with respect to the exposure light, the phase adjusting film in a formation region for the semi-light-shielding portion has a thickness that transmits the exposure light in a same phase as that of the light-transmitting portion, and the phase adjusting film in a formation region for the peripheral portion has a thickness that transmits the exposure light in a phase opposite to that of the light-transmitting portion.

9. The photomask according to claim 6, wherein a transmittance of the semi-light-shielding portion with respect to the exposure light is 6% or more and 15% or less.

10. A photomask comprising on a transparent substrate:

a semi-light-shielding portion having a light-shielding property with respect to exposure light;

a light-transmitting portion surrounded by the semi-light-shielding portion and having a light-transmitting property with respect to exposure light; and a peripheral portion surrounded by the semi-light-shielding portion and positioned in a periphery of the light-transmitting portion, wherein the semi-light-shielding portion and the light-transmitting portion transmit the exposure light in a same phase, the peripheral portion transmits the exposure light in a phase opposite to that of the semi-light-shielding portion and the light-transmitting portion, a surface of the transparent substrate in a formation region for the light-transmitting portion is exposed, a semi-light-shielding film that has a transmittance that allows the exposure light to be transmitted partially and transmits the exposure light in a same phase as that of the light-transmitting portion is formed on the transparent substrate in the semi-light-shielding portion, and the transparent substrate in a formation region for the peripheral portion is dug down such that a thickness thereof is such an extent that the exposure light is transmitted in a phase opposite to that of the light-transmitting portion.

11. The photomask according to claim 10, wherein the semi-light-shielding film has a transmittance adjusting film formed on the transparent substrate and a phase adjusting film formed on the transmittance adjusting film, the transmittance adjusting film has a relatively low transmittance with respect to the exposure light, and the phase adjusting film has a relatively high transmittance with respect to the exposure light.

12. The photomask according to claim 10, wherein the peripheral portion is in contact with the light-transmitting portion.

13. The photomask according to claim 10, wherein the peripheral portion is spaced apart from the light-transmitting portion by a predetermined distance.

14. The photomask according to claim 10, wherein a transmittance of the semi-light-shielding portion with respect to the exposure light is 6% or more and 15% or less.

15. A method for producing a photomask comprising:

a semi-light-shielding portion having a light-shielding property with respect to exposure light;

a light-transmitting portion surrounded by the semi-light-shielding portion and having a light-transmitting property with respect to exposure light; and a peripheral portion surrounded by the semi-light-shielding portion and positioned in a periphery of the light-transmitting portion on a transparent substrate, the method comprising:

a first step of forming a first phase shift film that transmits the exposure light in a phase opposite to that of the light-transmitting portion on the transparent substrate;

a second step of forming a second phase shift film that transmits the exposure light in a phase opposite to that of the light-transmitting portion on the first phase shift film;

a third step of removing the second phase shift film in a formation region for the light-transmitting portion and a formation region for the peripheral portion; and a fourth step of removing the first phase shift film in the light-transmitting portion formation region after the third step, wherein a multilayered structure of the first phase shift film and the second phase shift film formed on the transparent substrate in the semi-light-shielding portion formation region has a transmittance that allows the exposure light to be transmitted partially and transmits the exposure light in a same phase as that of the light-transmitting portion, and the peripheral portion is spaced apart from the light-transmitting portion by a predetermined distance.

16. The method for producing a photomask according to claim 15, wherein a transmittance of the semi-light-shielding portion with respect to the exposure light is 6% or more and 15% or less.

17. A method for producing a photomask comprising:

a semi-light-shielding portion having a light-shielding property with respect to exposure light;

a light-transmitting portion surrounded by the semi-light-shielding portion and having a light-transmitting property with respect to exposure light; and a peripheral portion surrounded by the semi-light-shielding portion and positioned in a periphery of the light-transmitting portion on a transparent substrate, the method comprising:

a first step of forming a first phase shift film that transmits the exposure light in a phase opposite to that of the light-transmitting portion on the transparent substrate;

a second step of forming a second phase shift film that transmits the exposure light in a phase opposite to that of the light-transmitting portion on the first phase shift film;

a third step of removing the second phase shift film in a formation region for the peripheral portion; and a fourth step of removing the second phase shift film and the first phase shift film in the light-transmitting portion formation region sequentially after the third step, wherein a multilayered structure of the first phase shift film and the second phase shift film formed on the transparent substrate in the semi-light-shielding portion formation region has a transmittance that allows the exposure light to be transmitted partially and transmits the exposure light in a same phase as that of the light-transmitting portion, and a peripheral portion is spaced apart from the light-transmitting portion by a predetermined distance.

18. The method for producing a photomask according to claim 17,
wherein a transmittance of the semi-light-shielding portion with respect to the exposure light is 6% or more and 15% or less.

19. The photomask according to claim 1,
wherein the peripheral portion is composed of a ring-shaped region which is positioned in a periphery of the light-transmitting portion, and
a part of the semi-light-shielding portion is interposed between the peripheral portion and the light-transmitting portion.

20. The photomask according to claim 1,
wherein the light-transmitting portion has a polygonal shape,
the peripheral portion is composed of a plurality of rectangular regions, each region being positioned so as to face each side of the light-transmitting portion, and
a part of the semi-light-shielding portion is interposed between the peripheral portion and the light-transmitting portion.

21. The photomask according to claim 6,
wherein the peripheral portion is composed of a ring-shaped region which is positioned in a periphery of the light-transmitting portion, and
a part of the semi-light-shielding portion is interposed between the peripheral portion and the light-transmitting portion.

22. The photomask according to claim 6,
wherein the light-transmitting portion has a polygonal shape,
the peripheral portion is composed of a plurality of rectangular regions, each region being positioned so as to face each side of the light-transmitting portion, and
a part of the semi-light-shielding portion is interposed between the peripheral portion and the light-transmitting portion.

23. The photomask according to claim 12,
wherein the peripheral portion is composed of a ring-shaped region which is in contact with a periphery of the light-transmitting portion.

24. The photomask according to claim 12,
wherein the light-transmitting portion has a polygonal shape, and
the peripheral portion is composed of a plurality of rectangular regions, each region being in contact with each side of the light-transmitting portion.

25. The photomask according to claim 13,
wherein the peripheral portion is composed of a ring-shaped region which is positioned in a periphery of the light-transmitting portion, and
a part of the semi-light-shielding portion is interposed between the peripheral portion and the light-transmitting portion.

26. The photomask according to claim 13,
wherein the light-transmitting portion has a polygonal shape,
the peripheral portion is composed of a plurality of rectangular regions, each region being positioned so as to face each side of the light-transmitting portion, and
a part of the semi-light-shielding portion is interposed between the peripheral portion and the light-transmitting portion.

27. A photomask comprising on a transparent substrate:
a semi-light-shielding portion having a light-shielding property with respect to exposure light;
a light-transmitting portion surrounded by the semi-light-shielding portion and having a light-transmitting property with respect to exposure light; and
a peripheral portion surrounded by the semi-light-shielding portion and positioned in a periphery of the light-transmitting portion,
wherein the light-transmitting portion has a polygonal shape,
the peripheral portion is composed of a plurality of rectangular regions, each region being positioned so as to face each side of the light-transmitting portion,
the semi-light-shielding portion and the light-transmitting portion transmit the exposure light in a same phase,
the peripheral portion transmits the exposure light in a phase opposite to that of the semi-light-shielding portion and the light-transmitting portion,
a surface of the transparent substrate in a formation region for the light-transmitting portion is exposed,
a first phase shift film that transmits the exposure light in a phase opposite to that of the light-transmitting portion is formed on the transparent substrate in a formation region for the peripheral portion,
the first phase shift film and a second phase shift film that transmit the exposure light in a phase opposite to that of the light-transmitting portion are laminated sequentially on the transparent substrate in a formation region for the semi-light-shielding portion, and
a multilayered structure of the first phase shift film and the second phase shift film has a transmittance that allows the exposure light to be transmitted partially and transmits the exposure light in a same phase as that of the light-transmitting portion.

28. The photomask according to claim 27,
wherein the first phase shift film has a first transmittance adjusting film and a first phase adjusting film formed on the first transmittance adjusting film,
the first transmittance adjusting film transmits the exposure light in a same phase as that of the light-transmitting portion and has a relatively low transmittance with respect to the exposure light, and
the first phase adjusting film transmits the exposure light in a phase opposite to that of the light-transmitting portion and has a relatively high transmittance with respect to the exposure light.

29. The photomask according to claim 27,
wherein the second phase shift film has a second transmittance adjusting film and a second phase adjusting film formed on the second transmittance adjusting film,
the second transmittance adjusting film transmits the exposure light in a same phase as that of the light-transmitting portion and has a relatively low transmittance with respect to the exposure light, and
the second phase adjusting film transmits the exposure light in a phase opposite to that of the light-transmitting portion and has a relatively high transmittance with respect to the exposure light.

30. The photomask according to claim 27, wherein the peripheral portion is in contact with the light-transmitting portion.

31. The photomask according to claim 27,
wherein a transmittance of the semi-light-shielding portion with respect to the exposure light is 6% or more and 15% or less.

32. A method for producing a photomask comprising:
a semi-light-shielding portion having a light-shielding property with respect to exposure light;
a light-transmitting portion surrounded by the semi-light-shielding portion and having a light-transmitting property with respect to exposure light; and
a peripheral portion surrounded by the semi-light-shielding portion and positioned in a periphery of the light-transmitting portion on a transparent substrate,
the method comprising:
a first step of forming a semi-light-shielding film that has a transmittance allowing the exposure light to be transmitted partially and transmits the exposure light in the same phase as that of the light-transmitting portion;
a second step of digging down the transparent substrate in a formation region for the peripheral portion so as to have a thickness that transmits the exposure light in a phase opposite to that of the light-transmitting portion, after removing the semi-light-shielding film in the peripheral portion formation region; and
a third step of removing the semi-light-shielding film in a formation region for the light-transmitting portion to expose a surface of the transparent substrate after the second step,
wherein the semi-light-shielding portion is composed of the semi-light-shielding film which is formed on the transparent substrate in a formation region for the semi-light-shielding portion.

33. The method for producing a photomask according to claim 32, wherein a transmittance of the semi-light-shielding portion with respect to the exposure light is 6% or more and 15% or less.

34. A method for producing a photomask comprising:
a semi-light-shielding portion having a light-shielding property with respect to exposure light;
a light-transmitting portion surrounded by the semi-light-shielding portion and having a light-transmitting property with respect to exposure light; and
a peripheral portion surrounded by the semi-light-shielding portion and positioned in a periphery of the light-transmitting portion on a transparent substrate,
the method comprising:
a first step of forming a first phase shift film that transmits the exposure light in a phase opposite to that of the light-transmitting portion on the transparent substrate;
a second step of forming a second phase shift film that transmits the exposure light in a phase opposite to that of the light-transmitting portion on the first phase shift film;
a third step of removing the second phase shift film in a formation region for the light-transmitting portion and a formation region for the peripheral portion; and
a fourth step of removing the first phase shift film in the light-transmitting portion formation region after the third step,
wherein a multilayered structure of the first phase shift film and the second phase shift film formed on the transparent substrate in the semi-light-shielding portion formation region has a transmittance that allows the exposure light to be transmitted partially and transmits the exposure light in a same phase as that of the light-transmitting portion,
the light-transmitting portion has a polygonal shape, and
the peripheral portion is composed of a plurality of rectangular regions, each region being positioned so as to face each side of the light-transmitting portion.

35. The method for producing a photomask according to claim 34,
wherein a transmittance of the semi-light-shielding portion with respect to the exposure light is 6% or more and 15% or less.

* * * * *